(12) United States Patent
Oh et al.

(10) Patent No.: US 10,211,949 B2
(45) Date of Patent: Feb. 19, 2019

(54) RECEIVER AND SIGNAL PROCESSING METHOD THEREOF

(71) Applicant: SAMSUNG ELECTRONICS CO., LTD., Suwon-si (KR)

(72) Inventors: Young-ho Oh, Suwon-si (KR); Se-ho Myung, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/156,907

(22) Filed: May 17, 2016

(65) Prior Publication Data

US 2016/0352462 A1    Dec. 1, 2016

(30) Foreign Application Priority Data

May 29, 2015  (KR) .................. 10-2015-0076544

(51) Int. Cl.
*H03M 13/09* (2006.01)
*H03M 13/11* (2006.01)
(Continued)

(52) U.S. Cl.
CPC ........ *H04L 1/0045* (2013.01); *H03M 13/253* (2013.01); *H03M 13/255* (2013.01);
(Continued)

(58) Field of Classification Search
CPC ........... H03M 13/255; H03M 13/2957; H03M 13/1105; H03M 13/116; H03M 13/25;
(Continued)

(56) References Cited

U.S. PATENT DOCUMENTS 6,732,315 B2 * 5/2004 Yagil ..................... H04L 1/0045
                                                        379/93.06
7,095,812 B2 * 8/2006 Chan ...................... H04L 1/005
                                                        375/262
(Continued)

FOREIGN PATENT DOCUMENTS

CN    104113393 A    10/2014
WO    2015/034245 A1    3/2015

OTHER PUBLICATIONS

International Search Report dated Sep. 2, 2016 issued by International Searching Authority in counterpart International Application No. PCT/KR2016/005638 (PCT/ISA/210).
(Continued)

*Primary Examiner* — James C Kerveros
(74) *Attorney, Agent, or Firm* — Sughrue Mion, PLLC

(57) ABSTRACT

Provided is a receiver which includes at least one processor configured to control or execute: a first Bit-Interleaved Coded Modulation (BICM) decoder configured to generate a first output signal corresponding to an upper layer signal by processing a first input signal which includes a superposition coding signal generated at a transmitter by superimposing the upper layer signal and a lower layer signal; a parity generator configured to generate at least one parity based on a result of the processing of the first input signal by the first BICM decoder; and a second BICM decoder configured to generate a second output signal corresponding to the lower layer signal by processing a second input signal which is generated using the parity generated by the parity generator.

18 Claims, 35 Drawing Sheets

(51) Int. Cl.
H03M 13/15 (2006.01)
H03M 13/25 (2006.01)
H03M 13/29 (2006.01)
H03M 13/37 (2006.01)
H04L 1/00 (2006.01)

(52) U.S. Cl.
CPC ... *H03M 13/2906* (2013.01); *H03M 13/3776* (2013.01); *H04L 1/0041* (2013.01); *H04L 1/0057* (2013.01); *H04L 1/0058* (2013.01); *H04L 1/0065* (2013.01); *H04L 1/0071* (2013.01); *H03M 13/09* (2013.01); *H03M 13/1165* (2013.01); *H03M 13/1185* (2013.01); *H03M 13/152* (2013.01)

(58) Field of Classification Search
CPC ..... H04L 1/0071; H04L 1/005; H04L 1/0058; H04L 1/0045
USPC .......................................................... 714/752
See application file for complete search history.

(56) References Cited

U.S. PATENT DOCUMENTS

| | | | | |
|---|---|---|---|---|
| 8,064,548 B2* | 11/2011 | Sundberg | .......... | H03M 13/3905 375/341 |
| 8,291,287 B2* | 10/2012 | Yano | .................. | H03M 13/255 714/752 |
| 8,775,892 B2* | 7/2014 | Zhang | .................. | H03M 13/29 714/755 |
| 8,924,823 B2* | 12/2014 | Zhang | .................... | G06F 11/10 329/304 |
| 9,032,260 B2* | 5/2015 | Petrov | ................ | H03M 13/1165 714/701 |
| 2010/0180176 A1 | 7/2010 | Yosoku et al. | | |
| 2012/0079341 A1 | 3/2012 | Wajcer et al. | | |

OTHER PUBLICATIONS

Written Opinion dated Sep. 2, 2016 issued by International Searching Authority in counterpart International Application No. PCT/KR2016/005638 (PCT/ISA/237).

Koike-Akino et al., "LDPC-Coded 16-Dimensional Modulation Based on the Nordstrom-Robinson Nonlinear Block Code", 2015, 2 pages total, Optical Society of America, USA, Japan.

Communication dated Feb. 22, 2018, from the European Patent Office in counterpart European Application No. 16803686.1.

Jon Montalban Sanchez et al. "Solutions for New Terrestrial Broadcasting Systems Offering Simultaneously Stationary and Mobile Services" Departamento de Ingenieria de Communicaciones, Dec. 12, 2014 (240 pages total) XP055317628.

Jae-young Lee et al. "Performance Evaluation of Lower Layer System in Cloud Transmission for Terrestrial DTV Broadcasting" Proc. 2014 IEEE International Symposium on Broadband Multimedia Systems and Broadcasting, Jun. 25, 2014, (pp. 1-3) XP032635916.

Liang Zhang et al. "Channel Capacity Distribution of Layer-Division-Multiplexing System for Next Generation Digital Broadcasting Transmission" Proc. 2014 IEEE International Symposium on Broadband Multimedia Systems and Broadcasting, Jun. 25, 2014, (pp. 1-6) XP032635829.

Sung Ik Park et al. "A Newly Designed Quarter-Rate QC-LDPC Code for the Cloud Transmission System" IEEE Transactions on Broadcasting, vol. 59, No. 1, Mar. 2013, (pp. 155-159) XP011520715.

Sung Ik Park et al. "Hardware Implementation and Complexity Analysis of Layered Division Multiplexing (LDM) System for ATSC 3.0" NAB Broadcast Engineering Conference Proceedings 2015: A Collection of Papers from the 69th NAB Broadcasting Engineering Conference, Apr. 1, 2015, (pp. 77-81) XP009503339.

Office Action dated Aug. 31, 2018 by the Canadian Patent Office in counterpart Canadian Patent Application No. 2984479.

* cited by examiner

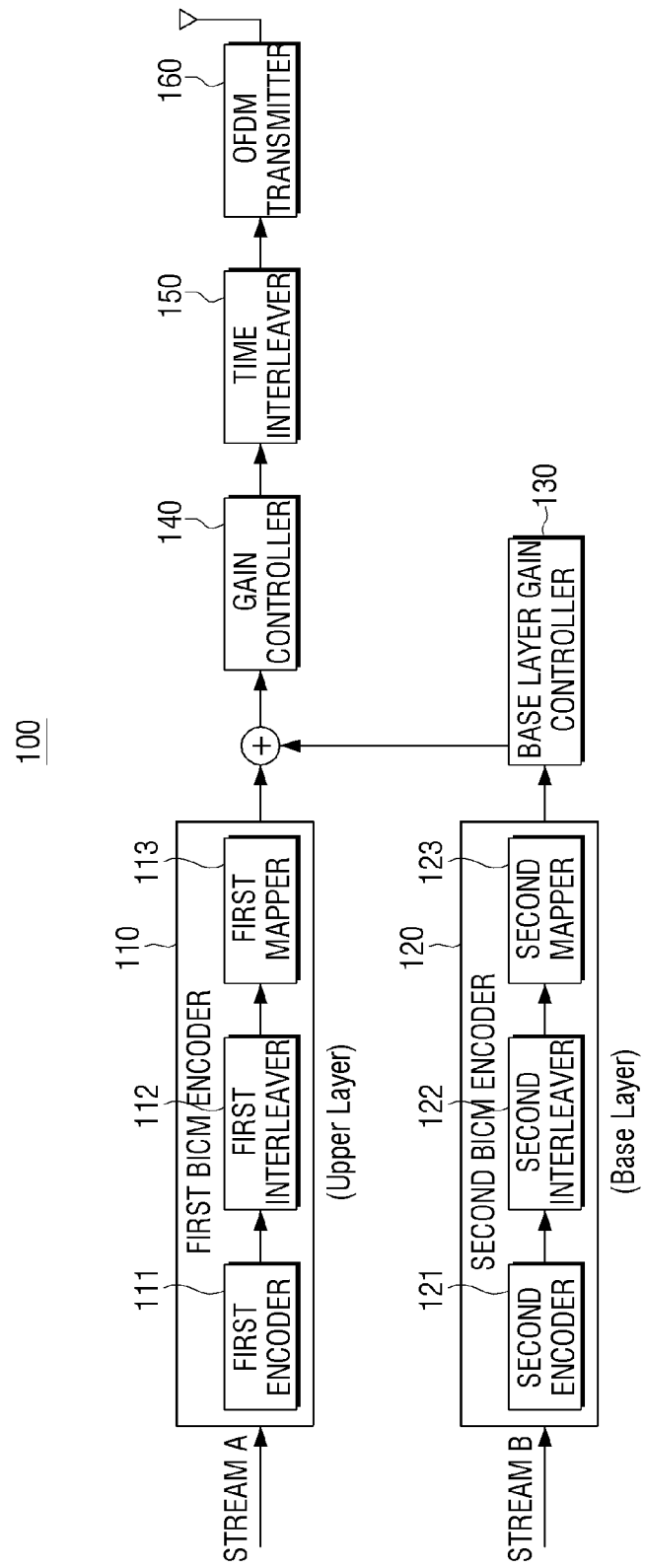

FIG. 9

LDPC CODEWORD
BIT C = ( $\hat{i}_0$ $\hat{i}_1$ $\hat{i}_2$ $\hat{i}_3$ $\hat{i}_4$ $\hat{i}_5$ $\hat{p}_0$ $\hat{p}_1$ $\hat{p}_2$ $\hat{p}_3$ $\hat{p}_4$ $\hat{p}_5$ )
(920)

PARITY CHECK MATRIX (910)

$$\begin{bmatrix} 1 & 0 & 0 & 1 & 0 & 0 & | & 1 & 0 & 0 & 0 & 0 & 0 \\ 0 & 0 & 1 & 0 & 0 & 1 & | & 1 & 1 & 0 & 0 & 0 & 0 \\ 1 & 0 & 0 & 0 & 1 & 0 & | & 0 & 1 & 1 & 0 & 0 & 0 \\ 0 & 1 & 1 & 0 & 0 & 0 & | & 0 & 0 & 1 & 1 & 0 & 0 \\ 0 & 0 & 0 & 1 & 1 & 0 & | & 0 & 0 & 0 & 1 & 1 & 0 \\ 0 & 1 & 0 & 0 & 0 & 1 & | & 0 & 0 & 0 & 0 & 1 & 1 \end{bmatrix}$$

INFORMATION WORD SUBMATRIX(911)   PARITY SUBMATRIX(912)

PARITY CHECK EQUATION(930)

$i_0 \oplus i_3 \oplus p_0 = 0$
$i_2 \oplus i_5 \oplus p_0 \oplus p_1 = 0$
$i_0 \oplus i_4 \oplus p_1 \oplus p_2 = 0$
$i_1 \oplus i_2 \oplus p_2 \oplus p_3 = 0$
$i_3 \oplus i_4 \oplus p_3 \oplus p_4 = 0$
$i_1 \oplus i_5 \oplus p_4 \oplus p_5 = 0$ $$\begin{bmatrix} i_0 \oplus i_3 \oplus p_0 \\ i_2 \oplus i_5 \oplus p_0 \oplus p_1 \\ i_0 \oplus i_4 \oplus p_1 \oplus p_2 \\ i_1 \oplus i_2 \oplus p_2 \oplus p_3 \\ i_3 \oplus i_4 \oplus p_3 \oplus p_4 \\ i_1 \oplus i_5 \oplus p_4 \oplus p_5 \end{bmatrix} = \begin{bmatrix} 0 \\ 0 \\ 0 \\ 0 \\ 0 \\ 0 \end{bmatrix} \Leftrightarrow \begin{bmatrix} i_0 \oplus i_3 \\ i_2 \oplus i_5 \\ i_0 \oplus i_4 \\ i_1 \oplus i_2 \\ i_3 \oplus i_4 \\ i_1 \oplus i_5 \end{bmatrix} \oplus \begin{bmatrix} p_0 \\ p_0 \oplus p_1 \\ p_1 \oplus p_2 \\ p_2 \oplus p_3 \\ p_3 \oplus p_4 \\ p_4 \oplus p_5 \end{bmatrix} = \begin{bmatrix} 0 \\ 0 \\ 0 \\ 0 \\ 0 \\ 0 \end{bmatrix}$$

PARITY CHECK EQUATION(930)   IPPC EXPRESSION(940)

FIG. 10

LDPC CODEWORD
BIT = ( $\hat{i}_0$ $\hat{i}_1$ $\hat{i}_2$ $\hat{i}_3$ $\hat{i}_4$ $\hat{i}_5$ $\hat{p}_0$ $\hat{p}_1$ $\hat{p}_2$ $\hat{p}_3$ $\hat{p}_4$ $\hat{p}_5$ )  
(1020)

PARITY CHECK EQUATION $$\text{PARITY CHECK MATRIX (1010)} \begin{bmatrix} 1 & 0 & 0 & 1 & 0 & 0 & 1 & 0 & 0 & 0 & 0 & 0 \\ 0 & 0 & 1 & 0 & 0 & 1 & 1 & 1 & 0 & 0 & 0 & 0 \\ 1 & 0 & 0 & 0 & 1 & 0 & 0 & 1 & 1 & 0 & 0 & 0 \\ 0 & 1 & 1 & 0 & 0 & 0 & 0 & 0 & 1 & 1 & 0 & 0 \\ 0 & 0 & 0 & 1 & 1 & 0 & 0 & 0 & 0 & 1 & 1 & 0 \\ 0 & 1 & 0 & 0 & 0 & 1 & 0 & 0 & 0 & 0 & 1 & 1 \end{bmatrix}$$

$i_0 \oplus i_3 \oplus p_0 = 0$ ~1031
$i_2 \oplus i_5 \oplus p_0 \oplus p_1 = 0$ ~1032
$i_0 \oplus i_4 \oplus p_1 \oplus p_2 = 0$ ~1033
$i_1 \oplus i_2 \oplus p_2 \oplus p_3 = 0$ ~1034
$i_3 \oplus i_4 \oplus p_3 \oplus p_4 = 0$ ~1035
$i_1 \oplus i_5 \oplus p_4 \oplus p_5 = 0$ ~1036

IPPC EXPRESSION

1041~ $i_0 \oplus i_3 = t_0$
1042~ $i_2 \oplus i_5 = t_1$
1043~ $i_0 \oplus i_4 = t_2$
1044~ $i_1 \oplus i_2 = t_3$
1045~ $i_3 \oplus i_4 = t_4$
1046~ $i_1 \oplus i_5 = t_5$ $\Rightarrow$

LDPC PARITY BIT $p_0 = t_0$ ~1051
$p_1 = t_1 \oplus p_0$ ~1052
$p_2 = t_2 \oplus p_1$ ~1053
$p_3 = t_3 \oplus p_2$ ~1054
$p_4 = t_4 \oplus p_3$ ~1055
$p_5 = t_5 \oplus p_4$ ~1056

FIG. 11

$\hat{i}_0 \ \hat{i}_1 \ \hat{i}_2 \ \hat{i}_3 \ \hat{i}_4 \ \hat{i}_5$ $\begin{bmatrix} 1 & 0 & 0 & 1 & 0 & 0 \\ 0 & 0 & 1 & 0 & 0 & 1 \\ 1 & 0 & 0 & 0 & 1 & 0 \\ 0 & 1 & 1 & 0 & 0 & 0 \\ 0 & 0 & 0 & 1 & 1 & 0 \\ 0 & 1 & 0 & 0 & 0 & 1 \end{bmatrix}$

INFORMATION WORD SUBMATRIX(1110)

IPPC EXPRESSION $i_0 \oplus i_3 = t_0$
$i_2 \oplus i_5 = t_1$
$i_0 \oplus i_4 = t_2$
$i_1 \oplus i_2 = t_3$
$i_3 \oplus i_4 = t_4$
$i_1 \oplus i_5 = t_5$

IPPC CORRECTION

⓪ —FLIP→ $1 = t_1'$
① —FLIP→ $0 = t_3'$

CORRECTED IPPC EXPRESSION $i_0 \oplus i_3 = t_0$
$i_2 \oplus i_5 = t_1'$
$i_0 \oplus i_4 = t_2$
$i_1 \oplus i_2 = t_3'$
$i_3 \oplus i_4 = t_4$
$i_1 \oplus i_5 = t_5$

⇒

LDPC PARTY BIT $p_0 = t_0$ ~1121
$p_1 = t_1' \oplus p_0$ ~1122
$p_2 = t_2 \oplus p_1$ ~1123
$p_3 = t_3' \oplus p_2$ ~1124
$p_4 = t_4 \oplus p_3$ ~1125
$p_5 = t_5 \oplus p_4$ ~1126

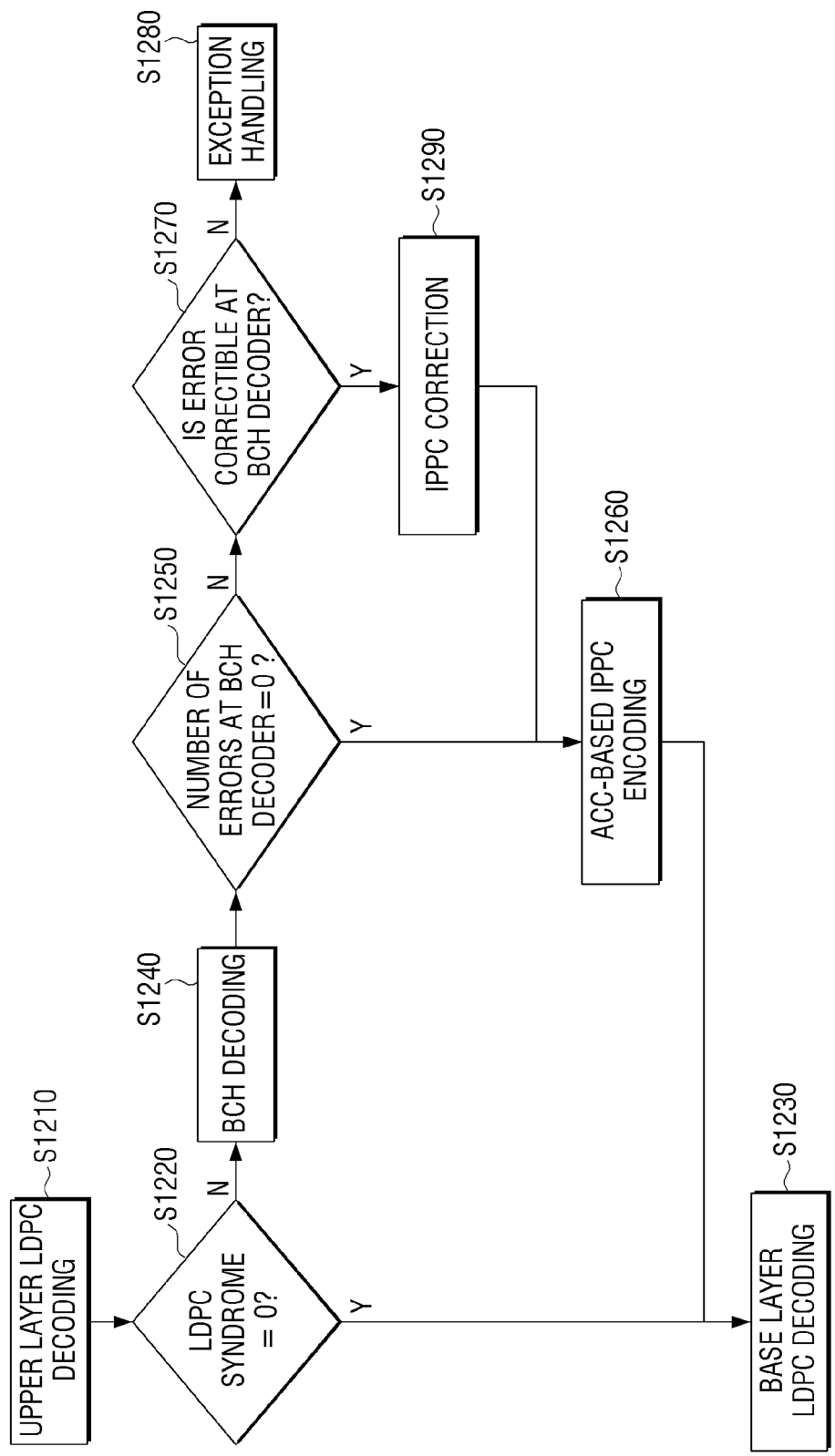

FIG. 15A $$\begin{aligned}
&i_2 \oplus i_5 \oplus p_0 = 0\\
&i_1 \oplus i_4 \oplus p_0 \oplus p_1 = 0\\
&i_0 \oplus i_2 \oplus p_1 \oplus p_2 = 0\\
&i_3 \oplus i_4 \oplus p_2 \oplus p_3 = 0\\
&i_0 \oplus i_5 \oplus p_3 \oplus p_4 = 0\\
&i_1 \oplus i_3 \oplus p_4 \oplus p_5 = 0\\
&i_2 \oplus i_5 \oplus p_0 \oplus p_3 \oplus p_0' = 0\\
&i_1 \oplus i_2 \oplus p_0 \oplus p_4 \oplus p_1' = 0\\
&i_1 \oplus i_5 \oplus p_1 \oplus p_4 \oplus p_2' = 0\\
&i_0 \oplus i_3 \oplus p_2 \oplus p_3 \oplus p_3' = 0\\
&i_0 \oplus i_4 \oplus p_2 \oplus p_3 \oplus p_4' = 0\\
&i_3 \oplus i_4 \oplus p_2 \oplus p_5 \oplus p_5' = 0\\
\end{aligned}$$

PARITY CHECK EQUATION (1530)

LDPC CODEWORD BIT $C = [\hat{i}_0\ \hat{i}_1\ \hat{i}_2\ \hat{i}_3\ \hat{i}_4\ \hat{i}_5\ \hat{p}_0\ \hat{p}_1\ \hat{p}_2\ \hat{p}_3\ \hat{p}_4\ \hat{p}_5\ \hat{p}_0'\ \hat{p}_1'\ \hat{p}_2'\ \hat{p}_3'\ \hat{p}_4'\ \hat{p}_5']$ (1520)

FIRST INFORMATION WORD SUBMATRIX (1511)
FIRST PARITY SUBMATRIX (1513)
SECOND INFORMATION WORD SUBMATRIX (1512)
SECOND PARITY SUBMATRIX (1514)

PARITY CHECK MATRIX H = (1510)

$$H = \begin{bmatrix}
\begin{array}{cccccc|cccccc|cccccc}
0 & 0 & 1 & 0 & 0 & 1 & 1 & 0 & 0 & 0 & 0 & 0 & 0 & \cdots & 0 & 0 & 0 & 0\\
0 & 1 & 0 & 0 & 1 & 0 & 1 & 1 & 0 & 0 & 0 & 0 & & & & & & \\
1 & 0 & 1 & 0 & 0 & 0 & 0 & 1 & 1 & 0 & 0 & 0 & & \ddots & & & & \\
0 & 0 & 0 & 1 & 1 & 0 & 0 & 0 & 1 & 1 & 0 & 0 & & & & & & \\
1 & 0 & 0 & 0 & 0 & 1 & 0 & 0 & 0 & 1 & 1 & 0 & & & & & & \\
0 & 1 & 0 & 1 & 0 & 0 & 0 & 0 & 0 & 0 & 1 & 1 & 0 & \cdots & 0 & 0 & 0 & 0\\
\hline
0 & 0 & 1 & 0 & 0 & 1 & 1 & 0 & 0 & 1 & 0 & 0 & 1 & 0 & 0 & 0 & 0 & 0\\
0 & 1 & 1 & 0 & 0 & 0 & 1 & 0 & 0 & 0 & 1 & 0 & 0 & 1 & 0 & 0 & 0 & 0\\
0 & 1 & 0 & 0 & 0 & 1 & 0 & 1 & 0 & 0 & 1 & 0 & 0 & 0 & 1 & 0 & 0 & 0\\
1 & 0 & 0 & 1 & 0 & 0 & 0 & 0 & 1 & 1 & 0 & 0 & 0 & 0 & 0 & 1 & 0 & 0\\
1 & 0 & 0 & 0 & 1 & 0 & 0 & 0 & 1 & 1 & 0 & 0 & 0 & 0 & 0 & 0 & 1 & 0\\
0 & 0 & 0 & 1 & 1 & 0 & 0 & 0 & 1 & 0 & 0 & 1 & 0 & 0 & 0 & 0 & 0 & 1\\
\end{array}
\end{bmatrix}$$

FIG. 15B $$\begin{bmatrix} i_2 \oplus i_5 \oplus p_0 \\ i_1 \oplus i_4 \oplus p_0 \oplus p_1 \\ i_0 \oplus i_2 \oplus p_1 \oplus p_2 \\ i_3 \oplus i_4 \oplus p_2 \oplus p_3 \\ i_0 \oplus i_5 \oplus p_3 \oplus p_4 \\ i_1 \oplus i_3 \oplus p_4 \oplus p_5 \\ i_2 \oplus i_5 \oplus p_0 \oplus p_3 \oplus p_0' \\ i_1 \oplus i_2 \oplus p_0 \oplus p_4 \oplus p_1' \\ i_1 \oplus i_5 \oplus p_3 \oplus p_4 \oplus p_2' \\ i_0 \oplus i_3 \oplus p_1 \oplus p_3 \oplus p_3' \\ i_0 \oplus i_4 \oplus p_2 \oplus p_3 \oplus p_4' \\ i_3 \oplus i_4 \oplus p_2 \oplus p_5 \oplus p_5' \end{bmatrix} = \begin{bmatrix} 0 \\ 0 \\ 0 \\ 0 \\ 0 \\ 0 \\ 0 \\ 0 \\ 0 \\ 0 \\ 0 \\ 0 \end{bmatrix}$$

PARITY CHECK EQUATION (1530)

FIRST IPPC EQUATION (1541)

$$<=> \begin{bmatrix} i_2 \oplus i_5 \\ i_1 \oplus i_4 \\ i_0 \oplus i_2 \\ i_3 \oplus i_4 \\ i_0 \oplus i_5 \\ i_1 \oplus i_3 \\ \hline i_2 \oplus i_5 \oplus p_0 \oplus p_3 \\ i_1 \oplus i_2 \oplus p_0 \oplus p_4 \\ i_1 \oplus i_5 \oplus p_3 \oplus p_4 \\ i_0 \oplus i_3 \oplus p_1 \oplus p_3 \\ i_0 \oplus i_4 \oplus p_2 \oplus p_3 \\ i_3 \oplus i_4 \oplus p_2 \oplus p_5 \end{bmatrix} \oplus \begin{bmatrix} p_0 \\ p_0 \oplus p_1 \\ p_1 \oplus p_2 \\ p_2 \oplus p_3 \\ p_3 \oplus p_4 \\ p_4 \oplus p_5 \\ p_0' \\ p_1' \\ p_2' \\ p_3' \\ p_4' \\ p_5' \end{bmatrix} = \begin{bmatrix} 0 \\ 0 \\ 0 \\ 0 \\ 0 \\ 0 \\ 0 \\ 0 \\ 0 \\ 0 \\ 0 \\ 0 \end{bmatrix}$$

SECOND IPPC EXPRESSION (1542)

FIG. 16

SECOND PARITY CHECK MATRIX (1610)

LDPC CODEWORD BIT C = [$\hat{i}_0$ $\hat{i}_1$ $\hat{i}_2$ $\hat{i}_3$ $\hat{i}_4$ $\hat{i}_5$ $\hat{p}_0$ $\hat{p}_1$ $\hat{p}_2$ $\hat{p}_3$ $\hat{p}_4$ $\hat{p}_5$] (1620)

SECOND INFORMATION WORD SUBMATRIX (1612):

| $\hat{i}_0$ | $\hat{i}_1$ | $\hat{i}_2$ | $\hat{i}_3$ | $\hat{i}_4$ | $\hat{i}_5$ |
|---|---|---|---|---|---|
| 0 | 0 | 1 | 0 | 0 | 1 |
| 0 | 1 | 1 | 0 | 0 | 0 |
| 0 | 1 | 0 | 0 | 0 | 1 |
| 1 | 0 | 0 | 1 | 0 | 0 |
| 1 | 0 | 0 | 0 | 1 | 0 |
| 0 | 0 | 0 | 1 | 1 | 0 |

SECOND PARITY SUBMATRIX (1614):

| $\hat{p}'_0$ | $\hat{p}'_1$ | $\hat{p}'_2$ | $\hat{p}'_3$ | $\hat{p}'_4$ | $\hat{p}'_5$ |
|---|---|---|---|---|---|
| 1 | 0 | 0 | 1 | 0 | 0 |
| 1 | 1 | 0 | 0 | 0 | 0 |
| 0 | 0 | 0 | 1 | 1 | 0 |
| 0 | 1 | 1 | 0 | 0 | 0 |
| 0 | 0 | 1 | 1 | 0 | 0 |
| 0 | 0 | 0 | 0 | 1 | 1 |

PARITY CHECK EQUATION

$i_2 \oplus i_5 \oplus p_0 \oplus p_3 \oplus p'_0 = 0$ ~1631
$i_1 \oplus i_2 \oplus p_0 \oplus p_4 \oplus p'_1 = 0$ ~1632
$i_1 \oplus i_5 \oplus p_3 \oplus p_4 \oplus p'_2 = 0$ ~1633
$i_0 \oplus i_3 \oplus p_1 \oplus p_3 \oplus p'_3 = 0$ ~1634
$i_0 \oplus i_4 \oplus p_2 \oplus p_3 \oplus p'_4 = 0$ ~1635
$i_3 \oplus i_4 \oplus p_2 \oplus p_5 \oplus p'_5 = 0$ ~1636

SECOND IPPC EXPRESSION

1641~ $i_2 + i_5 + p_0 + p_3 = s_0$
1642~ $i_1 + i_2 + p_0 + p_4 = s_1$
1643~ $i_1 + i_5 + p_3 + p_4 = s_2$
1644~ $i_0 + i_3 + p_1 + p_3 = s_3$
1645~ $i_0 + i_4 + p_2 + p_3 = s_4$
1646~ $i_3 + i_4 + p_2 + p_5 = s_5$ $\Rightarrow$

SECOND LDPC PARITY BIT

LDPC CODEWORD
BIT C = [$\hat{i}_0$ $\hat{i}_1$ $\hat{i}_2$ $\hat{i}_3$ $\hat{i}_4$ $\hat{i}_5$ $\hat{p}_0$ $\hat{p}_1$ $\hat{p}_2$ $\hat{p}_3$ $\hat{p}_4$ $\hat{p}_5$]
(1720)

FIRST DATAWORD SUBMATRIX (1711)

FIRST PARITY SUBMATRIX (1713)

FIRST PARITY CHECK MATRIX (1710):

$$\begin{bmatrix} 0 & 0 & 1 & 0 & 0 & 1 & 1 & 0 & 0 & 0 & 0 & 0 \\ 0 & 1 & 0 & 0 & 1 & 0 & 1 & 1 & 0 & 0 & 0 & 0 \\ 1 & 0 & 1 & 0 & 0 & 0 & 0 & 1 & 1 & 0 & 0 & 0 \\ 0 & 0 & 0 & 1 & 1 & 0 & 0 & 0 & 1 & 1 & 0 & 0 \\ 1 & 0 & 0 & 0 & 1 & 1 & 0 & 0 & 0 & 1 & 1 & 0 \\ 0 & 1 & 0 & 1 & 0 & 0 & 1 & 0 & 0 & 0 & 1 & 1 \end{bmatrix}$$

PARITY CHECK EQUATION $i_2 \oplus i_5 \oplus p_0 = 0$ ~1731
$i_1 \oplus i_4 \oplus p_0 \oplus p_1 = 0$ ~1732
$i_0 \oplus i_2 \oplus p_1 \oplus p_2 = 0$ ~1733
$i_3 \oplus i_4 \oplus p_2 \oplus p_3 = 0$ ~1734
$i_0 \oplus i_5 \oplus p_3 \oplus p_4 = 0$ ~1735
$i_1 \oplus i_3 \oplus p_4 \oplus p_5 = 0$ ~1736

FIRST IPPC EXPRESSION

1741 — $i_2 \oplus i_5 = t_0$
1742 — $i_1 \oplus i_4 = t_1$
1743 — $i_0 \oplus i_2 = t_2$
1744 — $i_3 \oplus i_4 = t_3$
1745 — $i_0 \oplus i_5 = t_4$
1746 — $i_1 \oplus i_3 = t_5$ $\Rightarrow$

FIRST LDPC PARITY BIT $p_0 = t_0$ ~1751
$p_1 = t_1 \oplus p_0$ ~1752
$p_2 = t_2 \oplus p_1$ ~1753
$p_3 = t_3 \oplus p_2$ ~1754
$p_4 = t_4 \oplus p_3$ ~1755
$p_5 = t_5 \oplus p_0$ ~1756

RECEIVER AND SIGNAL PROCESSING METHOD THEREOF

CROSS-REFERENCE TO THE RELATED APPLICATIONS

This application claims priority from Korean Patent Application No. 10-2015-0076544, filed on May 29, 2015 in the Korean Intellectual Property Office, the disclosure of which is incorporated herein by reference in its entirety.

BACKGROUND

1. Field

Apparatuses and methods consistent with exemplary embodiment of the inventive concept relate to a receiver and a signal processing method thereof, and more particularly, to a receiver configured to receive a signal generated by superposition coding and to process the same, and a signal processing method thereof.

2. Description of the Related Art

The information technology community in the 21st century is welcoming the era of digitalized, multi-channel, broadband, high quality services. Particularly, the recently increased distribution of high definition digital televisions (TVs), mobile devices, PMPs, and portable broadcast devices demands more supports for various reception methods for digital broadcast services.

For example, a receiver in the processing of superposition coding signal uses a signal of an upper layer with a relatively higher power, in order to receive a signal of a base layer with a relatively lower power.

Accordingly, as a time for processing the signal of the upper layer increases, a time for processing the signal of the base layer increases.

For example, as a signal of the upper layer is decoded for reception of a signal of the base layer, the processing time for the signal of the base layer increases when the decoding time for the signal of the upper layer increases.

SUMMARY

Exemplary embodiments of the present inventive concept may overcome the above disadvantages and other disadvantages not described above. However, the present inventive concept is not required to overcome the disadvantages described above, and an exemplary embodiment of the present inventive concept may not overcome any of the problems described above.

One technical objective of the inventive concept is to provide a receiver which generates a parity based on a result of decoding which is performed to generate a first signal, e.g., an upper layer signal, of a superposition coding signal, in which this parity is used for generating a signal to be decoded to generate a second signal, e.g., a lower layer signal, and a signal processing method thereof.

According to an exemplary embodiment, there is provided a receiver including at least one processor configured to control or execute: a first Bit-Interleaved Coded Modulation (BICM) decoder configured to generate a first output signal corresponding to an upper layer signal by processing a first input signal which includes a superposition coding signal generated at a transmitter by superimposing the upper layer signal and a lower layer signal; a parity generator configured to generate at least one parity based on a result of the processing of the first input signal by the first BICM decoder; and a second BICM decoder configured to generate a second output signal corresponding to the lower layer signal by processing a second input signal which is generated using the parity generated by the parity generator.

The first BICM decoder may include: a Low Density Parity Check (LDPC) decoder configured to LDPC decode the first input signal to recover an LDPC information word and an LDPC parity; and a Bose, Chaudhri, Hocquenghem (BCH) decoder configured to BCH decode the LDPC information word recovered by the LDPC decoding to generate the first output signal. Here, the parity generator may generate the parity based on a result of at least one of the LDPC decoding and the BCH decoding.

By processing the first input signal, the first BICM decoder may recover an LDPC parity corresponding to a parity submatrix of a dual diagonal matrix structure which is a part of a parity check matrix used for LDPC encoding to generate the first input signal at the transmitter.

The LDPC decoder or the parity generator may determine whether an error is present in at least one of the LDPC information word and the LDPC parity recovered by the LDPC decoding, and in response to determining that the error is present in at least one of the LDPC information word and the LDPC parity recovered by the LDPC decoding, the parity generator may further determine whether the error is present in the LDPC information word recovered by the LDPC decoding, based on a result of the BCH decoding.

In response to determining that the error is not present in the LDPC information word recovered by the LDPC decoding, the parity generator may generate the parity including a new LDPC parity corresponding to the LDPC information word recovered by the LDPC decoding, based on an information part parity check (IPPC) expression which is a part of a parity check equation related to a parity check matrix used for LDPC encoding at the transmitter to generate the first input signal.

In response to determining that the error is present in the LDPC information word recovered by the LDPC decoding, the parity generator may determine a location of an error-generated bit in the LDPC information word recovered by the LDPC decoding based on the result of the BCH decoding, correct the error by flipping a value of an IPPC expression corresponding to the error-generated bit, and generate the parity including a new LDPC parity corresponding to the error-corrected LDPC information word, based on the flipped IPPC expression value.

Meanwhile, the LDPC decoder may recover an LDPC information word, a first LDPC parity corresponding to a first parity submatrix having a dual diagonal matrix structure, and a second LDPC parity corresponding to a second parity submatrix having a unit matrix structure. Here, the first and second LDPC parity submatrices are respectively parts of first and second parity check matrices forming a parity check matrix used for LDPC encoding to generate the first input signal at the transmitter.

In response to determining that the error is not present in at least one of the LDPC information word and the first LDPC parity recovered by the LDPC decoding, the parity generator may generate the parity including a new second LDPC parity corresponding to the LDPC information word and the first LDPC parity recovered by the LDPC decoding, based on an IPPC expression which is a part of a parity check equation related to the second parity check matrix.

In response to determining that the error is not present in at least one of the LDPC information word and the first LDPC parity recovered by the LDPC decoding, the parity generator may further generate a new first LDPC parity corresponding to the LDPC information word recovered by the LDPC decoding, based on a first IPPC expression which is a part of a parity check equation related to the first parity check matrix. Here, the IPPC expression which is part of the parity check equation related to the second parity check matrix is a second IPPC expression.

Further, in response to determining that the error is present in at least one of the LDPC information word and the first LDPC parity recovered by the LDPC decoding, the parity generator may determine whether the error is present in the LDPC information word recovered by the LDPC decoding, based on a result of the BCH decoding.

In response to determining that the error is present in the LDPC information word recovered by the LDPC decoding, the parity generator may determine a location of an error-generated bit in the LDPC information word recovered by the LDPC decoding based on the result of the BCH decoding, correct the error by flipping a value of a first information part parity check (IPPC) expression corresponding to the error-generated bit, and generate the parity including a new first LDPC parity corresponding to the error-corrected LDPC information word based on the flipped first IPPC expression value. Here, the first IPPC expression is a part of a parity check equation related to the first parity check matrix.

Meanwhile, the LDPC decoder or the parity generator may compare the new first LDPC parity with the first LDPC parity recovered by the LDPC decoding, determine whether an error is present in the first LDPC parity recovered by the LDPC decoding as a result of the comparison, determine a location of the error-generated bit in the first LDPC parity recovered by the LDPC decoding, correct the error by flipping a value of a second IPPC expression corresponding to the error-generated bit in the first LDPC parity recovered by the LDPC decoding, and generate a new second LDPC parity corresponding to the error-corrected LDPC information word and first LDPC parity, based on the flipped second IPPC expression value.

The receiver may further include a BICM encoder configured to receive and process an LDPC codeword including an LDPC information word included in the first output signal and the parity generated at the parity generator, to generate a signal to be used for generating the second input signal.

The receiver may further include a signal remover configured to remove the signal generated by the BICM encoder from the first input signal to output the second input signal.

The first BICM decoder may include: an LDPC decoder configured to LDPC decode the first input signal to recover an LDPC information word and an LDPC parity; and a Cyclic Redundancy Check (CRC) decoder configured to CRC decode the LDPC information word recovered by the LDPC decoding to generate the first output signal, wherein the parity generator may generate the parity based on a result of at least one of the LDPC decoding and the CRC decoding.

The LDPC decoder or the parity generator may determine whether an error is present in at least one of the LDPC information word and the LDPC parity recovered by the LDPC decoding. In response to determining that the error is present in at least one of the LDPC information word and the LDPC parity recovered by the LDPC decoding, but not present in the LDPC information word recovered by the LDPC decoding, based on a result of the CRC decoding, the parity generator may generate the parity including a new LDPC parity for the LDPC information word recovered by the LDPC decoding, based on an information part parity check (IPPC) expression which is a part of a parity check equation related to a parity check matrix used for LDPC encoding at the transmitter to generate the first input signal.

The LDPC decoder may recover an LDPC information word, a first LDPC parity corresponding to a first parity submatrix having a dual diagonal matrix structure, and a second LDPC parity corresponding to a second parity submatrix having a unit matrix structure. Here, the first and second LDPC parity submatrices are respectively parts of first and second parity check matrices forming a parity check matrix used for LDPC encoding at the transmitter to generate the first input signal.

In response to determining that the error is present in at least one of the LDPC information word and the first LDPC parity recovered by the LDPC decoding, but not present in the LDPC information word, based on a result of the CRC decoding, the parity generator may generate the parity including a new first LDPC parity for the LDPC information word recovered by the LDPC decoding based on a first IPPC expression.

After generating the new first LDPC parity, the parity generator may generate a new second LDPC parity corresponding to the LDPC information word recovered by the LDPC decoding and the new first LDPC parity, based on a second IPPC equation which is a part of the parity check equation related to the second parity check matrix.

The receiver may further include: a BICM encoder configured to receive and process an LDPC codeword including an LDPC information word included in the first output signal and the parity generated at the parity generator to generate a signal to be used for generating the second input signal; and a signal remover configured to remove the signal generated by the BICM encoder from the first input signal to output the second input signal.

According to an exemplary embodiment, there is provided a method of signal processing performed by a receiver including at least one processor. The method may include: generating a first output signal corresponding to an upper layer signal by processing a first input signal which includes a superposition coding signal generated at a transmitter by superimposing the upper layer signal and a lower layer signal; generating at least one parity based on a result of the processing of the first input signal; generating a second input signal by using the parity; and generating a second output signal corresponding to the lower layer signal by processing the second input signal.

The generating the first output signal may include: LDPC decoding the first input signal to recover an LDPC information word and an LDPC parity; and BCH decoding the LDPC information word recovered by the LDPC decoding to generate the first output signal.

The generating the first output signal may include recovering an LDPC parity corresponding to a parity submatrix having a dual diagonal matrix structure which is a part of a parity check matrix used for LDPC encoding to generate the first input signal at the transmitter.

The generating the parity may include: determining whether an error is present in at least one of the LDPC information word and the LDPC parity recovered by the LDPC decoding; and in response to determining that the error is present in at least one of the LDPC information word and the LDPC parity recovered by the LDPC decoding, determining whether the error is present in the LDPC information word recovered by the LDPC decoding, based on a result of the BCH decoding.

In response to determining that the error is not present in the LDPC information word recovered by the LDPC decoding, generating the parity including a new LDPC parity corresponding to the LDPC information word recovered by the LDPC decoding, based on an information part parity check (IPPC) expression which is a part of a parity check equation related to a parity check matrix used for LDPC encoding at the transmitter to generate the first input signal.

Further, the generating the parity may include: in response to determining that the error is present in the LDPC information word recovered by the LDPC decoding, determining a location of an error-generated bit in the LDPC information word recovered by the LDPC decoding, based on the result of the BCH decoding; correcting the error by flipping a value of an information part parity check (IPPC) expression corresponding to the error-generated bit; and generating the parity including a new LDPC parity corresponding to the error-corrected LDPC information word, based on the flipped IPPC expression value.

The generating the parity may include: in response to determining that the error is not present in at least one of the LDPC information word and the first LDPC parity recovered by the LDPC decoding, generating the parity including a new second LDPC parity corresponding to the LDPC information word and the first LDPC parity recovered by the LDPC decoding, based on an IPPC expression which is a part of a parity check equation related to the second parity check matrix.

The generating the parity may further include, in response to determining that the error is not present in at least one of the LDPC information word and the first LDPC parity recovered by the LDPC decoding, generating a new first LDPC parity corresponding to the LDPC information word recovered by the LDPC decoding, based on a first IPPC expression which is a part of a parity check equation related to the first parity check matrix. Here, the IPPC expression which is part of the parity check equation related to the second parity check matrix is a second IPPC expression.

The generating the parity may further include, in response to determining that the error is present in at least one of the LDPC information word and the first LDPC parity recovered by the LDPC decoding, determining whether the error is present in the LDPC information word recovered by the LDPC decoding, based on the result of the BCH decoding.

The generating the parity may further include: in response to determining that the error is present in the LDPC information word recovered by the LDPC decoding, determining a location of an error-generated bit in the LDPC information recovered by the LDPC decoding based on the result of the BCH decoding; correcting the error by flipping a value of a first information part parity check (IPPC) expression corresponding to the error-generated bit; and generating the parity including a new first LDPC parity corresponding to the error-corrected LDPC information word based on the flipped first IPPC expression value, wherein the first IPPC expression is a part of a parity check equation related to the first parity check matrix.

The generating the parity may include: comparing the new first LDPC parity with the first LDPC parity recovered by the LDPC decoding; determining whether an error is present in the first LDPC parity recovered by the LDPC decoding as a result of the comparison; determining a location of an error-generated bit in the first LDPC parity recovered by the LDPC decoding; correcting the error by flipping a value of a second IPPC expression corresponding to the error-generated bit in the first LDPC parity recovered by the LDPC decoding; and generating a new second LDPC parity corresponding to the error-corrected LDPC information word and first LDPC parity, based on the flipped second IPPC expression value.

Meanwhile, the generating the second input signal may include: generating a Low Density Parity Check (LDPC) codeword including an LDPC information word included in the first output signal and the parity; and processing the LDPC codeword to generate the second input signal.

The processing the LDPC codeword may include removing the processed LDPC codeword from the first input signal.

The generating the first output signal may include: LDPC decoding the first input signal; and CRC decoding the LDPC-decoded signal to generate the first output signal, wherein the generating the parity is performed based on a result of at least one of the LDPC decoding and the CRC decoding.

The generating the first output signal may include: LDPC decoding the first input signal to recover an LDPC information word and an LDPC parity; and CRC decoding the LDPC information word recovered by the LDPC decoding to generate the first output signal, wherein the generating the parity includes: determining whether an error is present in at least one of the LDPC information word and the LDPC parity recovered by the LDPC decoding, and in response to determining that the error is present in at least one of the LDPC information word and the LDPC parity recovered by the LDPC decoding, but not present in the LDPC information word recovered by the LDPC decoding, based on a result of the CRC decoding, generating the parity including a new LDPC parity for the LDPC information word recovered by the LDPC decoding, based on an information part parity check (IPPC) expression which is a part of a parity check equation related to a parity check matrix used for LDPC encoding at the transmitter to generate the first input signal.

The generating the first output signal may include: LDPC decoding the first input signal to recover an LDPC information word, a first LDPC parity corresponding to a first parity submatrix having a dual diagonal matrix structure, and a second LDPC parity corresponding to a second parity submatrix having a unit matrix structure; and CRC decoding the LDPC information word recovered by the LDPC decoding to generate the first output signal, wherein the first and second LDPC parity submatrices are respectively parts of first and second parity check matrices forming a parity check matrix used for LDPC encoding at the transmitter to generate the first input signal.

The generating the parity may include: determining whether an error is present in at least one of the LDPC information word and the first LDPC parity recovered by the LDPC decoding; and in response to determining that the error is present in at least one of the LDPC information word and the first LDPC parity recovered by the LDPC decoding, but not present in the LDPC information word recovered by the LDPC decoding, based on a result of the CRC decoding, generating the parity including a new first LDPC parity for the LDPC information word recovered by the LDPC decoding based on a first IPPC expression which is a part of a parity check equation related to the first parity check matrix.

The generating the parity may further include, after the generating the new first LDPC parity, generating a new second LDPC parity corresponding to the LDPC information word recovered by the LDPC decoding and the new first LDPC parity, based on a second IPPC equation which is a part of the parity check equation related to the second parity check matrix.

The generating the second input signal may include: receiving and processing an LDPC codeword including an LDPC information word included in the first output signal and the parity; processing the LDPC codeword to generate a signal to be sued for generating the second input signal; and removing, from the first input signal, the signal generated by processing the LDPC codeword to output the second input signal.

According to an exemplary embodiment, there is provided a receiver including at least one processor configured to control or execute: a first decoder which decodes a superposition coding signal to generate an upper layer signal, the superposition coding signal being generated at a transmitter by superimposing the upper layer signal and a lower layer signal; a parity generator which generates at least one type of parity using at least one of a plurality of parity generating methods, based on the upper layer signal generated at the first decoder; and a second decoder which decodes a signal generated by using the parity generated at the parity generator, to generate the lower layer signal. The parity generator may selectively generate the at least one type of parity from among a plurality of types of parity corresponding to the upper layer signal, depending on at least one of: a location of an error in the superposition coding signal; and a coding method, among a plurality of coding methods, used for decoding to generate the superposition coding signal at the transmitter. Here, the first decoder may include an LDPC decoder to LDPC decode the superposition coding signal to recover an LDPC information word and an LDPC parity. The plurality of coding methods may include: a first coding method using a simple parity check matrix formed of an information word submatrix and a parity submatrix of a dual diagonal structure; and a second coding method using a complex parity check matrix formed of: a first parity check matrix formed of a first information word submatrix and a first parity submatrix of the dual diagonal structure; and a second parity check matrix formed of a second information word submatrix and a second parity submatrix of a unit matrix structure. Further, the plurality of parity generating methods may include: applying a parity check equation related to a parity check matrix used for LDPC encoding to generate the superposition coding signal at the transmitter; and applying a value of an IPPC expression which is stored at the receiver and which is a part of the parity check equation related to the parity check matrix, without using the parity check equation or the parity check matrix According to various exemplary embodiments, time for decoding the upper layer signal may be reduced, thereby allowing faster base layer signal recovery.

BRIEF DESCRIPTION OF THE DRAWINGS

The above and/or other aspects of the present inventive concept will be more apparent by describing certain exemplary embodiments of the present inventive concept with reference to the accompanying drawings, in which:

FIG. 1 is a block diagram of a transmitter according to an exemplary embodiment;

FIGS. 9 to 29 are views provided to explain a variety of methods for generating parities according to exemplary embodiments;

DETAILED DESCRIPTION OF THE EXEMPLARY EMBODIMENTS

Figure 2A:
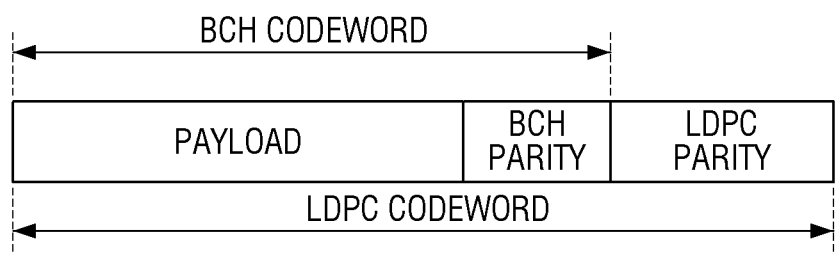
FIGS. 2A and 2B illustrate an LDPC codeword according to exemplary embodiments.

Certain exemplary embodiments of the inventive concept will now be described in greater detail with reference to the accompanying drawings.

In the following description, same drawing reference numerals are used for the same elements even in different drawings. The matters defined in the description, such as detailed construction and elements, are provided to assist in a comprehensive understanding of the exemplary embodiments. Accordingly, it is apparent that the exemplary embodiments can be carried out without those specifically defined matters. Also, well-known functions or constructions are not described in detail since they would obscure the exemplary embodiments with unnecessary detail.

According to an exemplary embodiment, a receiver may receive a signal, which is a superposition coding signals, generated by superposition coding at a transmitter, and generate (i.e., restores) a signal before the superposition coding, respectively.

The term "superposition coding" as used here refers to a coding method which superimposes or overlaps signals having same or different data to different powers. In one example, a signal with a relatively higher power may constitute an upper layer, while a signal with a relatively lower power may constitute a base layer.

A transmitter for generating and transmitting a superposition coding signal may be represented as FIG. 1.

Referring to FIG. 1, a transmitter 100 may include a first Bit-Interleaved Coded Modulation (BICM) encoder 110 having a first encoder 111, a first interleaver 112 and a first mapper 113 (or constellation mapper) to encode and interleave a stream A, and then, map the encoded and interleaved stream A to constellation points. The transmitter 100 may also include a second BICM encoder 120 having a second encoder 121, a second interleaver 122 and a second mapper 123 to encode and interleave a stream B, and then, map the encoded and interleaved stream B to constellation points.

In the example described above, the first and second encoders 111, 121, each, may include a Bose, Chaudhri, Hocquenghem (BCH) encoder (not illustrated), a Cyclic Redundancy Check (CRC) encoder (not illustrated) and a Low Density Parity Check (LDPC) encoder (not illustrated) to perform BCH encoding, CRC encoding and LDPC encoding, respectively. Selectively, the first and second encoders 111, 121 each may include only one of the BCH encoder and the CRC encoder, in addition to the LDPC encoder.

Meanwhile, considering that a BCH code, a CRC code and an LDPC code are a systematic code, an information word (also referred to as "information word bits" or "information bits" herein) may be included in a corresponding codeword.

That is, the BCH encoder may perform BCH encoding on input bits (i.e., the bits (or, payload) that are intended to be transmitted by the transmitter 100 in a form of the streams A and B in the example illustrated in FIG. 1) as a BCH information word to generate a BCH parity (or parity bits) and output a BCH codeword including the BCH information word and the BCH parity to the LDPC encoder (not illustrated).

Alternatively, the CRC encoder may perform CRC encoding on input bits as a CRC information word to generate a CRC parity (or parities), and output a CRC codeword including the CRC information word and the CRC parity to the LDPC encoder (not illustrated).

The LDPC encoder may perform LDPC encoding on the BCH codeword or the CRC codeword as an LDPC information word to generate an LDPC parity, and output an LDPC codeword including the LDPC information word and the LDPC parity to the first or second interleaver 112, 122.

The LDPC codeword generated by the coding as described above may be represented as illustrated in FIGS. 2A and 2B.

Figure 2B:
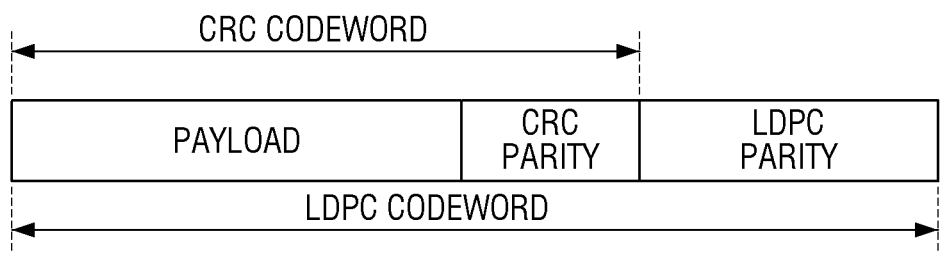

For example, the LDPC codeword may be in such a form of input bits added by the BCH parity and the LDPC parity, as illustrated in FIG. 2A, or in such a form of input bits added by the CRC parity and the LDPC parity.

Meanwhile, through a base layer gain controller 130, the transmitter 100 may adjust a gain (i.e., power) of a signal output from the second BICM encoder 120, and then, superimpose the superimposed signal on a signal output from the first BICM encoder 110 to generate a superimposition coding signal.

Also, through a gain controller 140, the transmitter 100 may adjust a gain of the superimposition coding signal, and then, interleave the constellation points (i.e., cells), on which the superposition coding signal is mapped, at a time interleaver 150, map the interleaved cells at an OFDM transmitter 160, and transmit the result to a receiver 1000 (not shown).

Figure 3:
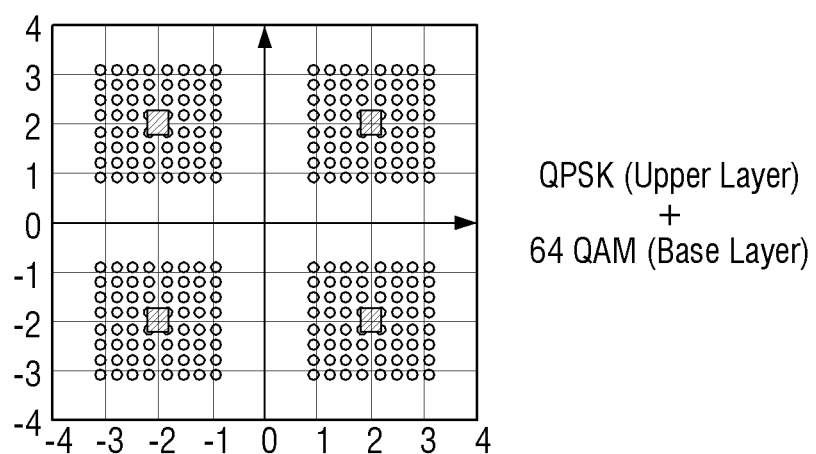
FIG. 3 illustrates constellation of a superposition coding signal according to an exemplary embodiment.

Meanwhile, a constellation of the superimposition coding signal may be represented as illustrated in FIG. 3, according to an exemplary embodiment.

FIG. 3 illustrates an example in which a signal corresponding to the upper layer is modulated by quadrature phase shift keying (QPSK), and a signal corresponding to the base layer is modulated by 64 quadrature amplitude modulation (64-QAM).

Referring to FIG. 3, the constellation points of the signal corresponding to the base layer with a relatively lower power is superimposed on the constellation points of the signal corresponding to the upper layer with a relatively higher power.

Figure 4:
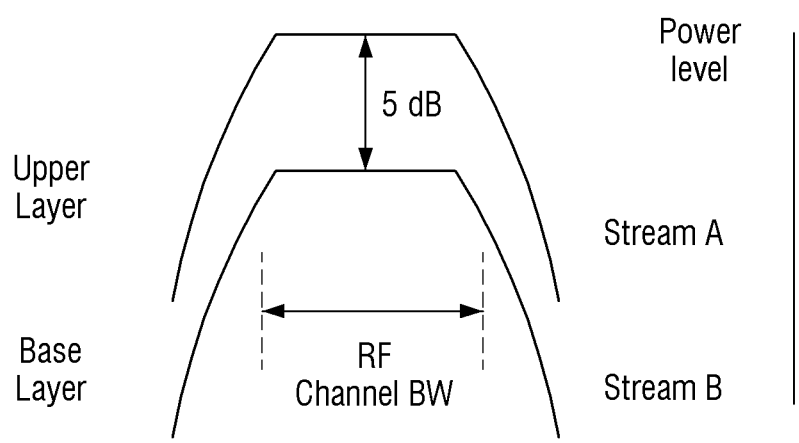
FIG. 4 illustrates an example of a power of a superposition coding signal according to an exemplary embodiment.

Meanwhile, in terms of the power, the superimposition coding signal may be represented as illustrated in FIG. 4.

Referring to FIG. 4, it is noted that the signal corresponding to the upper layer has a higher power than the signal corresponding to the base layer by about 5 dB, in the RF channel band.

Meanwhile, the encoders 111, 121 of the transmitter 100 perform LDPC encoding which is a process of generating an LDPC parity that satisfy $H \cdot C^T = 0$ for the LDPC information word. Here, H denotes a parity check matrix, and the LDPC codeword is $C=(c_0, c_1, \ldots, c_{N_{ldpc}-2}, c_{N_{ldpc}-1})$, where, $N_{ldpc}$ denotes a length of the LDPC codeword. Accordingly, this process is to generate an LDPC parity in which a sum of a product of respective columns of the parity check matrix multiplied by LDPC codeword bits of the LDPC codeword ($c_i$ (i=0, 1, \ldots, $N_{ldpc}$-1)) gives a '0' vector. The "sum" as used herebelow refers to a binary operation. According to the binary operation, $1 \oplus 1$ is 0, $1 \oplus 0$ is 1, $0 \oplus 1$ is 1, and $0 \oplus 0$ is 0.

For the process described above, the transmitter 100 may previously store therein information about various forms of a parity check matrix, using a memory (not illustrated).

Herebelow, a structure of a parity check matrix according to various exemplary embodiments will be explained with reference to the accompanying drawings. In the parity check matrix described below, elements other than 1 are 0.

Figure 5:
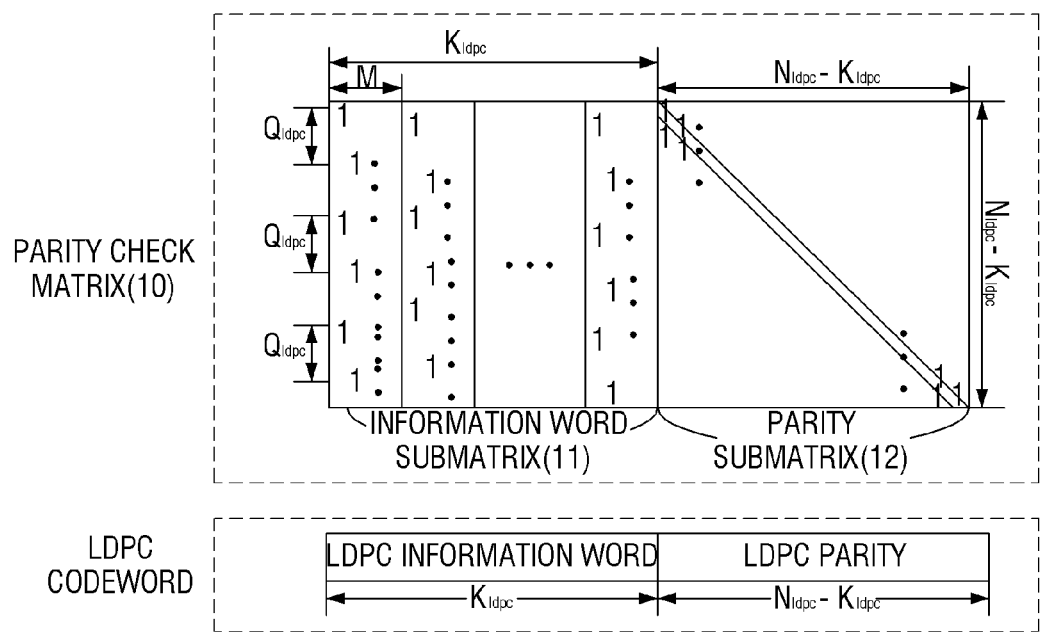
FIGS. 5 and 6 are views provided to explain a parity check matrix according to exemplary embodiments.

For example, a parity check matrix according to an exemplary embodiment may have a structure as illustrated in FIG. 5.

Referring to FIG. 5, a parity check matrix 10 may include an information word submatrix 11 which is a submatrix corresponding to an LDPC information word, and a parity submatrix 12 which is a submatrix corresponding to an LDPC parity.

The number of columns of the parity check matrix 10 is equal to a length $N_{ldpc}$ of the LDPC codeword, the number of columns of the information word submatrix 11 is equal to a length $K_{ldpc}$ of the LDPC information word, and the number of columns of the parity submatrix 12 is equal to a length ($N_{parity}=N_{ldpc}-K_{ldpc}$) of the LDPC parity. Meanwhile, the number of rows of the parity check matrix 10 is equal to the number of columns of the parity submatrix 12.

Meanwhile, the information word submatrix 11 is a matrix including $K_{ldpc}$ columns (i.e., $K_{ldpc}$ number of columns from a $0^{th}$ column to a $(K_{ldpc}-1)^{th}$ column) and complies with the following rule.

First, the $K_{ldpc}$ columns of the information word submatrix 11 are divided into a group of M columns, i.e., into total $K_{ldpc}/M$ column groups. The columns of the same group are in such a relationship that each of the columns is cyclically shifted from an immediately previous column or an immediately next column by $Q_{ldpc}$.

As used herein, M denotes an interval at which the column pattern repeats in the information word submatrix 11, and $Q_{ldpc}$ is the size or the number of rows by which the each column is cyclically shifted in the information word submatrix 11. M is the common divisor of $N_{ldpc}$ and $K_{ldpc}$, and is decided so as to satisfy $Q_{ldpc}=(N_{ldpc}-K_{ldpc})/M$. As used herein, M and $Q_{ldpc}$ are integers, and so is $K_{ldpc}/M$. Meanwhile, M and $Q_{ldpc}$ may have various values depending on the length of an LDPC codeword and a coding rate.

Second, when a degree of a $0^{th}$ column of an (i=0, 1, \ldots, $K_{ldpc}/M$-1) column group (here, the "degree" is the number of 1s present in a column, and all columns in a same column group have a same degree) is $D_i$, and locations (or indices) of rows having 1 in the $0^{th}$ column of the $i^{th}$ column group are $R_{i,0}^{(0)}, R_{i,0}^{(1)}, \ldots, R_{i,0}^{(D_i-1)}$, an index $R_{i,j}^{(k)}$ of a row having a $k^{th}$ 1 in a $j^{th}$ column of the $i^{th}$ column group is determined as following Equation 1.

$$R_{i,j}^{(k)} = R_{i(j-1)}^{(k)} + Q_{ldpc} \bmod(N_{ldpc}-K_{ldpc}) \quad (1),$$

where k=0, 1, 2, \ldots, $D_i$-1, i=0, 1, \ldots, $K_{ldpc}/M$-1, j=1, 2, \ldots, M-1.

Above Equation 1 may equally be expressed as Equation 2 below.

$$R_{i,j}^{(k)} = \{R_{i,0}^{(k)} + (j \bmod M) \times Q_{ldpc}\} \bmod(N_{ldpc}-K_{ldpc}) \quad (2),$$

where k=0, 1, 2, \ldots, $D_i$-1, i=0, 1, \ldots, $K_{ldpc}/M$-1, j=1, 2, \ldots, M-1. Since j=1, 2, \ldots, M-1, in Equation 2, (j mod M) may be regarded as j.

In the above equations, $R_{i,j}^{(k)}$ represents an index of a row at which the $k^{th}$ 1 is located in the $j^{th}$ column of the $i^{th}$ column group, $N_{ldpc}$ is a length of the LDPC codeword, $K_{ldpc}$ is a length of the information word (i.e., information bits), $D_i$ is the degree of the columns of the $i^{th}$ column group, M is the number of columns of one column group, and $Q_{ldpc}$ is the size or the number of rows by which each column is cyclically shifted.

Accordingly, referring to the above equations, when a value of $R_{i,0}^{(k)}$ is given, it is possible to determine the index $R_{i,j}^{(k)}$ of a row at which the $k^{th}$ 1 is present in the $j^{th}$ column of the $i^{th}$ column group. Therefore, by storing the index value of the row at which the $k^{th}$ 1 is present in the $0^{th}$ column of the respective column groups, it is possible to determine locations of columns and rows at which 1 is present in the parity check matrix 10 with the structure as illustrated in FIG. 5 (i.e., in the information word submatrix 11 of the parity check matrix 10).

For example, when the length $N_{ldpc}$ of the LDPC codeword is 16200, the coding rate is 9/15, and M is 360, the indices of the rows at which 1 is located in the $0^{th}$ column of the $i^{th}$ column group of the information word submatrix 11 are as follows.

TABLE 1

| i | Indices of rows at which 1s are present, in 0th column of i-th column group |
|---|---|
| 0 | 71 1478 1901 2240 2649 2725 3592 3708 3965 4080 5733 6198 |
| 1 | 393 1384 1435 1878 2773 3182 3586 5465 6091 6110 6114 6327 |
| 2 | 160 1149 1281 1526 1566 2129 2929 3095 3223 4250 4276 4612 |
| 3 | 289 1446 1602 2421 3559 3796 5590 5750 5763 6168 6271 6340 |
| 4 | 947 1227 2008 2020 2266 3365 3588 3867 4172 4250 4865 6290 |
| 5 | 3324 3704 4447 |
| 6 | 1206 2565 3089 |
| 7 | 529 4027 5891 |
| 8 | 141 1187 3206 |
| 9 | 1990 2972 5120 |
| 10 | 752 796 5976 |
| 11 | 1129 2377 4030 |
| 12 | 6077 6108 6231 |
| 13 | 61 1053 1781 |
| 14 | 2820 4109 5307 |
| 15 | 2088 5834 5988 |
| 16 | 3725 3945 4010 |
| 17 | 1081 2780 3389 |
| 18 | 659 2221 4822 |
| 19 | 3033 6060 6160 |
| 20 | 756 1489 2350 |
| 21 | 3350 3624 5470 |
| 22 | 357 1825 5242 |
| 23 | 585 3372 6062 |
| 24 | 561 1417 2348 |
| 25 | 971 3719 5567 |
| 26 | 1005 1675 2062 |

When the locations of the row at which 1 is present in the $0^{th}$ column of the $i^{th}$ column group are defined as described above, it is possible to determine the locations of the rows at which 1 is present in the other columns of the respective column groups by cyclically shifting by $Q_{ldpc}$.

For example, referring to Table 1, in the $0^{th}$ columns of the $0^{th}$ column group of the information word submatrix 11, 1 is present in rows 71, 1478, 1901, and so on.

According to such example, $Q_{ldpc}=(N_{ldpc}-K_{ldpc})/M=(16200-9720)/360=18$, so the indices of the rows at which 1 is present in the 1st column of the $0^{th}$ column group will be 89 (=71+18), 1496 (=1478+18), 1919 (=1901+18), ..., and the indices of the rows at which 1 is present in the 2nd column of the $0^{th}$ column group may be 107 (=89+18), 1514 (=1496+18), 1937 (=1919+18), and so on.

The indices of the rows at which 1 is present in all the rows of the respective column groups may be defined in the manner described above.

Meanwhile, the parity submatrix 12 is a submatrix including $N_{ldpc}-K_{ldpc}$ columns (i.e., from a $K_{ldpc}^{th}$ column to an $(N_{ldpc}-1)^{th}$ column), and has a dual diagonal or staircase structure. Accordingly, the degree of the rest of the columns except the last column (i.e., $N_{ldpc}-1$st column) of the columns included in the parity submatrix 12 is 2. The degree of the last column is 1.

Accordingly, the LDPC encoder (not illustrated) of the transmitter 100 may generate an LDPC codeword by performing LDPC encoding based on the parity check matrix as illustrated in FIG. 5.

According to such example, in the LDPC codeword $C=(c_0, c_1, \ldots, c_{N_{ldpc}-2}, c_{N_{ldpc}-1})=(i_0, i_1, \ldots, i_{K_{ldpc}-2}, i_{K_{ldpc}-2}, p_0, p_1, \ldots, p_{N_{ldpc}-K_{ldpc}-2}, p_{N_{ldpc}-K_{ldpc}-1})$, the LDPC information word $(i_0, i_1, \ldots, i_{K_{ldpc}-2}, i_{K_{ldpc}-1})$ corresponds to the information word submatrix 11 and the LDPC parity $(p_0, p_1, \ldots, p_{N_{ldpc}-K_{ldpc}-2}, p_{N_{ldpc}-K_{ldpc}-1})$ corresponds to the parity check matrix 12.

Here, $N_{ldpc}$ denotes the length of the LDPC codeword, $K_{ldpc}$ is the length of the LDPC information word, and $N_{ldpc}-K_{ldpc}$ is the length of the LDPC parity.

Figure 6:
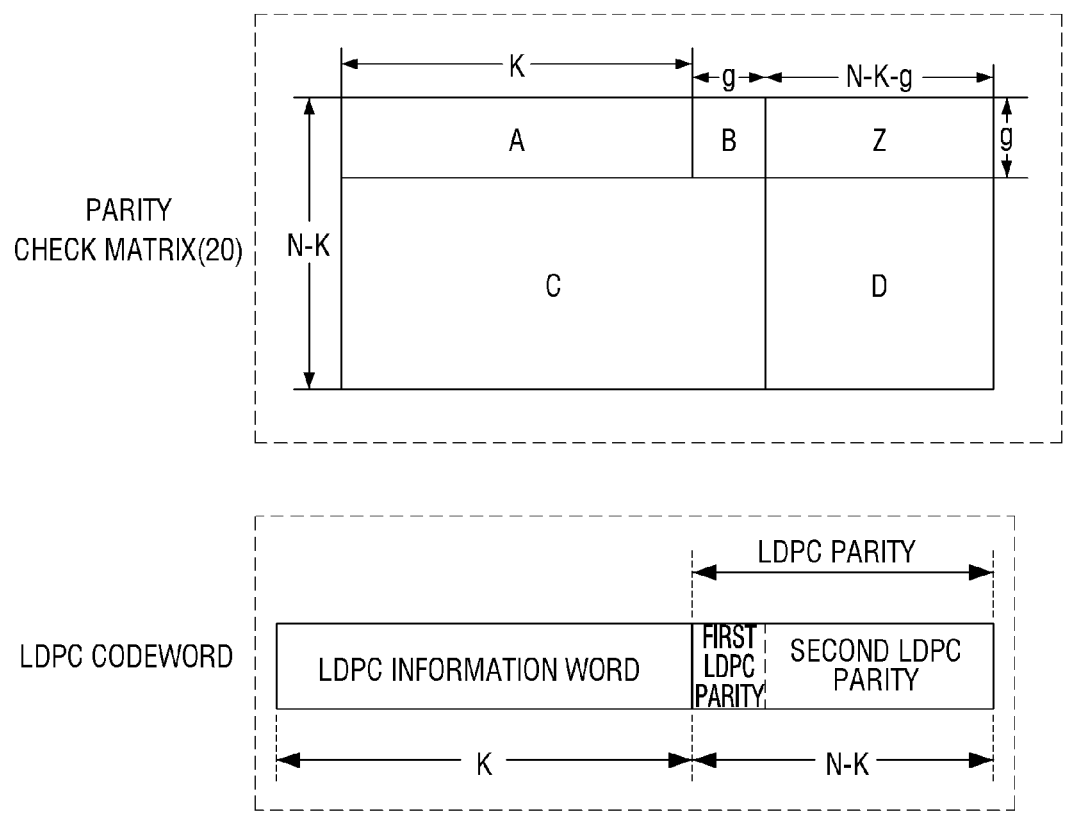

In another example, the parity check matrix according to an exemplary embodiment may have a structure as illustrated n FIG. 6.

Referring to FIG. 6, a parity check matrix 20 may include five matrices A, B, C, Z, and D. Herebelow, the structures of the respective matrices will be described to explain the structure of the parity check matrix 20.

First, parameters associated with the parity check matrix 20 as illustrated in FIG. 6, i.e., $M_1$, $M_2$, $Q_1$, and $Q_2$, may be defined according to a length of an LDPC codeword and a coding rate in various manner. As one example, when the length N of the LDPC codeword is 16200, and the coding rate is 4/15, it may be defined as $M_1=1080$, $M_2=10800$, $Q_1=3$, and $Q_2=30$.

The matrices A and C are submatrices including matrix elements corresponding to an LDPC information word of the LDPC codeword. The matrix A can be a first information word submatrix and the matrix C can be a second information word submatrix.

Specifically, the matrix A includes K columns and g rows, and the matrix C includes K+g columns and N−K−g rows, where, K is a length of the LDPC information word (bits), and N is a length of the LDPC codeword. Further, g is a length of a first LDPC parity, and N−K−g is a length of a second LDPC parity.

Meanwhile, indices of rows at which 1 is present in a 0 column of an $i^{th}$ column group of the matrices A and C may be defined based on Table 2 below, for example. In this example, the number of columns belonging to a same group, i.e., an interval at which a column repeats in the respective matrices A and C, may be 360.

For example, when the length N of the LDPC codeword is 16200, and the coding rate is 4/15, the indices of the rows at which 1 is located in the $0^{th}$ column of the $i^{th}$ column group of the matrices A and C may be as follows.

TABLE 2

| i | Indices of rows at which 1s are present, in 0th column of i-th column group |
|---|---|
| 0 | 19 585 710 3241 3276 3648 6345 9224 9890 10841 |
| 1 | 181 494 894 2562 3201 4382 5130 5308 6493 10135 |
| 2 | 150 569 919 1427 2347 4475 7857 8904 9903 |
| 3 | 1005 1018 1025 2933 3280 3946 4049 4166 5209 |
| 4 | 420 554 778 6908 7959 8344 8462 10912 11099 |
| 5 | 231 506 859 4478 4957 7664 7731 7908 8980 |

TABLE 2-continued

| i | Indices of rows at which 1s are present, in 0th column of i-th column group |
|---|---|
| 6 | 179 537 979 3717 5092 6315 6883 9353 9935 |
| 7 | 147 205 830 3609 3720 4667 7441 10196 11809 |
| 8 | 60 1021 1061 1554 4918 5690 6184 7986 11296 |
| 9 | 145 719 768 2290 2919 7272 8561 9145 10233 |
| 10 | 388 590 852 1579 1698 1974 9747 10192 10255 |
| 11 | 231 343 485 1546 3155 4829 7710 10394 11336 |
| 12 | 4381 5398 5987 9123 10365 11018 11153 |
| 13 | 2381 5196 6613 6844 7357 8732 11082 |
| 14 | 1730 4599 5693 6318 7626 9231 10663 |

Meanwhile, although it is exemplified above that the length of the LDPC codeword is 16200 and the coding rate is 4/15, this is only one of various examples. Accordingly, the indices of the rows at which 1 is located in the $0^{th}$ column of the $i^{th}$ column group of the matrices A and C may be defined in various manners when the length of the LDPC codeword is 64800 or when the coding rate is different.

Herebelow, the locations at which 1 is present in the matrices A and C will be described below with reference to Table 2 as an example.

In Table 2, the length N of the LDPC codeword is 16200 and the coding rate is 4/15, in which case the parity check matrix 20 may have $M_1=1080$, $M_2=10800$, $Q_1=3$, and $Q_2=30$.

Here, $Q_1$ is a size of cyclic shift of columns belonging to a same column group of the matrix A, and $Q_2$ is a size of cyclic shift of columns belonging to a same column group of the matrix C.

Additionally, $Q_1=M_1/L$, $Q_2=M_2/L$, $M_1=g$, and $M_2=N-K-g$, and L is an example of the interval (e.g., 360) at which the column pattern repeats in each of the matrices A and C.

Meanwhile, in each of the matrices A and C, the indices of the rows at which 1 is located may be determined based on $M_1$.

For example, based on a fact that $M_1=1080$, locations of rows at which 1 is present in the $0^{th}$ column of the $i^{th}$ column group of the matrix A may be determined based on values below 1080 of the indices of Table 2, and locations of rows at which 1 is present in the $0^{th}$ columns of the $i^{th}$ column group of the matrix C may be determined based on values equal to or larger than 1080 of the indices of Table 2.

Specifically, a sequence "19, 585, 710, 3241, 3276, 3648, 6345, 9224, 9890, 10841" corresponds to the $0^{th}$ column group in Table 2. Accordingly, in the $0^{th}$ column of the $0^{th}$ column group of the matrix A, 1 may be located at a $19^{th}$ row, a $585^{th}$ row, a $710^{th}$ row, respectively, and in the 0th column of the 0th column group of the matrix C, 1 may be located at a $3241^{st}$ row, a $3276^{th}$ row, a $3648^{th}$ row, a $6345^{th}$ row, a $9224^{th}$ row, a $9890^{th}$ row, and a $10841^{st}$ row, respectively, which are counted from a $0^{th}$ row of the matrix A.

Meanwhile, in the example of the matrix A, when the locations of 1 is defined in the $0^{th}$ column of each column group, the locations of the rows at which 1 is present in the other columns of each column group may be determined by $Q_1$ cyclic shift. In the example of the matrix C, when the locations of 1 is defined in the $0^{th}$ column of each column group, the locations of the rows at which 1 is present in the other columns of each column group may be determined by $Q_2$ cyclic shift.

In the example described above, in the $0^{th}$ column of the $0^{th}$ column group of the matrix A, 1 is present at the $19^{th}$ row, the $585^{th}$ row, and the $710^{th}$ row. According to such example, $Q_1=3$, so the indices of the rows at which 1 is located in a $1^{st}$ column of the $0^{th}$ column group may be 22 (=19+3), 588 (=585+3), and 713 (=710+3), and the indices of the rows at which 1 is located in a $2^{nd}$ column of the $0^{th}$ column group may be 25 (=22+3), 591 (=588+3), and 716 (=713+3).

Meanwhile, in the $0^{th}$ column of the $0^{th}$ column group of the matrix C, 1 is present at the $3241^{st}$ row, the $3276^{th}$ row, the $3648^{th}$ row, the $6345^{th}$ row, the $9224^{th}$ row, the $9890^{th}$ row, and the $10841^{st}$ row. According to this example, $Q_2=30$, so the indices of the rows at which 1 is located in the $1^{st}$ column of the $0^{th}$ column group may be 3271 (=3241+30), 3306 (=3276+30), 3678 (=3648+30), 6375 (=6345+30), 9254 (=9224+30), 9920 (=9890+30), and 10871 (=10841+30), the indices of the rows at which 1 is present in the $2^{nd}$ column of the 0th column group may be 3301 (=3271+30), 3336 (=3306+30), 3708 (=3678+30), 6405 (=6375+30), 9284 (=9254+30), 9950 (=9920+30), and 10901 (=10871+30).

In the manner described above, the locations of the rows at which 1 is present in all column groups of the matrix A and the matrix C may be defined.

Meanwhile, the matrices B and D are submatrices each corresponding to the first and the second LDPC parities. The matrix B can be considered a first parity submatrix and the matrix D may be considered a second parity submatrix.

Specifically, the matrix B, which is a dual diagonal or staircase structure, includes g columns and g rows, and the matrix D, which is a unit matrix (that is, the matrix D becomes an identity matrix), includes N–k–g columns and N–k–g rows.

Further, the matrix Z, which is a zero matrix, includes N–K–g columns and g rows.

Accordingly, the structure of the parity check matrix 20 as illustrated in FIG. 6 may be defined based on matrices A, B, C, D, and Z.

Accordingly, the LDPC encoder (not illustrated) of the transmitter 100 may generate an LDPC codeword by performing LDPC encoding based on the parity check matrix 20 as illustrated in FIG. 6.

According to such example, in the LDPC codeword $C=(c_0, c_1, \ldots, c_{N_{ldpc}-2}, c_{N-1})=(i_0, i_1, \ldots, i_{K-2}, i_{K-1}, p_0, p_1, \ldots, p_{g-1}, p_0', p_1', \ldots, p_{N-k-g-2}, p_{N-k-g-1})$, the first LDPC parity $(p_0, p_1, \ldots, p_{g-2}, p_{g-1})$ corresponds to the first parity submatrix (i.e., matrix B), and the second LDPC parity $(p_0', p_1', \ldots, p_{N-k-g-2}, p_{N-k-g-1})$ corresponds to the second parity submatrix (i.e., matrix D).

Meanwhile, the parity check matrix 20 with the structure as illustrated in FIG. 6 may be considered as having a combined form of parity check matrices having two different structures.

That is, the parity check matrix 20 may be considered as having a combined form of a first parity check matrix including matrices A and B and a second parity check matrix including matrices C and D. In other words, the parity check matrix 20 may include a parity submatrix which is a dual diagonal matrix, and a parity submatrix which is a unit matrix.

Meanwhile, a receiver according to exemplary embodiment may receive a superposition coding signal described above and generate first and second signals from the superposition coding signal. The first signal corresponds to the upper layer, and the second signal corresponds to the base layer as described above.

Figure 7:
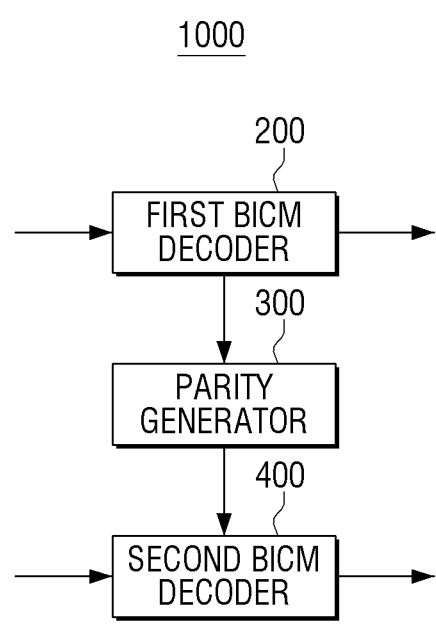
FIG. 7 is a block diagram provided to explain a constitution of a receiver according to an exemplary embodiment.

FIG. 7 is a block diagram provided to explain a configuration of a receiver according to an exemplary embodiment.

Referring to FIG. 7, a receiver 1000 may include a first BICM decoder 200, a parity generator 300 and a second BICM decoder 400.

The first BICM decoder 200 may process a superposition coding signal and generate a first signal. Here, the first signal may correspond to the upper layer.

Figure 8A:
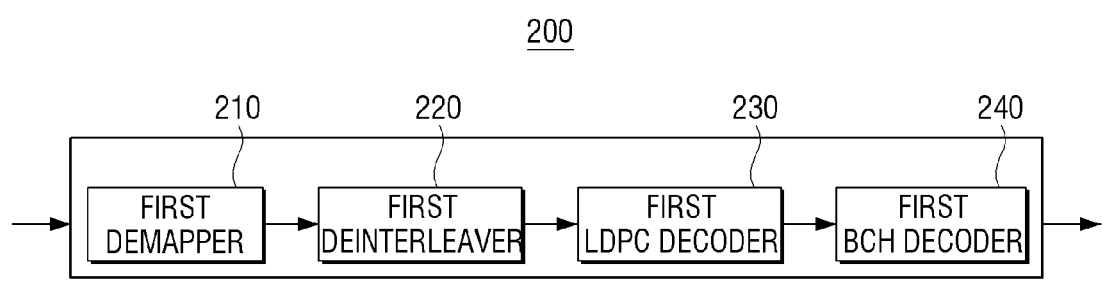
FIGS. 8A and 8B are block diagrams provided to explain a detailed constitution of a first BICM decoder according to exemplary embodiments.
Figure 8B:
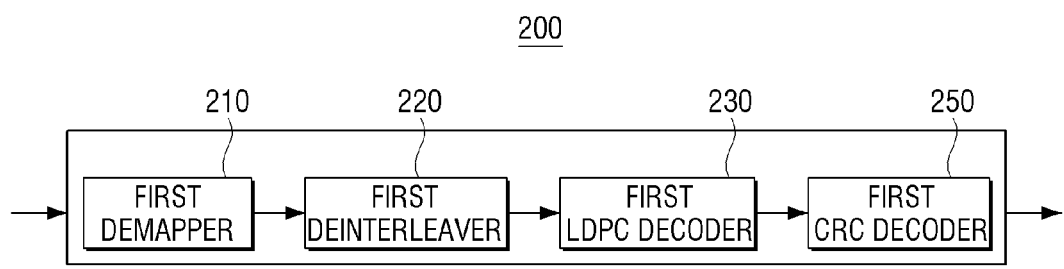

To that purpose, as illustrated in FIG. 8A, the first BICM decoder 200 may include a first demapper 210, a first deinterleaver 220, a first LDPC decoder 230 and a first BCH decoder 240, or as illustrated in FIG. 8B, the first BICM decoder 200 may include a first demapper 210, a first deinterleaver 220, a first LDPC decoder 230 and a first CRC decoder 250.

The first demapper 210 performs demodulation of the superposition coding signal.

Specifically, the first demapper 210 demodulates the superposition coding signal to generate a Log Likelihood Ratio (LLR) value, and outputs the LLR value to the first deinterleaver 220.

According to such example, the first demapper 210 may perform demodulation on the superposition coding signal based on a modulation method applied to the first signal corresponding to the upper layer. For example, when the transmitter 100 modulates the first signal corresponding to the upper layer using a QPSK method, the first demapper 210 may demodulate the superposition coding signal based on the QPSK method.

Here, the LLR value may be a log value of a ratio of a probability that a bit transmitted from the transmitter 100 is 0 and a probability that the bit is 1. Alternatively, the LLR value may be a representative value which is determined according to a section where a probability of a bit transmitted from the transmitter 100 being 0 or 1 belongs.

The first deinterleaver 220 deinterleaves an output from the first demapper 210.

Specifically, the first deinterleaver 220 is configured to correspond to the first interleaver 112 of the transmitter 100, to reverse the interleaving operation performed at the first interleaver 112, thus deinterleaving the LLR value and output the deinterleaved LLR value to the first LDPC decoder 230.

The first LDPC decoder 230 LDPC-decodes an output from the first deinterleaver 220.

Specifically, the first LDPC decoder 230 is configured to correspond to the LDPC encoder (not illustrated) of the first BICM encoder 110 of the transmitter 100, to perform LDPC decoding using the deinterleaved LLR value, thus recovering an LDPC information word and an LDPC parity (parity bits).

According to such example, the first LDPC decoder 230 may perform various methods of LDPC decoding. For example, the first LDPC decoder 230 may perform LDPC decoding through iterative decoding based on a sum-product algorithm to thus determine bit values by a hard decision and recover LDPC information bits of the LDPC codeword.

Meanwhile, the first LDPC decoder 230 may perform LDPC decoding based on the parity check matrix used at the first encoder 111 for LDPC encoding.

For example, when the parity check matrix with the structure as illustrated in FIG. 5 was used during LDPC encoding, the first LDPC decoder 230 may perform LDPC decoding based on the parity check matrix 10 with the structure as illustrated in FIG. 5, thereby to recover the LDPC information word. That is, the first LDPC decoder 230 may recover an LDPC information word corresponding to the information word submatrix 11 and the LDPC parity corresponding to the parity submatrix 12 with the dual diagonal matrix structure.

Additionally, when LDPC encoding used the parity check matrix 20 with the structure as illustrated in FIG. 6, the first LDPC decoder 230 may recover the LDPC information word by performing LDPC decoding based on the parity check matrix 20 with the structure as illustrated in FIG. 6. That is, the first LDPC decoder 230 may recover the LDPC information word corresponding to the information word submatrix, a first LDPC parity corresponding to the first parity submatrix having a dual diagonal matrix structure, and a second LDPC parity corresponding to the second parity submatrix.

Meanwhile, information on the parity check matrix used during LDPC encoding may be previously stored in the receiver 1000 or provided from the transmitter 100.

Further, as illustrated in FIG. 8A, the first LDPC decoder 230 may output the LDPC information word recovered by LDPC decoding to the first BCH decoder 240 or as illustrated in FIG. 8B, the first LDPC decoder 230 may output the LDPC information word recovered by LDPC decoding to the first CRC decoder 250.

The first BCH decoder 240 BCH-decodes an output from the first LDPC decoder 230 and generates the first signal. Here, the first BCH decoder 240 is in a configuration corresponding to the BCH encoder (not illustrated) of the first BICM encoder 110 of the transmitter 100.

Specifically, as the LDPC information output from the first LDPC decoder 230 is formed of the BCH information word and a BCH parity, the first BCH decoder 240 may recover the BCH information word by correcting an error of a BCH codeword using the BCH parity output from the first LDPC decoder 230.

Meanwhile, the first CRC decoder 250 CRC-decodes an output from the first LDPC decoder 230 and generates the first signal. Here, the first CRC decoder 250 is in a configuration corresponding to the CRC encoder (not illustrated) of the first BICM encoder 110.

Specifically, as the LDPC information word output from the first LDPC decoder 230 is formed of a CRC information word and a CRC parity, the first CRC decoder 250 may determine presence of an error in the CRC codeword by performing CRC decoding using the CRC parity output from the first LDPC decoder 230.

Here, the BCH information word and the CRC information word are bits that form a stream, i.e., the bits intended to be transmitted by the transmitter 100, and these bits may construct the first signal corresponding to the upper layer. For example, the first BCH decoder 240 and the first CRC decoder 250 may output bits that form the stream A of FIG. 1.

Referring back to FIG. 7, the parity generator 300 may generate a parity for use in decoding at the second BICM decoder 400 based on a result of decoding at the first BICM decoder 200.

In this example, the parity generator 300 may generate a parity based on a parity check matrix used in the LDPC encoding at the first encoder 111.

First, when the first encoder 111 of the transmitter 100 performed the LDPC encoding based on the parity check matrix 10 with the structure as illustrated in FIG. 5, the parity generator 300 may generate a parity with a method described below. Here, the parity generated by the parity generator 300 is a new parity which is not the parity recovered at the first BICM decoder 200 as described below.

The parity generator 300 may determine whether an error exists in the LDPC information word recovered by the LDPC decoding at the first LDPC decoder 230 based on a result of the BCH decoding at the first BCH decoder 240, when the LDPC codeword has an error.

To that purpose, the first LDPC decoder 230 may determine whether an error exists in the LDPC codeword, and provide a result of the determination to the parity generator 300.

Specifically, the first LDPC decoder 230 may determine presence of an error in at least one of the LDPC information word and the LDPC parity recovered by the LDPC decoding, using a parity check matrix used during the LDPC encoding at the first encoder 111.

As described above, the LDPC encoding is a process which generates the LDPC codeword to satisfy $H \cdot C^T=0$.

Accordingly, when there is no error existing in the LDPC information word or the LDPC parity recovered by the LDPC decoding at the first LDPC decoder 230, a product of multiplying the LDPC information word and the LDPC parity recovered by the LDPC decoding by the parity check matrix used during the LDPC encoding will be '0'.

Accordingly, the first LDPC decoder 230 multiplies the LDPC information word and the LDPC parity recovered by the LDPC decoding by the parity check matrix used during LDPC encoding, and may determine whether at least one of the LDPC information word and the LDPC parity recovered by the LDPC decoding includes an error by determining whether the product of such multiplication is '0'.

Meanwhile, $H \cdot C^T=0$ is formed of equations in which a sum of products of multiplying each column of the parity check matrix by the LDPC codeword bits is '0'. Here, each equation is referred to as a 'parity check equation', and a value of a left side of the parity check equation is referred to as an "LDPC syndrome value" (or syndrome parity check value).

Accordingly, in order to determine whether an error is present in at least one of the LDPC information word and the LDPC parity recovered by the LDPC decoding, the LDPC information word and the LDPC parity recovered by the LDPC decoding is multiplied by the parity check matrix used during the LDPC encoding, and it is determined whether the product of such multiplication is '0'. Here, this process may be referred to as determining whether an LDPC syndrome value is '0'.

As described above, the first LDPC decoder 230 may determine whether an error is present in at least one of the LDPC information word and the LDPC parity recovered by LDPC decoding and provide a result of the determination to the parity generator 300. Accordingly, the parity generator 300 may also determine whether at least one of the LDPC information word and the LDPC parity recovered by the LDPC decoding has the error, based on the result of the determination provided from the first LDPC decoder 230.

Meanwhile, the first BCH decoder 240 may provide the parity generator 300 with information about presence of an error in the LDPC information word and a location of bits at which the error is present.

Generally, in BCH decoding, it is possible to know the location of error-corrected bits accurately, when the BCH decoding is successful and so error correction is possible. For example, in the example of Digital Video Broadcasting-Terrestrial version 2 (DVB-T2) where the error correction capability of BCH decoding is 12 bits, error correction is possible up to 12 bits, and it is also possible to know the location of the error-corrected bits, i.e., know which of the bits has the error.

Accordingly, the first BCH decoder 240 performs the BCH decoding on the LDPC information word and determines whether the LDPC information word contains an error and, if so, determines a location of LDPC information word bits (hereafter "LDPC information bits") where the error is generated, and provides information about the determined location to the parity generator 300.

Accordingly, the parity generator 300 determines whether the LDPC information word has an error and, if so, determines the location of the LDPC information bits at which the error is generated, based on the information provided from the first BCH decoder 240.

As a result, the parity generator 300 may determine whether the LDPC codeword recovered by LDPC decoding contains an error based on the information provided from the first LDPC decoder 230, and, if it is determined that the LDPC codeword contains an error, may determine whether the LDPC information word contains an error and the LDPC information bits at which the error is present, based on the information provided from the first BCH decoder 240.

Meanwhile, the parity generator 300 may generate an LDPC parity using information part parity check (IPPC) expressions. Here, the LDPC parity generated by the parity generator 300 is distinguished from the LDPC parity recovered by the LDPC decoding at the LDPC decoder 230. They may be the same or different from each other.

The IPPC expressions mean a part of parity check equations. Herebelow, the IPPC expressions, and a method for generating an LDPC parity using the IPPC expressions depending on whether an error is present in an LDPC information word will be described in more detail.

FIG. 9 is a diagram provided to explain the IPPC equation according to an exemplary embodiment.

Referring to FIG. 9, when a parity check matrix is H 910, LDPC parity bits satisfying $H \cdot C^T=0$ for ($i_0$, $i_1$, $i_2$, $i_3$, $i_4$, $i_5$) are ($p_0$, $p_1$, $p_2$, $p_3$, $p_4$, $p_5$), and as a result of LDPC encoding, an LDPC codeword C (=$i_0$, $i_1$, $i_2$, $i_3$, $i_4$, $i_5$, $p_0$, $p_1$, $P_2$, $p_3$, $p_4$, $p_5$) (920) may be generated.

Here, respective equations which forms $H \cdot C^T=0$ represent parity check equations 930.

Meanwhile, as the parity check matrix H 910 is formed of an information word submatrix 911 and a parity submatrix 912, the parity check equations 930 may be formed of expressions generated based on the information word submatrix 911 and expressions generated based on the parity submatrix 912.

According to this example, in the parity check equations 930, the expressions generated based on the information word submatrix 911 may be defined as the IPPC expressions 940. That is, the IPPC expressions represent respective sums of LDPC information bits, corresponding to columns at which 1 is located, in the rows of the information word submatrix 911.

For example, in a $0^{th}$ row of the information word submatrix 911 where 1 is present in $0^{th}$ and $3^{rd}$ columns among the $0^{th}$ to $5^{th}$ columns, an IPPC expression for the $0^{th}$ row of the information word submatrix 911 will be a sum ($i_0 \oplus i_3$) of the LDPC information bits corresponding to the first column and the fourth column, respectively.

Further, in a $1^{st}$ row of the information word submatrix 911 having 1 in the $2^{nd}$ and $5^{th}$ columns, an IPPC expression for the $1^{st}$ row of the information word submatrix 911 will be a sum ($i_2 \oplus i_5$) of the LDPC information bits corresponding to the $2^{nd}$ column and the $5^{th}$ column.

Further, in a $2^{nd}$ row of the information word submatrix 911 having 1 in the $0^{th}$ and $4^{th}$ columns, an IPPC expression for the $2^{nd}$ row of the information word submatrix 911 will be a sum ($i_0 \oplus i_4$) of the LDPC information bits corresponding to the $0^{th}$ column and the $4^{th}$ column, respectively.

Further, in a $3^{rd}$ row of the information word submatrix 911 having 1 in the $1^{st}$ and $2^{nd}$ columns, an IPPC expression for the $3^{rd}$ row of the information word submatrix 911 will be a sum ($i_1 \oplus i_2$) of the LDPC information bits corresponding to the $1^{st}$ column and the $2^{nd}$ column, respectively.

Further, in a $4^{th}$ row of the information word submatrix 911 having 1 in the $3^{rd}$ and $4^{th}$ columns, an IPPC expression for the $4^{th}$ row of the information word submatrix 911 will be a sum ($i_3 \oplus i_4$) of the LDPC information bits corresponding to the $3^{rd}$ column and the $4^{th}$ column, respectively.

Further, in a $5^{th}$ row of the information word submatrix 911 having 1 in the $1^{st}$ and $5^{th}$ columns, an IPPC expression for the $5^{th}$ row of the information word submatrix 911 will be a sum ($i_1 | i_5$) of the LDPC information bits corresponding to the 1st column and the 5th column, respectively.

Meanwhile, the parity generator 300 may generate an LDPC parity using IPPC expressions such as the IPPC expressions 940.

To that purpose, the receiver 1000 may previously store information on the IPPC expressions corresponding to the parity check matrix 910 or 1010. Accordingly, the parity generator 300 may calculate values of the IPPC expressions by substituting LDPC information bits recovered by LDPC decoding or LDPC information bits error-corrected by BCH decoding for the IPPC expressions.

First, when the LDPC information bits recovered by the LDPC decoding do not contain an error, the parity generator 300 may generate an LDPC parity corresponding to the LDPC information bits recovered by the LDPC decoding, based on the IPPC expressions.

Specifically, considering that the parity submatrix 912 is a dual diagonal matrix, the parity generator 300 may generate the LDPC parity by accumulating LDPC parity bits which are recovered by the LDPC decoding at the LDPC decoder 230 to the IPPC expression values sequentially.

The above is called "accumulator based encoding using IPPC (ACC based IPPC encoding)", which will be described in detail below with reference to FIG. 10.

FIG. 10 is a diagram provided to explain a method for generating an LDPC parity using IPPC expressions, according to an exemplary embodiment.

Referring to FIG. 10, for convenience of explanation, it is assumed that a parity check matrix and IPPC expressions are defined as illustrated in FIG. 9.

As described above, parity check equations are represented by sums of expressions (i.e., IPPC expressions) generated based on an information word submatrix, and expressions generated based on a parity submatrix.

Here, considering that the parity submatrix is a dual diagonal matrix, LDPC parity bits may be calculated by adding an IPPC expression value to a previously-calculated LDPC parity bit(s).

For example, referring to FIG. 10, a parity check equation 1031 generated by multiplying a $0^{th}$ row of the parity check matrix 1010 by LDPC codeword bits 1020 is $i_0 \oplus i_3 \oplus p_0 = 0$, so an LDPC parity bit $p_0$ may be calculated to be $p_0 = i_0 \oplus i_3$. Here, considering that $i_0 \oplus i_3$ is an IPPC expression 1041 generated by multiplication of a $0^{th}$ row of an information word submatrix by LDPC information bits, the parity generator 300 may generate the LDPC parity bit $p_0$ which has an IPPC expression value $t_0 = i_0 \oplus i_3$. Accordingly, $p_0 = t_0$ (1051).

Further, a parity check equation 1032 generated by multiplying a $1^{st}$ row of the parity check matrix 1010 by the LDPC codeword bits 1020 is $i_2 \oplus i_5 \oplus p_0 \oplus p_1 = 0$, so an LDPC parity bit $p_1$ may be calculated to be $p_1 = i_2 \oplus i_5 \oplus p_0$. Here, considering that $i_2 \oplus i_5$ is an IPPC expression 1042 generated by multiplication of a $1^{st}$ row of the information word submatrix by the LDPC information bits, the parity generator 300 may generate the LDPC parity bit $p_1$ by adding (i.e., binary adding) the LDPC parity bit $p_0$ to an IPPC expression value $t_1 = i_2 \oplus i_5$. Accordingly, $p_1 = t_1 \oplus p_0$ (1052).

Further, a parity check equation 1033 generated by multiplying a $2^{nd}$ row of the parity check matrix 1010 by the LDPC codeword bits 1020 is $i_0 \oplus i_4 \oplus p_1 \oplus p_2 = 0$, so an LDPC parity bit $p_2$ may be calculated to be $p_2 = i_0 \oplus i_4 \oplus p_1$. Here, considering that $i_0 \oplus i_4$ is an IPPC expression 1043 generated by multiplication of a $2^{nd}$ row of the information word submatrix by the LDPC information bits, the parity generator 300 may generate the LDPC parity bit $p_2$ by adding the LDPC parity bit $p_1$ to an IPPC expression value $t_2 = i_0 \oplus i_4$. Accordingly, $p_2 = t_2 \oplus p_1$ (1053).

Further, a parity check equation 1034 generated by multiplying a $3^{rd}$ row of the parity check matrix 1010 by the LDPC codeword bits 1020 is $i_1 \oplus i_2 \oplus p_2 \oplus p_3 = 0$, so an LDPC parity bit $p_3$ may be calculated to be $p_3 = i_1 \oplus i_2 \oplus p_2$. Here, considering that $i_1 \oplus i_2$ is an IPPC expression 1044 generated by multiplication of a $3^{rd}$ row of the information word submatrix by the LDPC information bits, the parity generator 300 may generate the LDPC parity bit $p_3$ by adding the LDPC parity bit $p_2$ to an IPPC expression value $t_3 = i_1 \oplus i_2$. Accordingly, $p_3 = t_3 \oplus p_2$ (1054).

Further, a parity check equation 1035 generated by multiplying a $4^{th}$ row of the parity check matrix 1010 by the LDPC codeword bits 1020 is $i_3 \oplus i_4 \oplus p_3 \oplus p_4 = 0$, so an LDPC parity bit $p_4$ may be calculated to be $p_4 = i_3 \oplus i_4 \oplus p_3$. Here, considering that $i_3 \oplus i_4$ is an IPPC expression 1045 generated by multiplication of a $4^{th}$ row of the information word submatrix by the LDPC information bits, the parity generator 300 may generate the LDPC parity bit $p_4$ by adding the LDPC parity bit $p_3$ to an IPPC expression value $t_4 = i_3 \oplus i_4$. Accordingly, $p_4 = t_4 \oplus p_3$ (1055).

Further, the parity check equation 1036 generated by multiplying a $5^{th}$ row of the parity check matrix 1010 by the LDPC codeword bits 1020 is $i_1 \oplus i_5 \oplus p_4 \oplus p_5 = 0$, so an LDPC parity bit $p_5$ may be calculated to be $p_5 = i_1 \oplus i_5 \oplus p_4$. Here, considering that $i_1 \oplus i_5$ is an IPPC expression 1046 generated by multiplication of a $5^{th}$ row of the information word submatrix by the LDPC information bits, the parity generator 300 may generate the LDPC parity bit $p_5$ by adding the LDPC parity bit $p_4$ to an IPPC expressions value $t_5 = i_1 \oplus i_5$. Accordingly, $p_5 = t_5 \oplus p_4$ (1056).

As described above, considering that the parity submatrix is a dual diagonal matrix, the parity generator 300 may generate an LDPC parity by accumulating the LDPC parity bits, which constitute the LDPC parity recovered by the LDPC decoding at the LDPC decoder 230, to the IPPC expressions values.

Meanwhile, when an LDPC information word recovered by LDPC decoding contains an error, the parity generator 300 may determine, based on a result of BCH decoding, a location of an error-generated bit in the LDPC information word recovered by LDPC decoding, corrects the error by flipping an IPPC expression value corresponding to the error-generated bit, and generate an LDPC parity corresponding to the error-corrected LDPC information word based on the flipped IPPC expression value.

In the example mentioned above, the parity generator 300 may determine a location of the error-generated bit of the LDPC information word, based on information on the location of the error-generated bit of the LDPC information word provided from the first BCH decoder 240.

Meanwhile, considering that IPPC expressions are represented by sums of LDPC information bits, presence of an error in the LDPC information word recovered by LDPC decoding can be interpreted as indicating the presence of an error in the IPPC expressions. Accordingly, when the LDPC information word includes an error, then it is not possible to generate an accurate LDPC parity without performing a separate correction of the IPPC expressions.

Accordingly, the parity generator 300 may generate LDPC parity bits by flipping an IPPC expression value associated with the error-generated bit in the LDPC information word, and sequentially accumulating the LDPC parity bits to the flipped IPPC expression value, as will be described in greater detail below with reference to FIG. 11.

FIG. 11 is a diagram provided to explain a method for generating an LDPC parity using IPPC expressions, according to an exemplary embodiment.

In FIG. 11, for convenience of explanation, it is assumed that a parity check matrix and IPPC expressions are defined as in FIG. 9.

When an LDPC information word includes an error, the parity generator 300 may flip an IPPC expression value associated with an error-generated LDPC information bit.

Here, an IPPC expression associated with an error-generated LDPC information bit may refer to an IPPC expression which is generated based on the error-generated LDPC information bit.

In other words, since an IPPC expression is generated by multiplying rows of an information word submatrix by LDPC information bits, the IPPC expression may be expressed as a sum of the LDPC information bits which are multiplied by columns at which 1 is present, in the rows of the information word submatrix.

Here, an IPPC expression that corresponds to a row at which 1 is present in a column multiplied by an error-generated LDPC information bit is referred to as an IPPC expression associated with the error-generated LDPC information bit.

For example, it is assumed that an error is present in an LDPC information bit $i_2$, as illustrated in FIG. 11.

In this example, the LDPC information bit $i_2$ is multiplied by a $2^{nd}$ column of an information word submatrix 1110 during LDPC encoding, so IPPC expressions that correspond to rows at which 1 is present in the $2^{nd}$ column, that is, an IPPC expression ($i_2 \oplus i_5$) that corresponds to a $1^{st}$ row and an IPPC expression ($i_1 \oplus i_2$) that corresponds to a $3^{rd}$ row may be associated with the error-generated LDPC information bit $i_2$. That is, the IPPC expressions that include the LDPC information bit $i_2$ may be the IPPC expressions associated with the error-generated LDPC information bit $i_2$.

Here, the parity generator 300 may flip the IPPC expression values associated with the error-generated LDPC information bit $i_2$ and sequentially add LDPC parity bits to the flipped IPPC expression value, thereby to generate an LDPC parity.

For example, as illustrated in FIG. 11, when an IPPC expression value $t_1 = i_2 \oplus i_5$ corresponding to the $1^{st}$ row of the information word submatrix 1110 is 0, the parity generator 300 may flip the value $t_1$ to correct the IPPC expression value corresponding to the $1^{st}$ row to 1 ($=t_1'$).

Further, when an IPPC expression value $t_3 = i_1 \oplus i_2$ corresponding to the $3^{rd}$ row of the information word submatrix 1110 is 1, the parity generator 300 may flip the value $t_3$ to correct the IPPC expression value corresponding to the $3^{rd}$ row to 0 ($=t_3'$).

The parity generator 300 may then generate LDPC parity bits based on the corrected IPPC expression values.

In this example, considering that a parity submatrix is a dual diagonal matrix, the parity generator 300 may generate each of the LDPC parity bits by adding an IPPC expression value to a previously-calculated LDPC parity bit. At this time, when IPPC equation values are corrected due to an error generated in the LDPC information bits, the corrected IPPC expression values may be used.

The method of generating LDPC parity bits in this example is identical to that illustrated in FIG. 10 except that the corrected IPPC expression values are used.

For example, referring to FIG. 11, as the IPPC expression value corresponding to the $1^{st}$ row of the information word submatrix 1110 is corrected to $t_1'$, and the IPPC expression value corresponding to the $3^{rd}$ row of the information word submatrix 1110 is corrected to $t_3'$, the parity generator 300 may generate LDPC parity bits $p_0 (=t_0)$ (1121), $p_1 (=t_1' \oplus p_0)$ (1122), $p_2 (=t_2 \oplus p_1)$ (1123), $p_3 (=t_3' \oplus p_2)$ (1124), $p_4 (=t_4 \oplus p_3)$ (1125), and $p_5 (=t_5 \oplus p_4)$ (1126).

As described, the complexity is reduced compared to a case where an LDPC parity is generated by an $H \cdot C^T = 0$ process, as IPPC expression values are previously stored and used for generating an LDPC parity.

FIG. 12 is a flowchart provided to explain a method for generating an LDPC parity according to an exemplary embodiment.

Referring to FIG. 12, at S1210, upper layer LDPC decoding is performed on an input signal such as a superposition coding signal to generate an upper layer signal. At S1220, it is first determined whether an LDPC syndrome value is 0 based on a result of the upper layer LDPC decoding performed at S1210. That is, the superposition coding signal is LDPC-decoded, and then it is determined whether at least one of an LDPC information word and an LDPC parity recovered by the upper layer LDPC decoding has an error.

At S1220-Y, when it is determined that the LDPC syndrome value is 0, at S1230, base layer LDPC decoding is performed to generate a base layer signal based on the LDPC information word and the LDPC parity recovered by LDPC decoding. The base layer LDPC decoding will be described in further detail below.

Meanwhile, at S1220-N, when the LDPC syndrome value is not 0, at S1240, BCH decoding is performed on the LDPC information word recovered by the upper layer LDPC decoding.

Then, based on a result of the BCH decoding, it is determined whether the LDPC information word contains an error. That is, it is determined whether the number of errors in LDPC information bits of the LDPC information word is 0 at S1250.

At S1250-Y, when it is determined that the number of errors in the LDPC information bits is 0, at S1260, ACC based IPPC encoding is performed. That is, when the LDPC information does not include an error, previously-stored IPPC expression values are used to generate LDPC parity bits through the ACC based IPPC encoding. Then, based on the information indicating error-free LDPC information bits and the LDPC parity bits generated through the ACC based IPPC encoding, the base layer LDPC decoding is performed to generate a base layer signal at S1230.

Meanwhile, at S1250-N, when it is determined that the number of errors in the LDPC information bits is not 0, at S1260, it is determined whether the error is correctible by the BCH decoding at 1260. That is, it is determined if it is possible to correct the error in the LDPC information bits through the BCH decoding.

At S1270-N, when it is determined that error correction is not possible through the BCH decoding, at S1280, the upper layer signal is discarded by exception handling.

At S1270-Y, when it is determined that error correction is possible through the BCH decoding, and thus, the error is corrected, at S1290, the IPPC expression values are corrected, and at S1260, ACC based IPPC encoding is performed based on the corrected IPPC expression values. Then, based on the error-corrected LDPC information bits and the LDPC parity bits generated by the ACC based IPPC encoding, the base layer LDPC decoding is performed to generate a base layer signal at S1230.

Meanwhile, as exemplified above, an LDPC parity (i.e., LDPC parity bits) may be generated by ACC based IPPC encoding, but exemplary embodiments are not limited thereto. Accordingly, the LDPC parity may be generated by methods other than the ACC based IPPC encoding, as illustrated in FIGS. 13 and 14.

Figure 13:
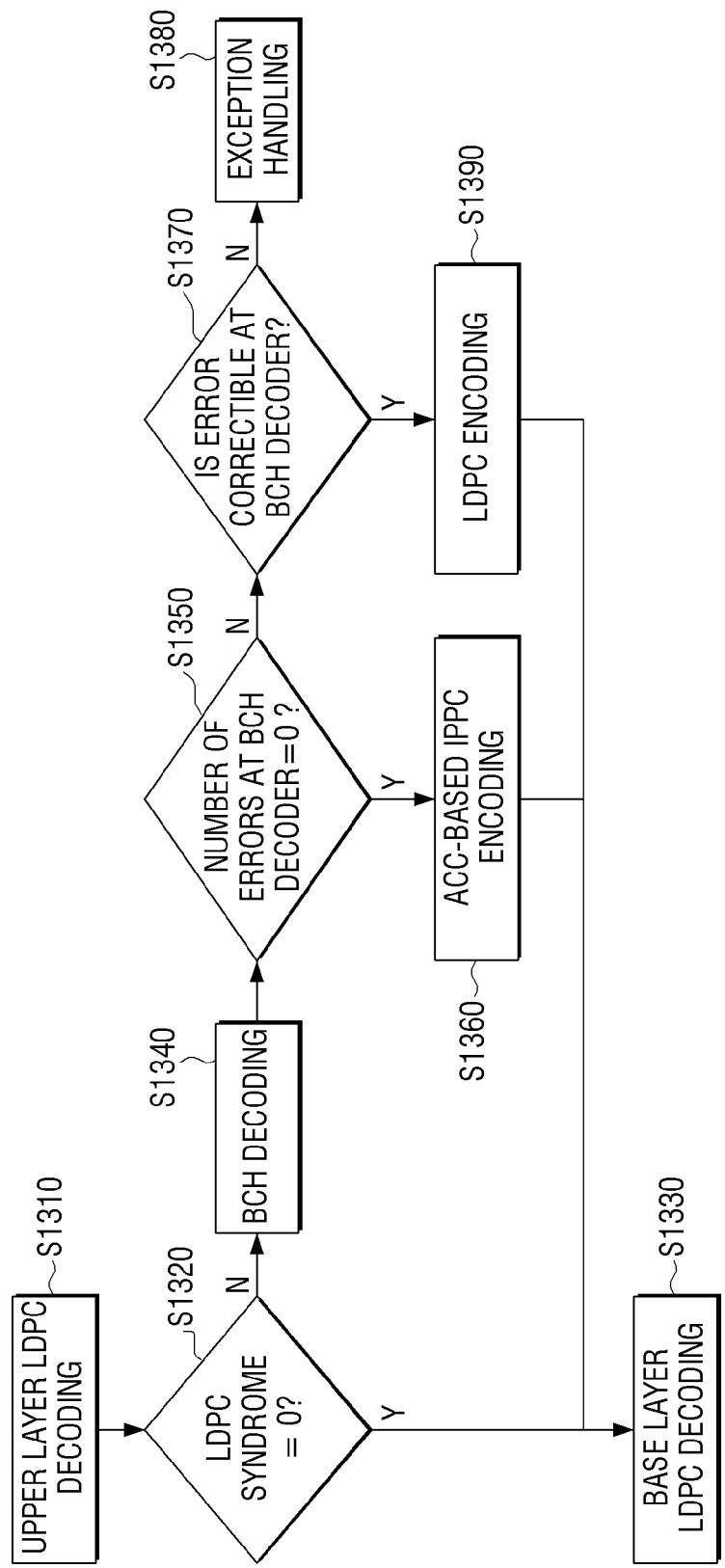
Figure 14:
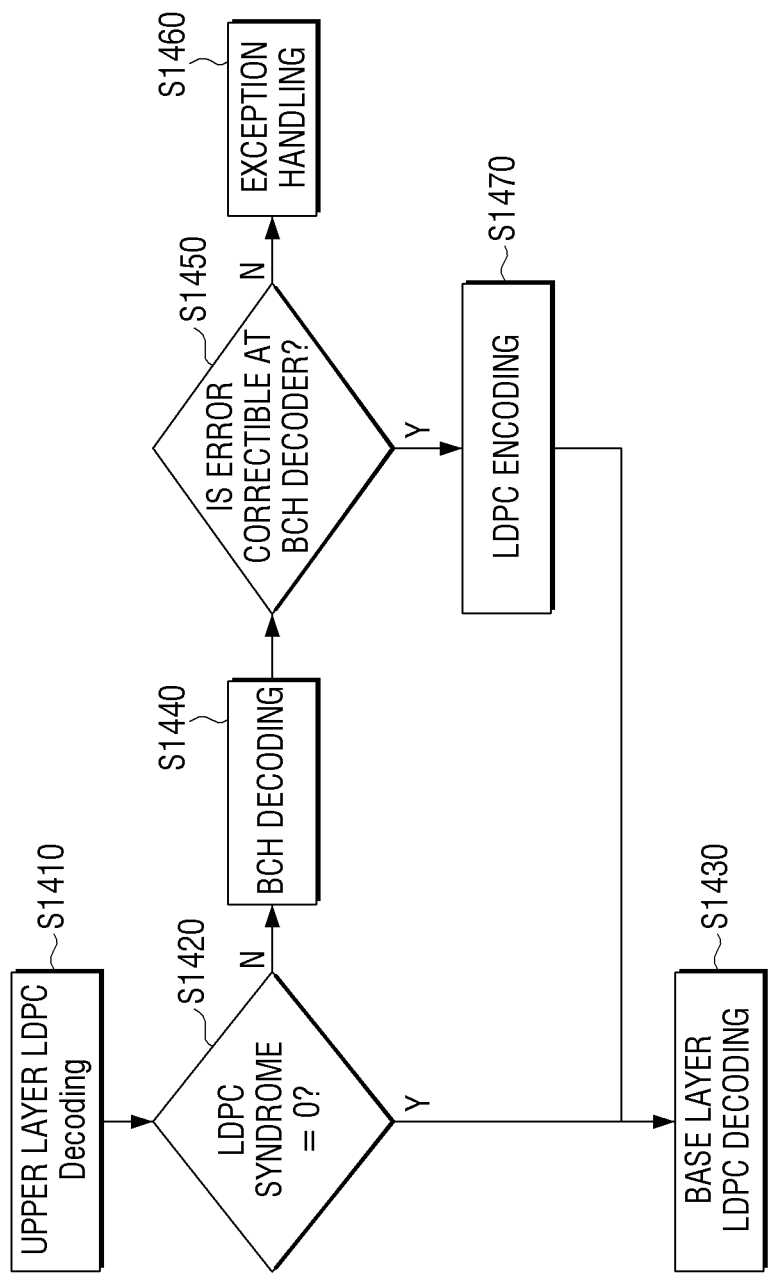

FIG. 13 is a flowchart provided to explain a method for generating an LDPC parity according to another exemplary embodiment.

Referring to FIG. 13, at S1310, upper layer LDPC decoding to generate an upper layer signal from a received superposition coding signal is performed. At S1320, it is determined whether an LDPC syndrome value is 0. That is, the superposition coding signal is LDPC-decoded, and it is determined whether at least one of an LDPC information word and an LDPC parity recovered by the upper layer LDPC decoding includes an error.

At S1320-Y, when it is determined that the LDPC syndrome value is 0, base layer LDPC decoding is performed to generate a base layer signal based on the LDPC information word and the LDPC parity recovered by the upper layer LDPC decoding.

Meanwhile, at S1320-N, when it is determined that the LDPC syndrome value is not 0, at S1340, BCH decoding is performed on an LDPC information word recovered by the upper layer LDPC decoding.

Then, based on a result of the BCH decoding, it is determined whether the LDPC information word includes an error. That is, at S1350, it is determined whether the number of errors of LDPC information bits of the LDPC information word is 0.

At S1350-Y, when it is determined that the number of errors of the LDPC information bits is 0, at S1360, ACC based IPPC encoding is performed. That is, when the LDPC information word does not include an error, an LDPC parity is generated by using previously-stored IPPC expression values. After that, based on the information indicating error-free LDPC information bits and the generated LDPC parity, the base layer LDPC decoding is performed to generate a base layer signal at S1330.

Meanwhile, at S1350-N, when it is determined that the number of errors in the LDPC information bits is not 0, at S1360, it is determined whether the error is correctible by the BCH decoding. That is, it is determined whether it is possible to correct the error in the LDPC information bits through the BCH decoding.

At S1370-N, when it is determined that error correction is not possible through the BCH decoding, at S1380, the upper layer signal is discarded by exception handling.

Meanwhile, at S1370-Y, when it is determined that error correction is possible, and thus, the error is corrected, at S1390, LDPC encoding is performed based on error-corrected LDPC information bits at S1390. By this LDPC encoding, an LDPC parity is generated through an $H \cdot C^T = 0$ process, which is different from encoding by using IPPC expression values. That is, the parity generator 300 as illustrated in FIG. 7 generates LDPC parity bits that satisfy a parity check equation $H \cdot C^T = 0$ based on the LDPC information bits of which the error is corrected by the BCH decoding. In this example, the parity check matrix H may be a parity check matrix that is used for LDPC encoding at the transmitter 100, and information about this parity check matrix may be provided from the transmitter 100 to the receiver 1200 along with a superposition coding signal. At S1330, the base layer LDPC decoding is then performed based on the error-corrected LDPC information bits and the LDPC parity bits generated by the LDPC encoding to generate a base layer signal.

FIG. 14 is a flowchart provided to explain a method for generating an LDPC parity according to another exemplary embodiment.

Referring to FIG. 14, at S1410, upper layer LDPC decoding to generate an upper layer signal is performed on an input superposition coding signal, first. At S1420, it is determined whether an LDPC syndrome value is 0. That is, the superposition coding signal is LDPC-decoded, and it is determined whether at least one of an LDPC information word and an LDPC parity recovered by the LDPC decoding includes an error.

At S1420-Y, when it is determined that the LDPC syndrome value is 0, at S1430, base layer LDPC decoding is performed based on the LDPC codeword recovered by the LDPC decoding, to generate a base layer signal.

Meanwhile, at S1420-N, when it is determined that the LDPC syndrome value is not 0, at S1440, BCH decoding is performed on an LDPC information word recovered by the upper layer LDPC decoding.

Then, based on a result of the BCH decoding, at S1450, it is determined whether an error present in LDPC information bits is correctible by BCH decoding, at S1450. That is, it is determined whether it is possible to correct the error included in the LDPC information bits with the BCH decoding.

At S1450-N, when it is determined that error correction is not possible, the upper layer signal is discarded by exception handling, at S1460.

Meanwhile, at S1450-Y, if it is determined that the error correction is possible, and thus, the error is corrected, at S1470, LDPC encoding is performed based on error-corrected LDPC information bits. Then based on the error-corrected LDPC information bits and an LDPC parity generated by this LDPC encoding, the base layer LDPC decoding is performed to generate a base layer signal, at S1430.

Meanwhile, as exemplified above, it may be determined whether an LDPC syndrome value is 0, and if not, i.e., if an error is present in an LDPC codeword recovered by LDPC decoding, BCH decoding may be performed, but this is merely one of exemplary embodiments.

Accordingly, without separately determining whether an LDPC syndrome value is 0, BCH decoding may be performed on an LDPC information word recovered by LDPC decoding, and an LDPC parity may be generated based on a result of the BCH decoding. Alternatively, even when the LDPC syndrome value is 0, BCH decoding may be performed on the LDPC information word recovered by the LDPC decoding, and the LDPC parity may be generated based on the result of the BCH decoding.

Meanwhile, when the first encoder 111 performed LDPC encoding based on a parity check matrix with the structure as illustrated in FIG. 6 (i.e., the parity check matrix 20), the parity generator 300 may generate an LDPC parity according to a method described below.

First, when at least one of an LDPC information word and a first LDPC parity recovered by LDPC decoding includes an error, it may be determined based on a result of BCH decoding whether the LDPC information word recovered by the LDPC decoding includes an error.

To that purpose, the first LDPC decoder 230 may determine whether at least one of the LDPC information word and the first LDPC parity recovered by the LDPC decoding includes an error, and provide information on the presence of the error to the parity generator 300.

Specifically, the first LDPC decoder 230 may determine whether at least one of the LDPC information word and the first LDPC parity recovered by the LDPC decoding includes an error, using the first parity check matrix (i.e., parity check matrix formed of matrices A and B in FIG. 6) which is used during the LDPC encoding at the first encoder 111.

As described above, LDPC encoding is a process of generating an LDPC codeword which satisfies $H \cdot C^T = 0$.

Accordingly, when an error does not exist in the LDPC information and the first LDPC parity recovered by the LDPC decoding, a product of multiplying the LDPC information word and the first LDPC parity, recovered by the LDPC decoding, by the first parity check matrix used during LDPC encoding will be '0'.

Accordingly, the first LDPC decoder 230 may multiply the LDPC information word and the first LDPC parity recovered by LDPC decoding by the first parity check matrix used during the LDPC encoding, and determine whether at least one of the LDPC information word and the first LDPC parity recovered by LDPC decoding includes the error, by determining whether the product of such multiplication is '0'.

In this example, a left side value of a parity check equation generated based on the first parity check matrix may be referred to as an LDPC syndrome value for the first parity check matrix.

That is, the first LDPC decoder 230 may multiply the LDPC information word and the first LDPC parity recovered by the LDPC decoding by the first parity check matrix used during the LDPC encoding, and determine whether at least one of the LDPC information word and the first LDPC parity recovered by the LDPC decoding includes the error, by determining whether the product of such multiplication is '0'.

As described above, the first LDPC decoder 230 may determine whether at least one of the LDPC information word and the first LDPC parity recovered by the LDPC decoding includes an error, and provide the information on the presence of the error to the parity generator 300. Accordingly, the parity generator 300 may determine whether at least one of the LDPC information word and the first LDPC parity recovered by the LDPC decoding includes the error, based on the information provided from the first LDPC decoder 230.

Meanwhile, the first BCH decoder 240 may provide the parity generator 300 with information on whether the LDPC information word includes an error, and on a location of a bit at which the error is present.

Generally, BCH decoding may provide an accurate location of an error-corrected bit, when decoding is successful and so error correction is possible.

Accordingly, the first BCH decoder 240 performs BCH decoding on the LDPC information word and determines whether the LDPC information word contains an error, and if so, determines a location of the LDPC information bits where the error is generated, and provides information thereof to the parity generator 300.

Accordingly, the parity generator 300 determines whether the LDPC information word has the error, and if so, determines the location of the LDPC information bits at which the error is generated, based on the information provided from the first BCH decoder 240.

As a result, the parity generator 300 may determine whether at least one of the LDPC information word and the first LDPC parity recovered by the LDPC decoding contains an error based on the information delivered from the first LDPC decoder 230, and it is determined that that at least one of the LDPC information word and the first LDPC parity contains the error, may determine whether the LDPC information word contains the error and the LDPC information bits at which the error is present, based on the information delivered from the first BCH decoder 240.

Meanwhile, the parity generator 300 may generate an LDPC parity using IPPC expressions. As described earlier, the LDPC parity generated by the parity generator 300 is distinguished from the LDPC parity recovered by the LDPC decoding at the LDPC decoder 230. They may be the same or different from each other.

The IPPC expressions represent a part of a parity check equation and may include first IPPC expressions and second IPPC expressions. Herebelow, the IPPC expressions, and a method for generating an LDPC parity using the IPPC expressions depending on whether an error is present in an LDPC information word will be described in more detail.

FIGS. 15A and 15B are diagrams provided to explain IPPC expressions according to an exemplary embodiment.

Referring to FIGS. 15A and 15B, when a parity check matrix is H 1510, LDPC parity bits satisfying $H \cdot C^T = 0$ for LDPC information bits $(i_0, i_1, i_2, i_3, i_4, i_5)$ are $(p_0, p_1, p_2, p_3, p_4, p_5, p_0', p_1', p_2', p_3', p_4', p_5')$, so an LDPC codeword 1520 C $(=i_0, i_1, i_2, i_3, i_4, i_5, p_0, p_1, p_2, p_3, p_4, p_5, p_0', p_1', p_2', p_3', p_4', p_5')$ may be generated by LDPC encoding. Here, a part of the LDPC parity bits formed of $(p_0, p_1, p_2, p_3, p_4, p_5)$ is referred to as "first parity bits", and the other part of the LDPC parity bits formed of $(p_0', p_1', p_2', p_3', p_4', p_5')$ is referred to as "second parity bits".

Here, equations forming a matrix equation $H \cdot C^T = 0$ represent parity check equations 1530.

Meanwhile, as the parity check matrix H 1510 is formed of a first information word submatrix 1511, a second information word submatrix 1512, a first parity submatrix 1513 and a second parity submatrix 1514, the parity check equations 1530 may be formed of equations generated based on the first information word submatrix 1511 and the second information word submatrix 1512, and equations generated based on the first parity submatrix 1513 and the second parity submatrix 1514.

In this example, a part of the parity check equations 1530 that is generated based on the first information word submatrix 1511 may be defined as first IPPC expressions 1541. That is, each of the first IPPC expressions represent a sum of the LDPC information bits corresponding to columns at which 1 is located in each of the rows of the first information word submatrix 1511.

Further, another part of the parity check equation 1530 that is generated based on the second information word submatrix 1512 may be defined as second IPPC expressions 1542. That is, each of the second IPPC expressions represent a sum of the LDPC information bits and the first parity bits corresponding to columns at which 1 is located, in each of the rows of the second information word submatrix 1512.

For example, in a $0^{th}$ row of the first information word submatrix 1511 in which 1 is present in $2^{nd}$ and $5^{th}$ columns among $0^{th}$ to the $5^{th}$ columns, a first IPPC expression for the $0^{th}$ row of the first information word submatrix 1511 is, which is a sum of LDPC information bits corresponding to the $2^{nd}$ and $5^{th}$ columns, respectively.

Further, in a $1^{st}$ row of the first information word submatrix 1511 in which 1 is present in $1^{st}$ and $4^{th}$ columns, a first IPPC expression for the $1^{st}$ row of the first information word submatrix 1511 is, $i_1 \oplus i_4$, which is a sum of the LDPC information bits corresponding to the $1^{st}$ and $4^{th}$ columns, respectively.

Further, in a $2^{nd}$ row of the first information word submatrix 1511 in which 1 is present in the $0^{th}$ and $2^{nd}$ columns, a first IPPC expression for the $2^{nd}$ row of the first information word submatrix 1511 is, $i_0 \oplus i_2$, which is a sum of the LDPC information bits corresponding to the $0^{th}$ and $2^{nd}$ columns, respectively.

Further, in a $3^{rd}$ row of the first information word submatrix 1511 in which 1 is present in the $3^{rd}$ and $4^{th}$ columns, a first IPPC expression for the $3^{rd}$ row of the first information word submatrix 1511 is, $i_3 \oplus i_4$, which is a sum of the LDPC information bits corresponding to the $3^{rd}$ and $4^{th}$ columns, respectively.

Further, in a $4^{th}$ row of the first information word submatrix 1511 in which 1 is present in the $0^{th}$ and $5^{th}$ columns, a first IPPC expression for the $4^{th}$ row of the first information word submatrix 1511 is, $i_0 \oplus i_5$, which is a sum of the LDPC information bits corresponding to the $0^{th}$ and $5^{th}$ columns, respectively.

Further, in a $5^{th}$ row of the first information word submatrix 1511 in which 1 is present in the $1^{st}$ and $3^{rd}$ columns, a first IPPC expression for the $5^{th}$ row of the first information word submatrix 1511 is, $i_1 \oplus i_3$, which is a sum of the LDPC information bits corresponding to the $1^{st}$ and $3^{rd}$ columns, respectively.

Meanwhile, in a $0^{th}$ row of the second information word submatrix 1512 in which 1 is present in $2^{nd}$, $5^{th}$, $6^{th}$ and $9^{th}$ columns among $0^{th}$ to $11^{th}$ columns, a second IPPC expression for the $0^{th}$ row of the second information word submatrix 1512 is, $i_2 \oplus i_5 \oplus p_0 \oplus p_3$, which is a sum of the LDPC information bits and first LDPC parity bits respectively corresponding to the $2^{nd}$, $5^{th}$, $6^{th}$ and $9^{th}$ columns.

Further, in a $1^{st}$ row of the second information word submatrix 1512 in which 1 is present in the $1^{st}$, $2^{nd}$, $6^{th}$ and $10^{th}$ columns, a second IPPC expression for the $1^{st}$ row of the second information word submatrix 1512 is, $i_1 \oplus i_2 \oplus p_0 \oplus p_4$, which is a sum of the LDPC information bits and the first LDPC parity bits respectively corresponding to the $1^{st}$, $2^{nd}$, $6^{th}$ and $10^{th}$ columns.

Further, in a $2^{nd}$ row of the second information word submatrix 1512 in which 1 is present in the $1^{st}$, $5^{th}$, $9^{th}$ and $10^{th}$ columns, a second IPPC expression for the $2^{nd}$ row of the second information word submatrix 1512 is, $i_1 \oplus i_5 \oplus p_3 \oplus p_4$, which is a sum of the LDPC information bits and the first LDPC parity bits respectively corresponding to the $1^{st}$, $5^{th}$, $9^{th}$ and $10^{th}$ columns.

Further, in a $3^{rd}$ row of the second information word submatrix 1512 in which 1 is present in the $0^{th}$, $3^{rd}$, $7^{th}$ and $9^{th}$ columns, a second IPPC expression for the $3^{rd}$ row of the second information word submatrix 1512 is, $i_0 \oplus i_3 \oplus p_1 \oplus p_3$, which is a sum of the LDPC information bits and the first LDPC parity bits respectively corresponding to the $0^{th}$, $3^{rd}$, $7^{th}$ and $9^{th}$ columns.

Further, in a $4^{th}$ row of the second information word submatrix 1512 in which 1 is present in the $0^{th}$, $4^{th}$, $8^{th}$ and $9^{th}$ columns, a second IPPC expression for the $4^{th}$ row of the second information word submatrix 1512 is, $i_0 \oplus i_4 \oplus p_2 \oplus p_3$, which is a sum of the LDPC information bits and the first LDPC parity bits respectively corresponding to the $0^{th}$, $4^{th}$, $8^{th}$ and $9^{th}$ columns.

Further, in a $5^{th}$ row of the second information word submatrix 1512 in which 1 is present in the $3^{rd}$, $5^{th}$, $8^{th}$ and $11^{th}$ columns, a second IPPC expression for the $5^{th}$ row of the second information word submatrix 1512 is, $i_3 \oplus i_4 \oplus p_2 \oplus p_5$, which is a sum of the LDPC information bits and the first LDPC parity bits respectively corresponding to the $3^{rd}$, $5^{th}$, $8^{th}$ and $11^{th}$ columns.

Meanwhile, the parity generator 300 may generate an LDPC parity using IPPC expressions such as the first and second IPPC expressions 1541, 1542.

To that purpose, the receiver 1000 may previously store the IPPC expressions corresponding to the parity check matrix 1510.

Accordingly, the parity generator 300 may calculate the first IPPC expression values by substituting LDPC information word bits recovered by LDPC decoding or error-corrected LDPC information word bits by BCH decoding for the first IPPC expressions. Further, the parity generator 300 may calculate the second IPPC expression values by substituting the LDPC information word bits recovered by LDPC decoding or error-corrected LDPC information bits and first LDPC parity bits by BCH decoding for the second IPPC expressions.

First, when there is no error present in the LDPC information bits and the first LDPC parity recovered by the LDPC decoding, based on the IPPC expressions, the parity generator 300 may generate a second LDPC parity corresponding to the LDPC information bits and the first LDPC parity recovered by LDPC decoding. Here, the second LDPC parity generated by the parity generator 300 is distinguished from the second LDPC parity recovered by the LDPC decoding at the LDPC decoder 230. They may be the same or different from each other.

Specifically, as the second parity submatrix 1514 is a unit matrix, the parity generator 300 may generate the second LDPC parity using the second IPPC expression values.

Herebelow, a method for generating the second LDPC parity based on the second IPPC expression values will be explained in greater detail, with reference to FIG. 16.

FIG. 16 is a diagram provided to explain a method for generating the second LDPC parity based on the second IPPC expression values, according to an exemplary embodiment.

In describing an exemplary embodiment with reference to FIG. 16, it is assumed here that the parity check matrix and the second IPPC expressions are defined as illustrated in FIG. 15A, for convenience of explanation.

As a second parity submatrix 1614 is a unit matrix, the second IPPC expression values are the second LDPC parity formed of second LDPC parities.

For example, referring to FIG. 16, as a parity check equation 1631 generated by multiplying a $0^{th}$ row of a second parity check matrix 1610 by LDPC codeword bits 1620 is $i_2 \oplus i_5 \oplus p_0 \oplus p_3 \oplus p_0' = 0$, an LDPC parity bit $p_0'$ may be calculated to be $p_0' = i_2 \oplus i_5 \oplus p_0 \oplus p_3$. Here, as $i_2 \oplus i_2 \oplus p_0 \oplus p_3$ is a second IPPC expression 1641 that is generated by multiplying a $0^{th}$ row of a second information word submatrix 1612 by LDPC information word bits and first LDPC parity bits of the LDPC codeword 1620, the parity generator 300 may generate the LDPC parity bit $p_0'$ having a second IPPC expression value $s_0 = i_2 \oplus i_5 \oplus p_0 \oplus p_3$. Accordingly, $p_0' = s_0$ (1651).

Further, as a parity check equation 1632 generated by multiplying a $1^{st}$ row of the second parity check matrix 1610 by the LDPC codeword bits 1620 is $i_1 \oplus i_2 \oplus p_0 \oplus p_4 \oplus p_1' = 0$, an LDPC parity bit $p_1'$ may be calculated to be $p_1' = i_1 \oplus i_2 \oplus p_0 \oplus p_4$. Here, as $i_1 \oplus i_2 \oplus p_0 \oplus p_4$ is a second IPPC expression 1642 that is generated by multiplying a $1^{st}$ row of the second information word submatrix 1612 by the LDPC information word bits and the first LDPC parity bits, the parity generator 300 may generate the LDPC parity bit $p_1'$ having a second IPPC expression value $s_1=i_1 \oplus i_2 \oplus p_0 \oplus_4$. Accordingly, $p_1'=s_1$ (1652).

Further, as a parity check equation 1633 generated by multiplying a $2^{nd}$ row of the second parity check matrix 1610 by the LDPC codeword bits 1620 is $i_1 \oplus i_5 \oplus p_3 \oplus p_4 \oplus p_2'=0$, an LDPC parity bit $p_2'$ may be calculated to be $p_2'=i_1 \oplus i_5 \oplus p_3 \oplus p_4$. Here, as $i_1 \oplus i_5 \oplus p_3 \oplus p_4$ is a second IPPC expression 1643 that is generated by multiplying a $2^{nd}$ row of the second information word submatrix 1612 by the LDPC information bits and the first LDPC parity bits, the parity generator 300 may generate the LDPC parity bit $p_2'$ having a second IPPC expression value $s_2=i_1 \oplus i_5 \oplus p_3 \oplus p_4$. Accordingly, $p_2'=s_2$ (1653).

Further, as a parity check equation 1634 generated by multiplying a $3^{rd}$ row of the second parity check matrix 1610 by the LDPC codeword bits 1620 is $i_0 \oplus i_3 \oplus p_1 \oplus p_3 \oplus p_3'=0$, an LDPC parity bit $p_3'$ may be calculated to be $p_3'=i_0 \oplus i_3 \oplus p_1 \oplus p_3$. Here, as $i_0 \oplus i_3 \oplus p_1 \oplus p_3$ is a second IPPC expression 1644 that is generated by multiplying a $3^{rd}$ row of the second information word submatrix 1612 by the LDPC information bits and the first LDPC parity bits, the parity generator 300 may generate the LDPC parity bit $p_3'$ having a second IPPC expressions value $s_3=i_0 \oplus i_3 \oplus p_1 \oplus p_3$. Accordingly, $p_3'=s_3$ (1654).

Further, as a parity check equation 1635 generated by multiplying a $4^{th}$ row of the second parity check matrix 1610 by the LDPC codeword bits 1620 is $i_0 \oplus i_4 \oplus p_2 \oplus p_3 \oplus p_4'=0$, an LDPC parity bit $p_4'$ may be calculated to be $p_4'=i_0 \oplus i_4 \oplus p_2 \oplus p_3$. Here, as $i_0 \oplus i_4 \oplus p_2 \oplus p_3$ is a second IPPC expression 1645 that is generated by multiplying a $4^{th}$ row of the second information word submatrix 1612 by the LDPC information bits and the first LDPC parity bits, the parity generator 300 may generate the LDPC parity bit $p_4'$ having a second IPPC expressions value $s_4=i_0 \oplus i_4 \oplus p_2 \oplus p_3$. Accordingly, $p_4'=s_4$ (1655).

Further, as a parity check equation 1636 generated by multiplying a $5^{th}$ row of the second parity check matrix 1610 by the LDPC codeword bits 1620 is $i_3 \oplus i_4 \oplus p_2 \oplus p_5 \oplus p_5'=0$, an LDPC parity bit $p_5'$ may be calculated to be $p_5'=i_3 \oplus i_4 \oplus p_2 \oplus p_5$. Here, as $i_3 \oplus i_4 \oplus p_2 \oplus p_5$ is a second IPPC expression 1646 that is generated by multiplying a $5^{th}$ row of the second information word submatrix 1612 by the LDPC information bits and the first LDPC parity bits, the parity generator 300 may generate the LDPC parity bit $p_5'$ having a second IPPC expressions value $s_5=i_3 \oplus i_4 \oplus p_2 \oplus p_5$. Accordingly, $p_5'=s_5$ (1656).

In the manner described above, as the second parity submatrix 1614 is a unit matrix, the parity generator 300 may generate the second LDPC parity bits using the second IPPC expression values.

Meanwhile, in the exemplary embodiment described above, the second LDPC parity corresponding to the LDPC information word and the first LDPC parity recovered by the LDPC decoding are generated based on the IPPC expressions, when there is no error present in the LDPC information word and the first LDPC parity recovered by LDPC decoding. However, the above embodiment is only one of exemplary embodiments.

Accordingly, the parity generator 300 may generate a first LDPC parity corresponding to the LDPC information word recovered by the LDPC decoding, based on the first IPPC expressions, and generate a second LDPC parity corresponding to the LDPC information word and the first LDPC parity recovered by the LDPC decoding, based on the second IPPC expressions.

Meanwhile, the method described above with reference to FIG. 16 may apply to a method for generating the second LDPC parity by substituting the first LDPC parity generated based on the first IPPC expressions and the LDPC information word recovered by LDPC decoding for the second IPPC expressions.

Hereinbelow, a method for generating the first LDPC parity bits based on the first IPPC expressions value will be explained with reference to FIG. 17.

FIG. 17 is a diagram provided to explain a method for generating a first LDPC parity using the first IPPC expressions, according to an exemplary embodiment.

In FIG. 17, it is assumed that a parity check matrix and first IPPC expressions are defined as illustrated in FIG. 15A, for convenience of explanation.

As a first parity submatrix 1713 is a dual diagonal matrix, the parity generator 300 may generate a first LDPC parity by sequentially accumulating first LDPC parity bits to first IPPC expression values.

Here, as the first parity submatrix 1713 of a parity check matrix 1710 has a dual diagonal matrix structure like the parity submatrix 12 of the parity check matrix 10 illustrated in FIG. 5, the method described above with reference to FIG. 10 may apply during generating of the first LDPC parity bits based on the first IPPC expression values.

That is, as the first parity submatrix 1713 is a dual diagonal matrix, the first LDPC parity bit may be calculated by adding a first IPPC expression value with a previously-calculated first LDPC parity bit.

For example, in FIG. 17, as a parity check equation 1731 generated by multiplying a $0^{th}$ row of the first parity check matrix 1710 by LDPC codeword bits 1720 is $i_2 \oplus i_5 \oplus p_0=0$, an LDPC parity bit $p_0$ may be calculated to be $p_0=i_2 \oplus i_5$. Here, as $i_2 \oplus i_5$ is a first IPPC expression 1741 generated by multiplying the $0^{th}$ row of a first information word submatrix 1711 by LDPC information bits, the parity generator 300 may generate the LDPC parity bit $p_0$ having a first IPPC expression value $t_0=i_2 \oplus i_5$. Accordingly, $p_0=t_0$ (1751).

Further, as a parity check equation 1732 generated by multiplying a $1^{st}$ row of the first parity check matrix 1710 by the LDPC codeword bits 1720 is $i_1 \oplus i_4 \oplus p_0 \oplus p_1=0$, an LDPC parity bit $p_1$ may be calculated to be $p_1=i_1 \oplus i_4 \oplus p_0$. Here, as $i_1 \oplus i_4$ is a first IPPC expression 1742 generated by multiplying the $1^{st}$ row of the first information word submatrix 1711 by the LDPC information bits, the parity generator 300 may generate the LDPC parity bit $p_1$ by adding the LDPC parity bit $p_0$ to a first IPPC expression value $t_1=i_1 \oplus i_4$. Accordingly, $p_1=t_1 \oplus p_0$ (1752).

Further, as a parity check equation 1733 generated by multiplying a $2^{nd}$ row of the first parity check matrix 1710 by the LDPC codeword bits 1720 is $i_0 \oplus i_2 \oplus p_1 \oplus p_2=0$, an LDPC parity bit $p_2$ may be calculated to be $p_2=i_0 \oplus i_2 \oplus p_1$. Here, as $i_0 \oplus i_2$ is a first IPPC expression 1743 generated by multiplying the $2^{nd}$ row of the first information word submatrix 1711 by the LDPC information bits, the parity generator 300 may generate the LDPC parity bit $p_2$ by adding the LDPC parity bit $p_1$ to a first IPPC expression value $t_2=i_0 \oplus i_2$. Accordingly, $p_2=t_2 \oplus p_1$ (1753).

Further, as a parity check equation 1734 generated by multiplying a $3^{rd}$ row of the first parity check matrix 1710 by the LDPC codeword bits 1720 is $i_3 \oplus i_4 \oplus p_2 \oplus p_3=0$, an LDPC parity bit $p_3$ may be calculated to be $i_3 \oplus i_4 \oplus p_2 \oplus p_3=0$. Here, as $i_3 \oplus i_4$ is a first IPPC expression 1742 generated by multiplying the $3^{rd}$ row of the first information word submatrix 1711 by the LDPC information bits, the parity generator 300 may generate the LDPC parity bit $p_3$ by adding the LDPC parity bit $p_2$ to a first IPPC expression value $t_3=i_3 \oplus i_4$. Accordingly, $p_3=t_3 \oplus p_2$ (1754).

Further, as a parity check equation 1735 generated by multiplying a $4^{th}$ row of the first parity check matrix 1710 by the LDPC codeword bits 1720 is $i_0 \oplus i_5 \oplus p_3 \oplus p_4=0$, an LDPC parity bit $p_4$ may be calculated to be $p_4=i_0 \oplus i_5 \oplus p_3$. Here, as $i_0 \oplus i_5$ is a first IPPC expression 1735 generated by multiplying the $4^{th}$ row of the first information word submatrix 1711 by the LDPC information bits, the parity generator 300 may generate the LDPC parity bit $p_4$ by adding the LDPC parity bit $p_3$ to a first IPPC expression value $t_4=i_0 \oplus i_5$. Accordingly, $p_4=t_4 \oplus p_3$ (1755).

Further, as a parity check equation 1736 generated by multiplying a $5^{th}$ row of the first parity check matrix 1710 by the LDPC codeword bits 1720 is $i_1 \oplus i_3 \oplus p_4 \oplus p_5=0$, an LDPC parity bit $p_5$ may be calculated to be $p_5=i_1 \oplus i_3 \oplus p_4$. Here, as $i_1 \oplus i_3$ is a first IPPC expression 1746 generated by multiplying the $5^{th}$ row of the first information word submatrix 1711 by the LDPC information bits, the parity generator 300 may generate the LDPC parity bit $p_5$ by adding the LDPC parity bit $p_4$ to a first IPPC expression value $t_5=i_1 \oplus i_3$. Accordingly, $p_5=t_5 \oplus p_4$ (1756).

That is, as the first parity submatrix 1713 is a dual diagonal matrix, the parity generator 300 may generate the first LDPC parity by accumulating the first LDPC parity bits to the first IPPC expression values.

As a result, the parity generator 300 may generate the first LDPC parity by using the first IPPC expression values.

Meanwhile, when there is an error present in an LDPC information word recovered by LDPC decoding, the parity generator 300 may determine a location of an error-generated bit in the LDPC information word recovered by LDPC decoding based on a result of BCH decoding, corrects the error by flipping the first IPPC expression value corresponding to the error-generated bit, and generate first LDPC parity bits corresponding to the error-corrected LDPC information bits based on the flipped first IPPC expression value.

In this example, based on information on the location of the error-generated LDPC information bit provided from the first BCH decoder 240, the parity generator 300 may determine the location of the error-generated bit in the LDPC information word.

Meanwhile, considering that the first IPPC expressions are represented as sums of the LDPC information bits, presence of an error in the LDPC information bits recovered by LDPC decoding can be interpreted as indicating presence of an error in the first IPPC expressions. Accordingly, when an LDPC information word includes an error, then it is not possible to generate an accurate first LDPC parity without performing a separate correction of the first IPPC expressions.

Accordingly, the parity generator 300 may generate first LDPC parity bits by flipping a first IPPC expression value associated with the error-generated bit in the LDPC information word, and sequentially accumulating the first LDPC parity bits to the flipped first IPPC expression value.

Here, considering that the first parity submatrix 1713 of the first parity check matrix 1710 has a dual diagonal matrix like the parity submatrix 12 of the parity check matrix 10 as shown in FIG. 5, the method described above with reference to FIG. 11 may apply when a first LDPC parity bit is generated by flipping a first IPPC expression value corresponding to an error-generated bit, which will be explained in greater detail below with reference to FIG. 18.

Figure 18:
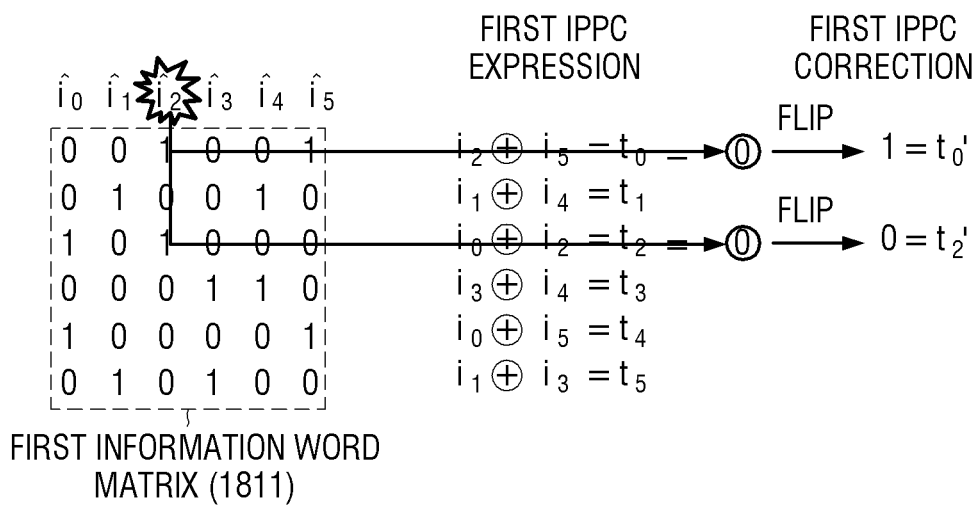

FIG. 18 is a diagram provided to explain a method for generating a first LDPC parity using first IPPC expressions, according to an exemplary embodiment.

In FIG. 18, it is assumed that a parity check matrix and first IPPC expressions are defined as illustrated in FIG. 15 for convenience of explanation.

When an LDPC information word contains an error, the parity generator 300 may flip a first IPPC expression value associated with an error-generated LDPC information bit.

Here, a first IPPC expression associated with the error-generated LDPC information bit may indicate a first IPPC expression which is generated based on the error-generated LDPC information bit.

That is, since the first IPPC expressions are generated by multiplication of rows of the first information word submatrix by LDPC information bits, the first IPPC expressions may be expressed as a sum of the LDPC information bits which are multiplied by columns at which 1 is present in the rows of the first information word submatrix.

Here, the first IPPC expressions corresponding to rows at which 1 is present in the columns multiplied by the error-generated LDPC information bit, may be the first IPPC expressions associated with the error-generated LDPC information bit.

For example, it is assumed herein that an error is present in an LDPC information bit $i_2$ as illustrated in FIG. 18.

In this example, since the LDPC information bit $i_2$ is multiplied by a $2^{nd}$ column of a first information word submatrix 1811 during LDPC encoding, first IPPC expressions corresponding to rows at which 1 is present in the $2^{nd}$ column, i.e., a first IPPC expression $i_2 \oplus i_5$ corresponding to a $0^{th}$ row and a first IPPC expression $i_0 \oplus i_2$ corresponding to a $2^{nd}$ row may be the first IPPC expressions associated with the error-generated LDPC information bit $i_2$. That is, the first IPPC expressions including the LDPC information bit $i_2$ may be the first IPPC expressions associated with the error-generated LDPC information bit $i_2$.

In this example, the parity generator 300 generates the first LDPC parity bits by flipping the first IPPC expression values associated with the error-generated LDPC information bit, and sequentially adding the first LDPC parity bits to the flipped first IPPC expressions values.

For example, as illustrated in FIG. 18, when the first IPPC expression value $t_0=i_2 \oplus i_5$ corresponding to the $0^{th}$ row of the first information word submatrix 1811 is 0, the parity generator 300 may flip the value to correct the first IPPC expressions value $t_0$ corresponding to the $0^{th}$ row to 1 (=$t_0$').

Further, when the first IPPC expressions value $t_2=i_0 \oplus i_2$ corresponding to the $2^{nd}$ row of the first information word submatrix 1811 is 1, the parity generator 300 may flip the value to correct the first IPPC expressions value $t_2$ corresponding to the $2^{nd}$ row to 0 (=$t_2$').

The parity generator 300 may then generate the first LDPC parity bits based on the corrected first IPPC expressions values.

In this example, as the first parity submatrix is a dual diagonal matrix, the parity generator 300 may generate the first LDPC parity bits by adding a previously-calculated first LDPC parity bit to a first IPPC expression value. Here, when the first IPPC expression value is corrected because of an error generated in an LDPC information bit, the corrected first IPPC expression value may be used.

Meanwhile, a method of generating the first LDPC parity bits is identical to that illustrated in FIG. 17 except for the use of the corrected first IPPC expression values.

For example, referring to FIG. 18, as the first IPPC expression value corresponding to the $0^{th}$ row of the first information word submatrix 1811 is corrected to $t_0$', and the first IPPC expression value corresponding to the $2^{nd}$ row of the first information word submatrix 1811 is corrected to $t_2$', the parity generator 300 may generate first LDPC parity bits 1826 ($p_0$ (=$t_0$')) (1821), $p_1$ (=$t_1 \oplus p_0$) (1822), $p_2$ (=$t_2' \oplus p_1$) (1823), $p_3$ (=$t_3 \oplus p_2$) (1824), $p_4$ (=$t_4 \oplus p_3$) (1825), and $p_5$ (=$t_5 \oplus p_4$)).

Meanwhile, the parity generator 300 may determine a location of an error-generated bit in the first LDPC parity recovered by LDPC decoding, by comparing the first LDPC parity generated based on the flipped first IPPC expression values with the first LDPC parity recovered by LDPC decoding, correct the error by flipping the second IPPC expression value corresponding to the error-generated bit, and generate a second LDPC parity corresponding to error-corrected LDPC information word and first LDPC parity based on the flipped second IPPC expressions value.

That is, as the second IPPC expressions are represented as sums of the LDPC information bits and the first LDPC parity bits, when there is an error present in at least one of the LDPC information word and the first LDPC parity recovered by LDPC decoding, it may be interpreted as indicating presence of an error in the second IPPC expressions too. Accordingly, when an error is present in at least one of the LDPC information word and the first LDPC parity, it is not possible to generate an accurate second LDPC parity without performing a separate correction of the second IPPC expressions.

Meanwhile, whether an error is present in an LDPC information word, and a location of an error-generated LDPC information bit may be determined based on a result of BCH decoding.

However, since BCH decoding is performed on the LDPC information word, the presence of an error in the first LDPC parity recovered by LDPC decoding, and a location of an error-generated first LDPC parity bit may not be determined by the BCH decoding.

Accordingly, by comparing the first LDPC parity generated based on the flipped first IPPC expression values with the first LDPC parity recovered by LDPC decoding, the parity generator 300 determines whether an error is present in the first LDPC parity recovered by LDPC decoding, and a location of an error-generated first LDPC parity bit.

That is, the parity generator 300 may determine whether the first LDPC parity generated based on the flipped first IPPC expression values matches the first LDPC parity recovered by LDPC decoding, and if not, may determine that an error is present in the first LDPC parity recovered by LDPC decoding, and determine that an error is present in one of the first LDPC parity bits having a different value.

For example, it is assumed here that the first LDPC parity bits such as ($p_0$, $p_1$, $p_2$, $p_3$, $p_4$, $p_5$)=(1, 0, 0, 1, 0, 1) are generated based on the flipped first IPPC expression values, and that the first LDPC parity bits such as ($p_0$, $p_1$, $p_2$, $p_3$, $p_4$, $p_5$)=(1, 0, 0, 1, 0, 0) are recovered by the LDPC decoding.

In this example, considering that the first LDPC parity bits generated based on the flipped first IPPC expression values do not match the first LDPC parity bits recovered by the LDPC decoding, the parity generator 300 may determine that an error is present in the first LDPC parity bits recovered by the LDPC decoding, and determine that an error is present in the first LDPC parity bit $p_5$ having a different value.

The parity generator 300 may then flip the second IPPC expression value corresponding to the LDPC information bit and the first LDPC parity bit at which an error is present, and generate second LDPC parity bits having the flipped second IPPC expression values, which will be described in further detail below with reference to FIG. 19.

Figure 19:
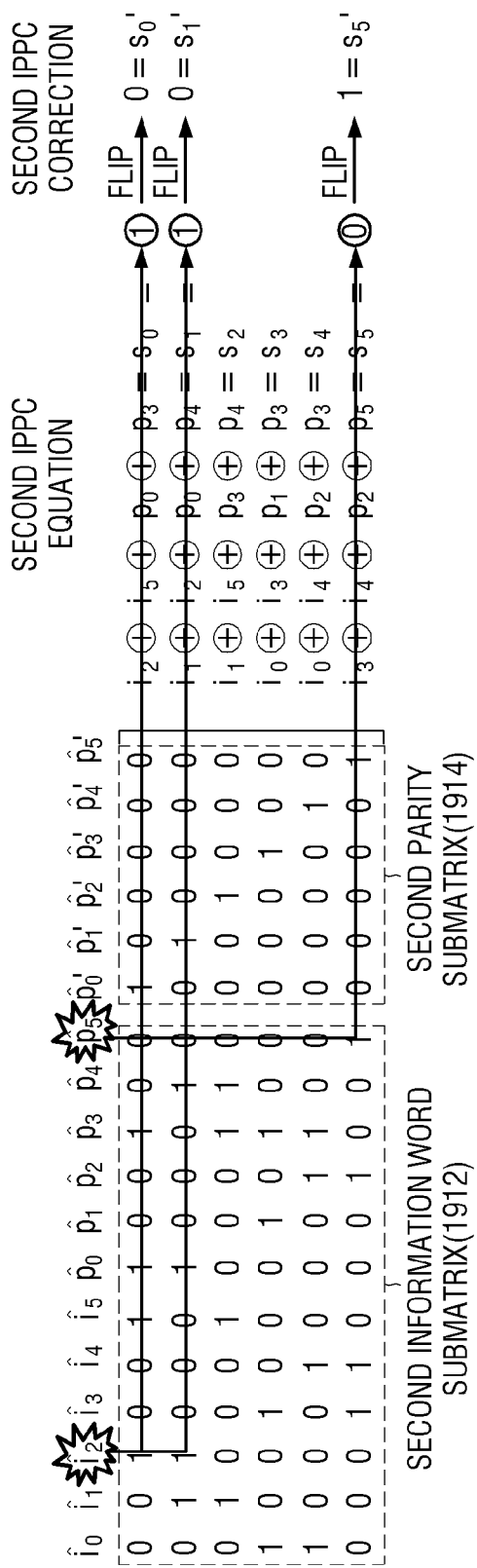

FIG. 19 is a diagram provided to explain a method of generating a second LDPC parity using second IPPC expressions, according to an exemplary embodiment.

In FIG. 19, it is assumed that a parity check matrix and second IPPC expressions are defined as illustrated in FIG. 15 for convenience of explanation.

When an error is present in an LDPC information word and a first LDPC parity, the parity generator 300 may flip a second IPPC expression value associated with the error-generated LDPC information bit and the first LDPC parity bit.

Herein, the second IPPC expression associated with the error-generated LDPC information bit and the first LDPC parity bit may represent a second IPPC expression which is generated based on the error-generated LDPC information bit and first LDPC parity bit.

That is, since the second IPPC expressions are generated by multiplying rows of a second information word submatrix 1912 by the LDPC information bits and the first LDPC parity bits recovered by LDPC decoding, the second IPPC expressions may be expressed as sums of the LDPC information bits and the first LDPC parity bits multiplied by columns at which 1 is present in the rows of the second information word submatrix 1912.

Herein, the second IPPC expressions corresponding to the rows at which 1 is present, which are multiplied by the error-generated LDPC information bits and the first LDPC parity bits, may be the IPPC expressions associated with the error-generated LDPC information bits and the first LDPC parity bits.

For example, it is assumed herein that an error is present in an LDPC information bit $i_2$ and a first LDPC parity bit $p_5$, as illustrated in FIG. 19.

In this example, since the LDPC information bit $i_2$ is multiplied by a $2^{nd}$ column of the second information word submatrix 1912 during LDPC encoding, a second IPPC expression corresponding to a row at which 1 is present in the $2^{nd}$ column of the second information word submatrix 1912, i.e., the second IPPC expression $i_2 \oplus i_5 \oplus p_0 \oplus p_3$ corresponding to a $0^{th}$ row and the second IPPC expression $i_1 \oplus i_2 \oplus p_0 \oplus p_4$ corresponding to a $1^{st}$ row may be the second IPPC expressions that are associated with the error-generated LDPC information bit $i_2$. That is, the second IPPC expressions that include the LDPC information bit $i_2$ may be the second IPPC expressions that are associated with the error-generated LDPC information bit $i_2$.

Further, since the first LDPC parity bit $p_5$ is multiplied by an $11^{th}$ column of the second information word submatrix 1912 during the LDPC encoding, a second IPPC expression corresponding to a row at which 1 is present in an $11^{th}$ column of the second information word submatrix 1912, i.e., the second IPPC expression $i_3 \oplus i_4 \oplus p_2 \oplus p_5$ corresponding to a $5^{th}$ row may be the second IPPC expression that is associated with the error-generated first LDPC parity bit $p_5$. That is, the second IPPC expression including the first LDPC parity bit $p_5$ may be the second IPPC expression that is associated with the error-generated first LDPC parity bit $p_5$.

In this example, the parity generator 300 may flip the second IPPC expression values associated with the error-generated LDPC information bits and first LDPC parity bit, and generate second LDPC parity bits having the flipped second IPPC expression values.

For example, referring to FIG. 19, when the second IPPC expression value $s_0 = i_2 \oplus i_5 \oplus p_0 \oplus p_3$ corresponding to the $0^{th}$ row of the second information word submatrix 1912 is 1, the parity generator 300 may flip the value to correct the second IPPC expression value $s_0$ corresponding to the $0^{th}$ row to 0 (=$s_0$').

Further, when the second IPPC expression value $s_1 = i_1 \oplus i_2 \oplus p_0 \oplus p_4$ corresponding to the $1^{st}$ row of the second information word submatrix 1912 is 1, the parity generator 300 may flip the value to correct the second IPPC expression value $s_1$ corresponding to the $1^{st}$ row to 0 (=$s_1$').

Further, when the second IPPC expression value $s_5 = i_3 \oplus i_4 \oplus p_2 \oplus p_5$ corresponding to the $5^{th}$ row of the second information word submatrix 1912 is 0, the parity generator 300 may flip the value to correct the second IPPC expression value $s_5$ corresponding to the $5^{th}$ row to 1 (=$s_5$').

The parity generator 300 may then generate the second LDPC parity based on the corrected second IPPC expression values.

In this example, as a second parity submatrix 1914 is a unit matrix, the parity generator 300 may generate a second LDPC parity bit having a second IPPC expression value. Here, when a second IPPC expression value is corrected because of an error generated in the LDPC information bit and the first LDPC parity bit, the corrected second IPPC expression value may be used.

Meanwhile, the method for generating the second LDPC parity bit is identical to that illustrated in FIG. 16 except for a use of the corrected second IPPC expressions value.

For example, referring to FIG. 19, as the second IPPC expression value corresponding to the $0^{th}$ row of the second information word submatrix 1912 is corrected to $s_0$', the second IPPC expression value corresponding to the $1^{st}$ row of the second information word submatrix 1912 is corrected to $s_1$', and the second IPPC expression value corresponding to the $5^{th}$ row of the second information word submatrix 1912 is corrected to $s_5$', the parity generator 300 may generate the second LDPC parity bits 1926 ($p_0$'(=$s_0$') (1921), $p_1$'(=$s_1$') (1922), $p_2$'(=$s_2$) (1923), $p_3$'(=$s_3$) (1924), $p_4$'(=$s_4$) (1925), and $p_5$'(=$s_5$')).

Meanwhile, as described above, a method may be implemented to generate a second LDPC parity by flipping the second IPPC expression values, when an error is present in an LDPC information word and a first LDPC parity, but this is only one of exemplary embodiments.

Accordingly, when an error is present in the LDPC information word alone, it is possible to generate the second LDPC parity by flipping the second IPPC expression value corresponding to the error-generated LDPC information bit, or when the error is present in the first LDPC parity alone, then it is possible to generate the second LDPC parity by flipping the second IPPC expression value corresponding to the error-generated first LDPC parity bit.

As described above, it is possible to reduce complexity compared to the process of generating an LDPC parity through $H \cdot C^T = 0$, as the IPPC expression values are previously stored and used when generating the LDPC parity.

Figure 20:
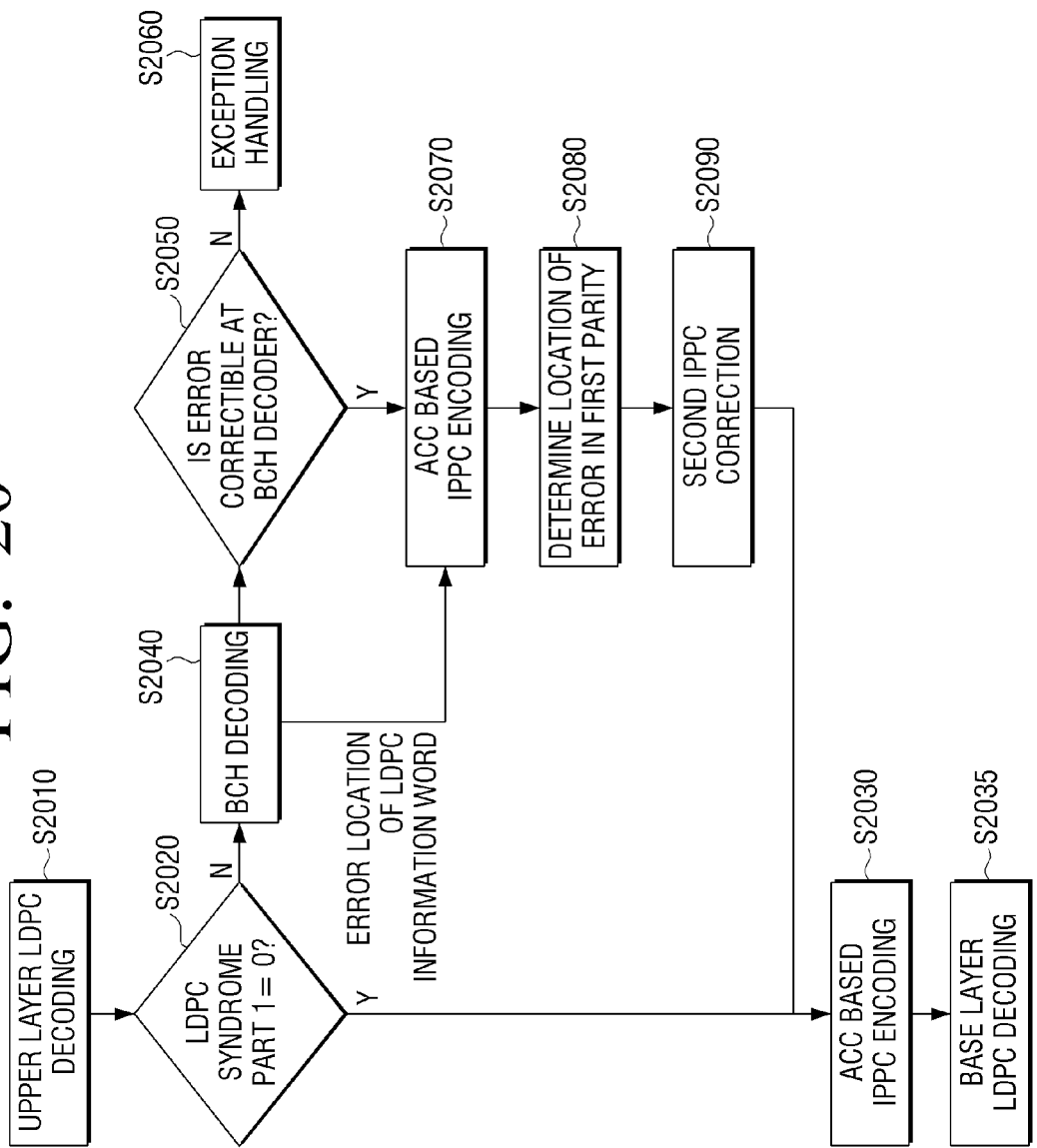

FIG. 20 is a flowchart provided to explain a method for generating an LDPC parity according to an exemplary embodiment.

Referring to FIG. 20, at S2010, upper layer LDPC decoding is performed on an input signal such as a superposition coding signal to generate an upper layer signal. At S2020, it is determined whether an LDPC syndrome value of a first parity check matrix is 0 based on a result of the upper layer LDPC decoding performed at S2010. Here, the first parity check matrix refers to the matrices A and B forming a parity check matrix such as one illustrated in FIG. 6. That is, the upper layer LDPC decoding is performed on the superposition coding signal, and then, it is determined whether an error is present in an LDPC information word and in a first LDPC parity recovered by the upper layer LDPC decoding.

At S2020-Y, when it is determined that the LDPC syndrome value of the first parity check matrix is 0, at S2030, first and second LDPC parities are generated by performing ACC based IPPC encoding.

In this example, the second LDPC parity corresponding to the LDPC information word and the first LDPC parity recovered by the upper layer LDPC decoding may be generated by using second IPPC expressions. Note that the first LDPC parity and the second LDPC parity corresponding to the LDPC information word recovered by the upper layer LDPC decoding may be generated by using first IPPC expressions and the second IPPC expressions, respectively. Since the first IPPC expressions and the second IPPC expressions are described earlier, detailed descriptions thereof will be omitted herebelow for brevity.

At S2035, base layer LDPC decoding is then performed based on the LDPC information word, the first LDPC parity and the second LDPC parity, to generate a base layer signal.

Meanwhile, at S2020-N, when it is determined that the LDPC syndrome value of the first parity check matrix is not 0, at S2040, BCH decoding is performed on the LDPC information word recovered by the LDPC decoding and a location of an error-generated LDPC information bit is determined.

At S2050, it is determined whether it is possible to correct the error generated in the LDPC information bits by the BCH decoding.

At S2050-N, when error correction is not possible, at S2060, the upper layer signal is discarded by exception handling.

Meanwhile, at S2050-Y, when it is determined that the error correction is possible, at S2070, the error is corrected and ACC based IPP encoding is performed. Specifically, a first IPPC expression value associated with an error-generated LDPC information bit is corrected, and the ACC based IPPC encoding is performed based on the corrected first IPPC expression value, thereby to generate a first LDPC parity.

After that, at S2080, an error location of the first LDPC parity recovered by the upper layer LDPC decoding is determined. Specifically, by comparing the first LDPC parity generated based on the corrected first IPPC expression value with the first LDPC parity recovered by the upper layer LDPC decoding, presence of an error in the first LDPC parity recovered by the upper layer LDPC decoding, and a location of an error-generated first LDPC parity bit, are determined.

At S2090, the second IPPC expressions are then corrected, and a second LDPC parity is generated using the ACC based IPPC encoding by using the corrected second IPPC expressions.

Specifically, the second IPPC expression value associated with the error-generated LDPC information bit and first LDPC parity bit is corrected, and a second LDPC parity is generated by performing the ACC based IPPC encoding based on the corrected second IPPC expression value.

At S2035, the base layer LDPC decoding is then performed based on the LDPC information word, the first LDPC parity and the second LDPC parity, to generate a base layer signal.

Meanwhile, as described above, the first and second LDPC parities may be generated with the ACC based IPPC encoding, but this is only one of exemplary embodiments. Accordingly, the first and second LDPC parities may be generated using methods other than the ACC based IPPC encoding, as will be described below with reference to FIGS. 21 to 23.

Figure 21:
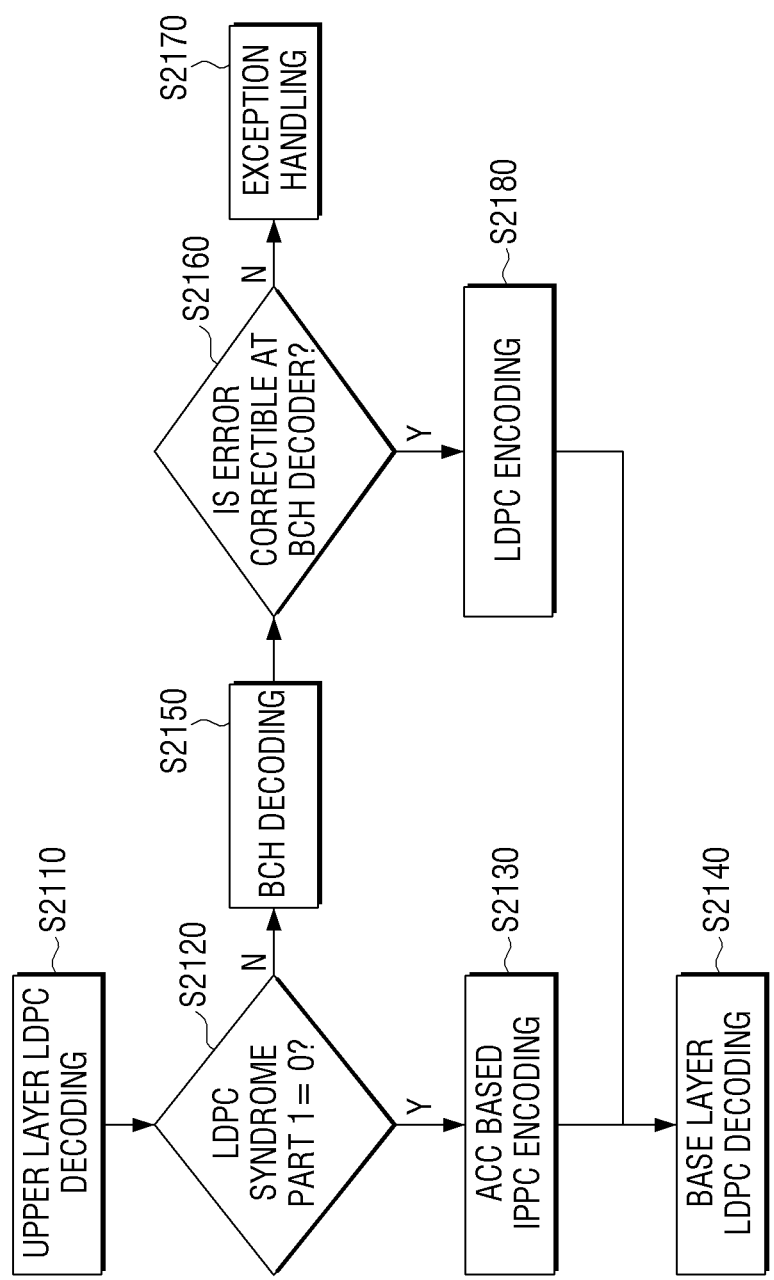

FIG. 21 is a flowchart provided to explain a method for generating an LDPC parity according to another exemplary embodiment.

Referring to FIG. 21, at S2110, upper layer LDPC decoding is performed on an input signal such as a superposition coding signal to generate an upper layer signal. At S2120, it is determined whether an LDPC syndrome value of a first parity check matrix is 0 based on a result of the upper layer LDPC decoding performed at S2110. Here, the first parity check matrix refers to the matrices A and B forming a parity check matrix such as one illustrated in FIG. 6. That is, the LDPC decoding is performed on the superposition coding signal, and then, it is determined whether an error is present in an LDPC information word and in a first LDPC parity recovered by the upper layer LDPC decoding.

At S2120-Y, when it is determined that the LDPC syndrome value of the first parity check matrix is 0, at S2130, first and second LDPC parities are generated by performing ACC based IPPC encoding.

In this example, the second LDPC parity corresponding to the LDPC information word and the first LDPC parity recovered by the upper layer LDPC decoding may be generated by using second IPPC expressions. Note that the first LDPC parity and the second LDPC parity corresponding to the LDPC information word recovered by the upper layer LDPC decoding may be generated by using first IPPC expressions and the second IPPC expressions, respectively.

At S2140, base layer LDPC decoding is then performed based on the LDPC information word, the first LDPC parity and the second LDPC parity, to generate a base layer signal.

Meanwhile, at S2120-N, when it is determined that the LDPC syndrome value of the first parity check matrix is not 0, at S2150, BCH decoding is performed on the LDPC information word recovered by the upper layer LDPC decoding, and at S2160, it is then determined whether it is possible to correct an error generated in LDPC information bits based on a result of the BCH decoding.

At S2160-N, when it is determined that error correction is not possible, at S2170, the upper layer signal is discarded by exception handling.

Meanwhile, at S2160-Y, when it is determined that the error correction is possible, at S2180, the error is corrected and LDPC encoding is performed on the error-corrected LDPC information word. Here, the LDPC encoding refers to generating first and second LDPC parities by an $H \cdot C^T = 0$ process, rather than using an IPPC expression value. That is, the parity generator 300 generates the first LDPC parity and the second LDPC parity that satisfy $H \cdot C^T = 0$, based on the LDPC information bit which is error-corrected by the BCH decoding. In this example, the parity check matrix H may be a parity check matrix, as illustrated in FIG. 6, which is used during LDPC encoding at the transmitter 100.

At S2140, the base layer LDPC decoding is then performed based on the error-corrected LDPC information word, and the first LDPC parity and the second LDPC parity generated through the above LDPC encoding, to generate a base layer signal.

Figure 22:
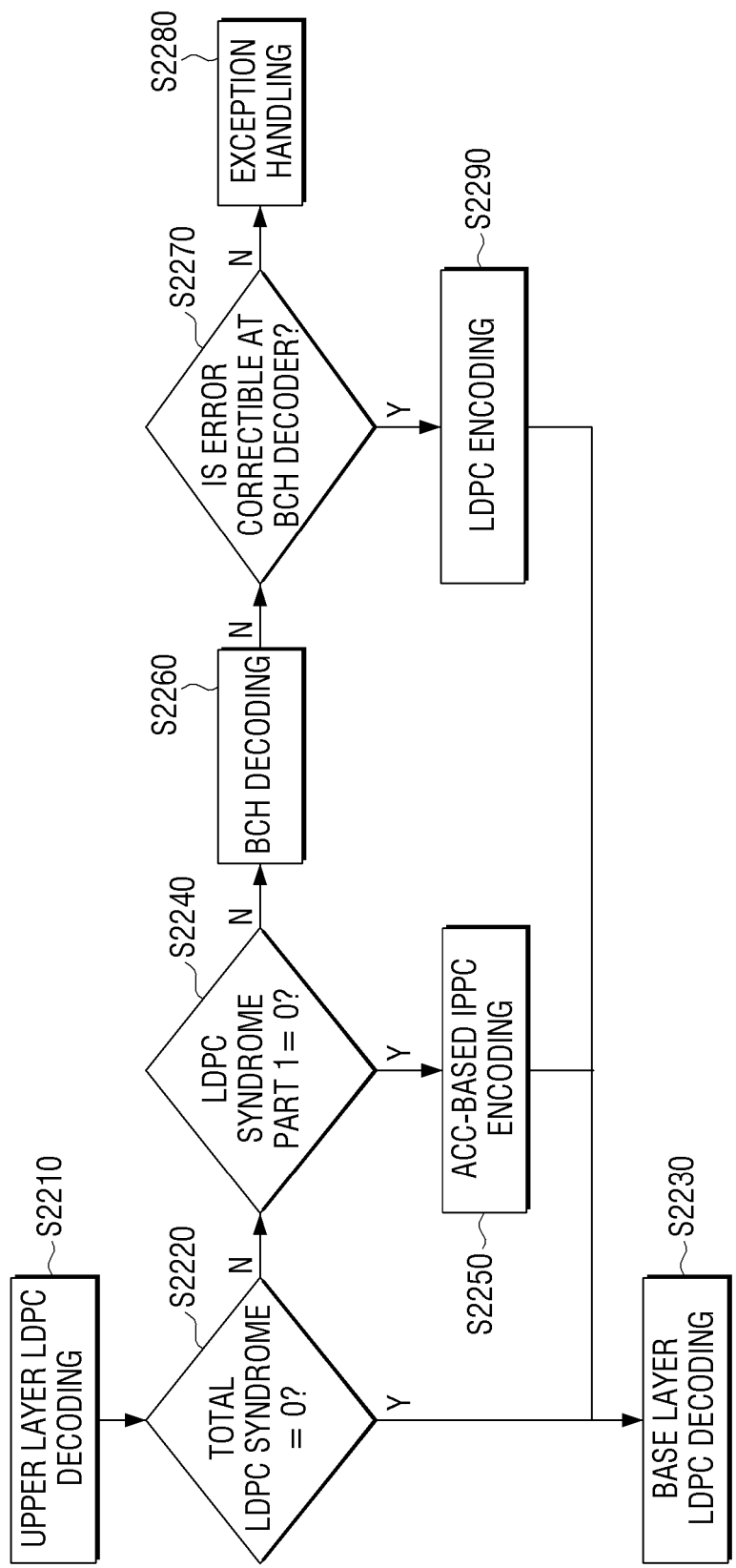

FIG. 22 is a flowchart provided to explain a method for generating an LDPC parity according to another exemplary embodiment.

Referring to FIG. 22, at S2210, upper layer LDPC decoding is performed on an input signal such as a superposition coding signal to generate an upper layer signal. At S2220, it is determined whether an LDPC syndrome value is 0 based on a result of the upper layer LDPC decoding performed at S2210. In one example, determination as to whether the LDPC syndrome value is 0 may be performed on an entire parity check matrix (e.g., a parity check matrix 20 in FIG. 6), rather than a first parity check matrix (e.g., a first parity check matrix formed of matrices A and B in FIG. 6).

At S2220-Y, when it is determined that the LDPC syndrome value is 0, at S2230, base layer LDPC decoding is then performed based on an LDPC information word, a first LDPC parity and a second LDPC parity recovered by the upper layer LDPC decoding, to generate a base layer signal, as an error is not present in the LDPC information word, the first LDPC parity and the second LDPC parity recovered by the upper layer LDPC decoding.

Meanwhile, at S2220-N, when it is determined that the LDPC syndrome value of the entire parity check matrix is not 0, at S2240, it is determined whether an LDPC syndrome value of the first parity check matrix is 0.

At S2240-Y, when it is determined that the LDPC syndrome value of the first parity check matrix is 0, at S2250, ACC based IPPC encoding is performed to generate first and second LDPC parities.

In this example, the second LDPC parity corresponding to LDPC information and the first LDPC parity recovered by the upper layer LDPC decoding may be generated by using second IPPC expressions. Note that the first LDPC parity and the second LDPC parity corresponding to the LDPC information recovered by LDPC decoding may be generated by using the first IPPC expressions and the second IPPC expressions, respectively.

At S2230, base layer LDPC decoding is then performed based on the LDPC information word recovered by the upper layer LDPC decoding, and the first and second LDPC parities generated by using the first and second IPPC expressions, to generate a base layer signal.

Meanwhile, at S2240-N, when it is determined that the LDPC syndrome value of the first parity check matrix is not 0, at S2260, BCH decoding is performed on the LDPC information word recovered by the LDPC decoding, and at S2270, it is then determined whether it is possible to correct an error generated in LDPC information bits using the BCH decoding.

At S2270-N, when it is determined that error correction is not possible, at S2280, the upper layer signal is discarded by exception handling.

Meanwhile, at S2270-Y, when it is determined that the error correction is possible and so the error is corrected, at S2290, LDPC encoding is performed on the error-corrected LDPC information word.

At S2230, base layer LDPC decoding is then performed based on the error-corrected LDPC information word, and first and LDPC parities generated through the LDPC encoding, to generate a base layer signal.

Figure 23:
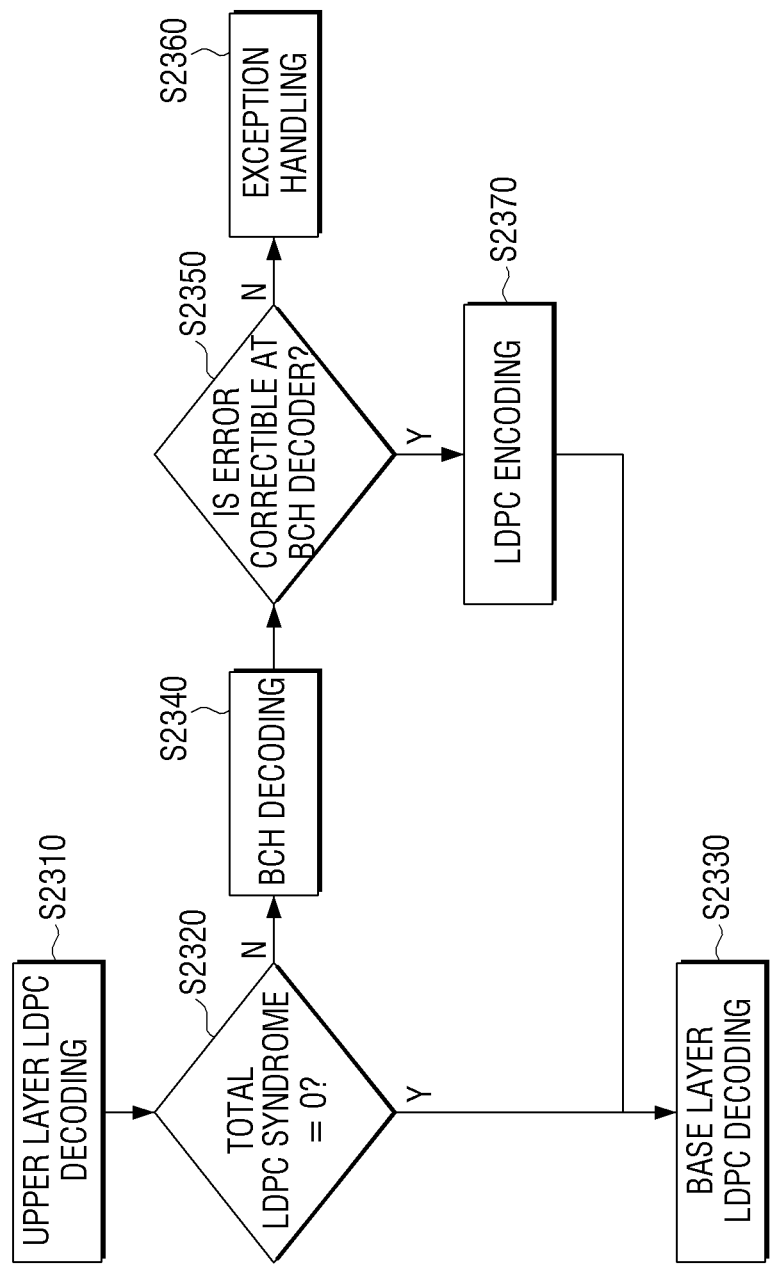

FIG. 23 is a flowchart provided to explain a method for generating an LDPC parity according to another exemplary embodiment.

Referring to FIG. 23, at S2310, when upper layer LDPC decoding is performed on an input signal such as a superposition coding signal to generate an upper layer signal. At S2320, it is determined whether an LDPC syndrome value is 0 based on a result of the upper layer LDPC decoding performed at S2310. In one example, determination as to whether the LDPC syndrome value is 0 may be performed on an entire parity check matrix (e.g., a parity check matrix 20 in FIG. 6), rather than a first parity check matrix (e.g., a first parity check matrix formed of matrices A and B in FIG. 6).

At S2320-Y, when it is determined that the LDPC syndrome value is 0, at S2330, base layer LDPC decoding is then performed based on an LDPC information word, a first LDPC parity and a second LDPC parity recovered by the LDPC decoding, to generate a base layer signal, as an error is not present in the LDPC information word, the first LDPC parity and the second LDPC parity recovered by the LDPC decoding.

Meanwhile, at S2320-N, when it is determined that the LDPC syndrome value is not 0, at S2340, BCH decoding is performed on the LDPC information word recovered by LDPC decoding, and at S2350, it is then determined whether it is possible to correct an error generated in LDPC information bits using the BCH decoding.

At S2350-N, when it is determined that error correction is not possible, at S2360, the upper layer signal is discarded by exception handling.

Meanwhile, at S2350-Y, when it is determined that the error correction is possible and so the error is corrected, at S2370, LDPC encoding is performed on the error-corrected LDPC information word.

At S2330, base layer LDPC decoding is then performed based on the error-corrected LDPC information word, and the first and second LDPC parities generated through the LDPC encoding, to generate a base layer signal.

Meanwhile, as described above, it may be determined whether the LDPC syndrome value is 0, and then, BCH decoding may be performed when the LDPC syndrome value is not 0, but this is only one of exemplary embodiments.

That is, it is possible to perform the BCH decoding on the LDPC information word recovered by LDPC decoding and generate an LDPC parity based on a result of BCH decoding, without separately determining whether the LDPC syndrome value is 0. Further, even when the LDPC syndrome value is 0, it is possible to perform the BCH decoding on the LDPC information word recovered by LDPC decoding and generate first and second LDPC parities based on a result of BCH decoding.

Meanwhile, the embodiments described above are related to a method for generating an LDPC parity based on a result of BCH decoding.

Herebelow, a method of generating an LDPC parity based on a result of CRC decoding will be described in detail with reference to FIGS. 7 and 8B, while redundant descriptions of the elements or operations already described above will be omitted for the sake of brevity.

First, when the first encoder 111 performed LDPC encoding based on a parity check matrix with a structure as illustrated in FIG. 5 (i.e., the parity check matrix 10), the parity generator 300 may generate a parity using methods described below.

When it is determined that an error is present in at least one of an LDPC information word and an LDPC parity recovered by LDPC decoding performed by the first BICM decoder 200, the parity generator 300 may generate an LDPC parity based on a result of CRC decoding.

To this purpose, the first LDPC decoder 230 of the first BICM decoder 200 may determine whether an error is present in the LDPC information word and the LDPC parity recovered by the LDPC decoding, and provide information on presence of the error to the parity generator 300. Accordingly, based on the information provided from the first LDPC decoder 230, the parity generator 300 may determine whether an error is present in the LDPC information word and the LDPC parity recovered by the LDPC decoding.

Meanwhile, the first CRC decoder 250 may perform CRC decoding on an LDPC information word to determine whether an error is present in the LDPC information word, and provide information thereof to the parity generator 300.

Generally, CRC decoding simply determines presence of an error in an CRC codeword by the CRC decoding, and it does not correct the error.

Accordingly, the first CRC decoder 250 may perform the CRC decoding on the LDPC information word to determine whether an error is present in the LDPC information word, i.e., to determine presence of an error, and provide information thereof to the parity generator 300.

Accordingly, the parity generator 300 may determine whether an error is present in the LDPC information word, based on the information provided from the first CRC decoder 250.

In other word, the parity generator 300 may determine whether an error is present in the LDPC information word and the LDPC parity recovered by the LDPC decoding based on the information delivered from the first LDPC decoder 230, and if so, may determine whether an error is present in the LDPC information word based on the information provided from the first CRC decoder 250.

The parity generator 300 may generate an LDPC parity using the IPPC expressions discussed above. To this purpose, the receiver 1000 may previously store information on the IPPC expressions corresponding to a parity check matrix.

Specifically, the parity generator 300 may generate the LDPC parity for the LDPC information word based on the IPPC expressions, when an error is present in the LDPC information word and the LDPC parity recovered by the LDPC decoding, but not present in the LDPC information word based on a result of the CRC decoding.

That is, the parity generator 300 may calculate an IPPC expression value by substituting error-free LDPC information bits for the IPPC expressions, and sequentially accumulating LDPC parity bits for the IPPC expression values.

Meanwhile, reference is made to the IPPC expressions and the method of generating an LDPC parity using the IPPC expressions described above for details, and this will not be repeatedly described below for the sake of brevity.

Herebelow, a method of generating an LDPC parity according to an exemplary embodiment will be explained in greater detail, with reference to FIGS. 24 and 25.

Figure 24:
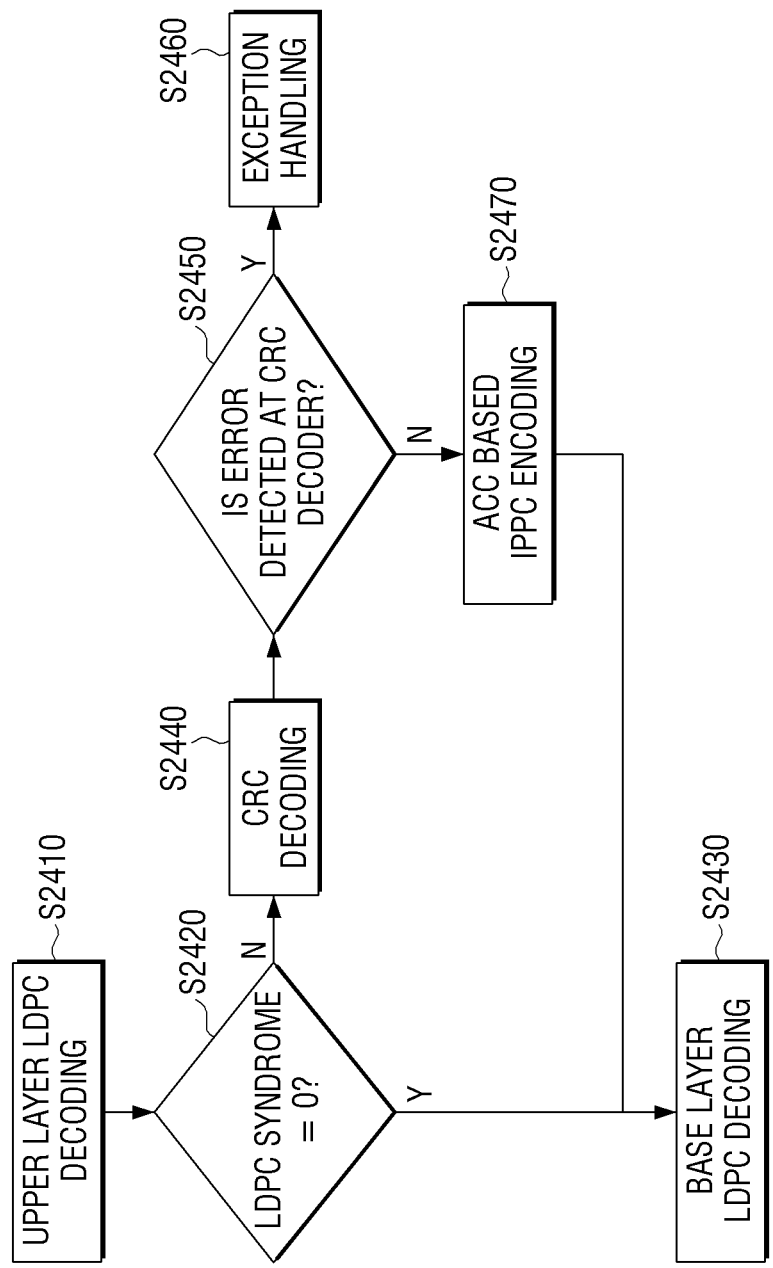

FIG. 24 is a flowchart provided to explain a method for generating an LDPC parity according to an exemplary embodiment.

Referring to FIG. 24, at S2410, when upper layer LDPC decoding is performed on an input signal such as a superposition coding signal to generate an upper layer signal. At S2420, it is determined whether an LDPC syndrome value is 0 based on a result of the upper layer LDPC decoding performed at S2410. That is, the upper layer LDPC decoding is performed on the superposition coding signal, and then, it is determined whether an error is present in at least one of an LDPC information word and an LDPC parity recovered by the upper layer LDPC decoding.

At S2420-Y, when it is determined that the LDPC syndrome value is 0, at S2430, base layer LDPC decoding is then performed based on the LDPC information word and the LDPC parity recovered by the upper layer LDPC decoding, to generate a base layer signal.

Meanwhile, at S2420-N, when it is determined that the LDPC syndrome value is not 0, at S2440, CRC decoding is performed on the LDPC information word recovered by the upper layer LDPC decoding.

At S2450, it is then determined whether an error is present in a CRC codeword by CRC decoding. That is, it is determined whether the error is present in the LDPC information word.

At S2450-Y, when it is determined that an error is present, at S2460, the upper layer signal is discarded by exception handling.

Meanwhile, at S2450-N, when it is determined that an error is not present, an LDPC parity for the LDPC information word is generated by ACC based IPPC encoding. Since the error is not present in the LDPC information word, the LDPC parity for the LDPC information may be generated using an IPPC expressions value.

At S2430, the base layer LDPC decoding is then performed based on the LDPC information word recovered by the upper layer LDPC decoding and the LDPC parity generated through the ACC based IPPC encoding, to generate a base layer signal.

Meanwhile, as described above, the LDPC parity may be generated using the ACC based IPPC encoding, but this is only one of exemplary embodiments. Accordingly, the LDPC parity may be generated by methods other than the ACC based IPPC encoding, as will be described below with reference to FIG. 25.

Figure 25:
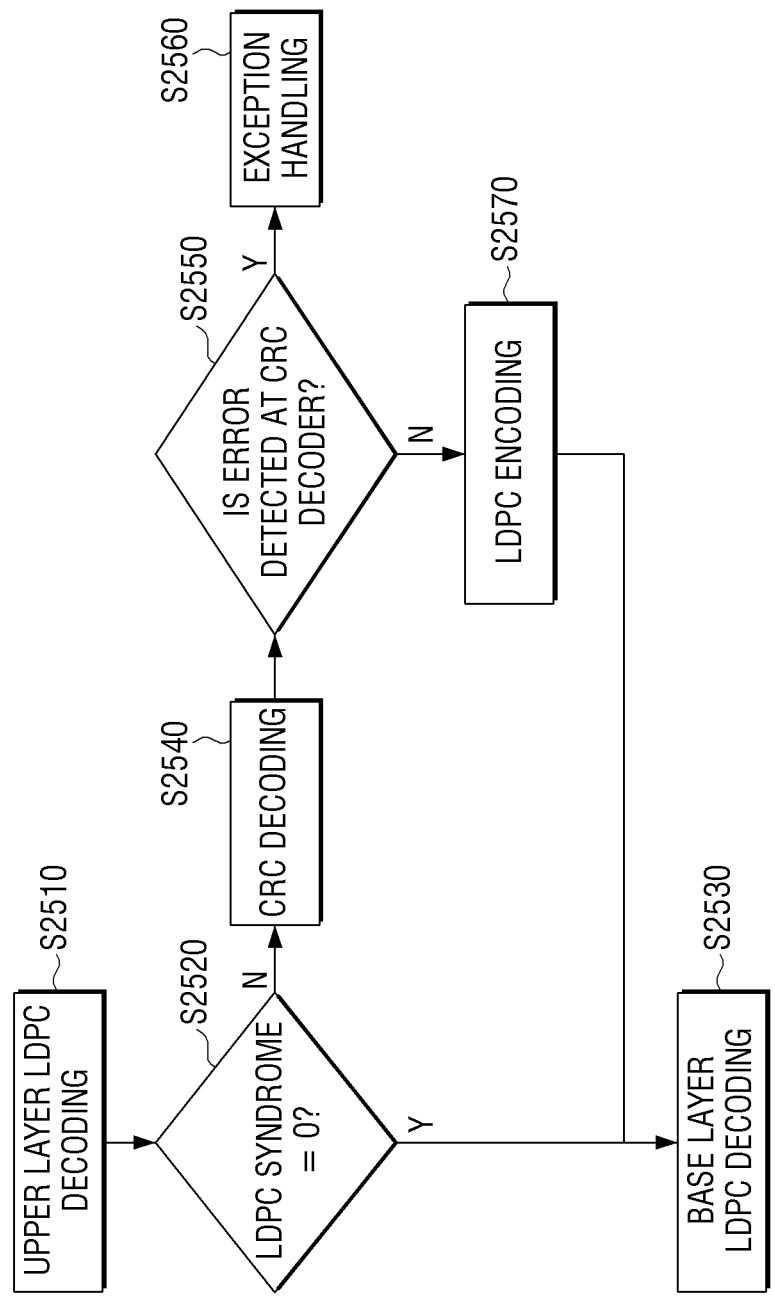

FIG. 25 is a flowchart provided to explain a method of generating an LDPC parity according to another exemplary embodiment.

Referring to FIG. 25, at S2510, when upper layer LDPC decoding is performed on an input signal such as a superposition coding signal to generate an upper layer signal. At S2520, it is determined whether an LDPC syndrome value is 0 based on a result of the upper layer LDPC decoding performed at S2510. That is, the upper layer LDPC decoding is performed on the superposition coding signal, and then, it is determined whether an error is present in an LDPC information word and an LDPC parity recovered by the LDPC decoding.

At S2520-Y, when it is determined that the LDPC syndrome value is 0, at S2530, base layer LDPC decoding is then performed based on the LDPC information word and the LDPC parity recovered by the LDPC decoding, to generate a base layer signal.

Meanwhile, at S2520-N, when it is determined that the LDPC syndrome value is not 0, at S2540, CRC decoding is performed on the LDPC information word recovered by the LDPC decoding.

At S2550, it is then determined whether an error is present in a CRC codeword by the CRC decoding. That is, it is determined whether an error is present in the LDPC information word.

At S2550-Y, when it is determined that an error is present, at S2560, the upper layer signal is discarded by exception handling.

Meanwhile, at S2550-N, when it is determined that an error is not present, at S2570, LDPC encoding is performed on the LDPC information word.

Here, the LDPC encoding refers generating an LDPC parity by an $H \cdot C^T = 0$ process, rather than using an IPPC expression value. That is, the parity generator 300 generates an LDPC parity that satisfies $H \cdot C^T = 0$ for the LDPC information word. In this example, the parity check matrix H may be a parity check matrix used during LDPC encoding at the transmitter 100.

At S2530, the base layer LDPC decoding is then performed based on the LDPC information word recovered by the upper layer LDPC decoding and the LDPC parity generated through the LDPC encoding, to generate a base layer signal.

Meanwhile, as described above, it may be determined whether an LDPC syndrome value is 0, and then, CRC decoding may be performed when the LDPC syndrome value is not 0, i.e., when an error is present in at least one of an LDPC information word and an LDPC parity recovered by LDPC decoding, but this is only one of exemplary embodiments.

That is, it is possible to perform the CRC decoding on the LDPC information word recovered by the upper layer LDPC decoding, and generate the LDPC parity based on a result of the CRC decoding, without separately determining whether the LDPC syndrome value is 0. Further, even when the LDPC syndrome value is 0, it is possible to perform the CRC decoding on the LDPC information word recovered by the upper layer LDPC decoding and generate an LDPC parity based on a result of the CRC decoding.

Meanwhile, when the first encoder 111 performed LDPC encoding based on a parity check matrix with the structure as illustrated in FIG. 6, the parity generator 300 may generate parities using a method described below.

First, when an error is present in at least one of an LDPC information word and a first LDPC parity recovered by upper layer LDPC decoding, first and second LDPC parities may be generated based on a result of CRC decoding.

To this purpose, the first LDPC decoder 230 may determine whether an error is present in at least one of the LDPC information word and the first LDPC parity recovered by the upper layer LDPC decoding, and provide information on presence of the error to the parity generator 300. Accordingly, based on the information provided from the first LDPC decoder 230, the parity generator 300 may determine whether the error is present in at least one of the LDPC information word and the first LDPC parity recovered by LDPC decoding.

Meanwhile, the first CRC decoder 250 may determine whether the error is present in the LDPC information word by performing CRC decoding on the LDPC information word, and provide information thereof to the parity generator 300.

Generally, the CRC decoding simply determines presence of an error in a CRC codeword by the CRC decoding, and it does not correct the error.

Accordingly, the first CRC decoder 250 may perform the CRC decoding on the LDPC information word to determine whether an error is present in the LDPC information word, i.e., to determine presence of the error, and provide information thereof to the parity generator 300.

Accordingly, the parity generator 300 may determine whether an error is present in the LDPC information word, based on the information provided from the first CRC decoder 250.

In other word, the parity generator 300 may determine whether an error is present in at least one of the LDPC information word and the first LDPC parity recovered by the upper layer LDPC decoding, based on the information delivered from the first LDPC decoder 230, and if so, i.e., if the error is present in at least one of the LDPC information word and the first LDPC parity, may determine whether the error is present in the LDPC information word based on the information provided from the first CRC decoder 250.

Additionally, the parity generator 300 may generate the first and second LDPC parities using IPPC expressions. To this purpose, the receiver 1000 may previously store information on the IPPC expressions corresponding to a parity check matrix.

Specifically, the parity generator 300 may generate a second LDPC parity corresponding to the LDPC information word and a first LDPC parity recovered by the LDPC decoding based on the IPPC expressions, when the error is not present in any of the LDPC information word and the first LDPC parity recovered by the LDPC decoding.

Specifically, the parity generator 300 may generate the second LDPC parity corresponding to the LDPC information and the first LDPC parity recovered by the LDPC decoding, based on second IPPC expressions.

That is, the parity generator 300 may generate second parity bits by substituting LDPC information bits and first LDPC parity bits recovered by the upper layer LDPC decoding for second IPPC expression values.

Meanwhile, when it is determined that an error is present in at least one of the LDPC information word and the first LDPC parity recovered by the LDPC decoding, but not present in the LDPC information word, based on a result of the CRC decoding, the parity generator 300 may generate an LDPC parity corresponding to the LDPC information word based on the IPPC expressions.

Specifically, the parity generator 300 may generate a first LDPC parity corresponding to the LDPC information word based on the first IPPC expressions, and generate a second LDPC parity corresponding to the LDPC information word and the first LDPC parity based on the second IPPC expressions.

That is, the parity generator 300 may calculate a first IPPC expression value by substituting error-free LDPC information bits for the first IPPC expressions, and may generate the first LDPC parity by sequentially accumulating the first LDPC parity bits to the first IPPC expression values.

The parity generator 300 may also generate the second parity bit by substituting the error-free LDPC information bits and the first LDPC parity bits for the second IPPC expression values.

Meanwhile, the IPPC expressions and the method of generating the first and second LDPC parities using the IPPC expressions will not be redundantly explained below for the sake of brevity.

A method of generating an LDPC parity according to an exemplary embodiment will be described in detail below, with reference to FIGS. 26 to 29.

Figure 26:
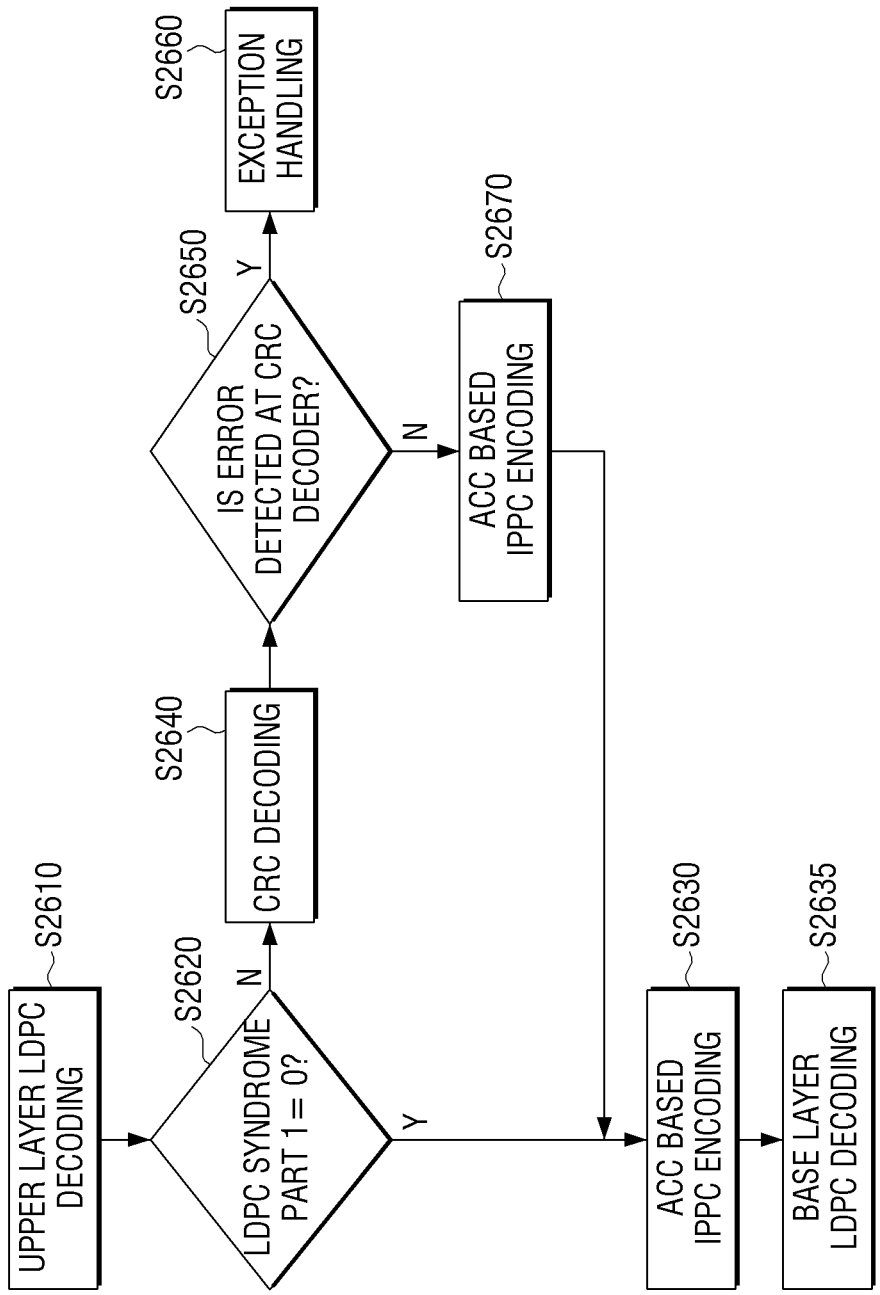

FIG. 26 is a flowchart provided to explain a method of generating an LDPC parity according to an exemplary embodiment.

Referring to FIG. 26, at S2610, when upper layer LDPC decoding to generate an upper layer signal is performed an input signal such as a superposition coding signal. At S2620, it is determined whether an LDPC syndrome value is 0 based on a result of the upper layer LDPC decoding performed at S2610. That is, the superposition coding signal is LDPC-decoded, and it is determined whether an error is present in an LDPC information word and a first LDPC parity recovered by the upper layer LDPC decoding.

At S2620-Y, when it is determined that the LDPC syndrome value is 0, at S2630, ACC based IPPC encoding is performed to generate first and second LDPC parities.

In this example, the second LDPC parity corresponding to the LDPC information word and the first LDPC parity recovered by LDPC decoding may be generated by using second IPPC expressions. Note that the first LDPC parity and the second LDPC parity corresponding to the LDPC information recovered by LDPC decoding may be generated by using first IPPC expressions and the second IPPC expressions, respectively.

At S2635, base layer LDPC decoding is then performed based on the LDPC information word, the first LDPC parity and the second LDPC parity, to generate a base layer signal.

Meanwhile, at S2620-N, when the LDPC syndrome value of a first parity check matrix is not 0, at S2640, CRC decoding is performed on the LDPC information word recovered by the upper layer LDPC decoding.

At S2650, it is then determined whether an error is present in the CRC codeword by the CRC decoding. That is, it is determined whether an error is present in the LDPC information word.

At S2650-Y, when the error is present, at S2660, the upper layer signal is discarded by exception handling.

Meanwhile, at S2650-N, when the error is not present, at S2670, ACC based IPPC encoding is performed using a first IPPC expression value. Specifically, since the error is not present in the LDPC information word, the first LDPC parity for the LDPC information word may be generated using the first IPPC expression value.

At S2630, ACC based IPPC encoding is performed using a second IPPC expression value. Specifically, the second LDPC parity corresponding to the LDPC information word and the first LDPC parity is generated, using the second IPPC expressions.

At S2635, base layer LDPC decoding is then performed based on the LDPC information word, the first LDPC parity, and the second LDPC parity, to generate a base layer signal.

Meanwhile, as described above, the first and second LDPC parities may be generated using the ACC based IPPC encoding, but this is only one of exemplary embodiments. Accordingly, the first and second LDPC parities may be generated using methods other than the ACC based IPPC encoding, as will be described below with reference to FIGS. 27 to 29.

Figure 27:
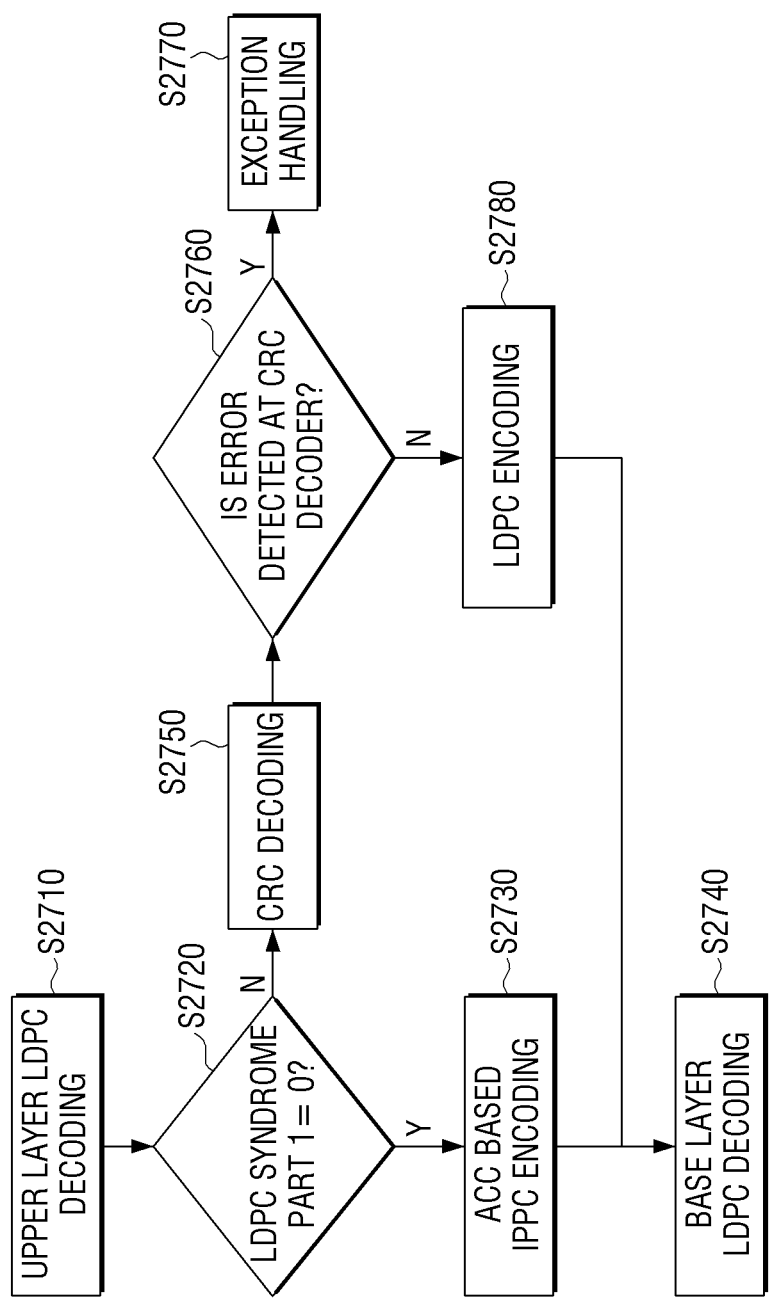

FIG. 27 is a flowchart provided to explain a method of generating an LDPC parity according to another exemplary embodiment.

Referring to FIG. 27, at S2710, when upper layer LDPC decoding is performed on an input signal such as a superposition coding signal to generate an upper layer signal. At S2720, it is determined whether an LDPC syndrome value of a first parity check matrix is 0 based on a result of the upper layer LDPC decoding performed at S2710. That is, the upper layer LDPC decoding is performed on the superposition coding signal, and then, it is determined whether an error is present in an LDPC information word and a first LDPC parity recovered by the upper layer LDPC decoding.

At S2720-Y, when it is determined that the LDPC syndrome value of a first parity check matrix is 0, at S2730, first and second LDPC parities are generated by performing ACC based IPPC encoding.

In this example, the second LDPC parity corresponding to the LDPC information word and the first LDPC parity recovered by the upper layer LDPC decoding may be generated by using second IPPC expressions. Note that the first LDPC parity and the second LDPC parity corresponding to the LDPC information word recovered by the LDPC decoding may be generated by using first IPPC expressions and the second IPPC expressions, respectively.

At S2740, base layer LDPC decoding is then performed based on the LDPC information word, the first LDPC parity and the second LDPC parity, to generate a base layer signal.

Meanwhile, at S2720-N, when it is determined that the LDPC syndrome value of the first parity check matrix is not 0, at S2750, CRC decoding is performed on the LDPC information word recovered by the upper layer LDPC decoding.

At S2760, it is then determined whether an error is present in the CRC codeword, that is, the LDPC information word recovered by the upper layer LDPC decoding, by the CRC decoding.

At S2760-Y, when it is determined that the error is present, at S2770, the upper layer signal is discarded by exception handling.

Meanwhile, at S2870-N, when it is determined that the error is not present, at S2780, LDPC encoding is performed based on the LDPC information word.

Here, the LDPC encoding refers to generating first and second LDPC parities by an $H \cdot C^T = 0$ process, rather than using the IPPC expression values. That is, the parity generator 300 generates the first LDPC parity and the second LDPC parity that satisfy $H \cdot C^T = 0$, for the LDPC information word. In this example, the parity check matrix may be a parity check matrix, such as one illustrated in FIG. 6, used during LDPC encoding at the transmitter 100.

At S2740, the base layer LDPC decoding is then performed based on the LDPC information word recovered by the upper layer LDPC decoding and the first and second LDPC parities generated through the LDPC encoding, to generate a base layer signal.

Figure 28:
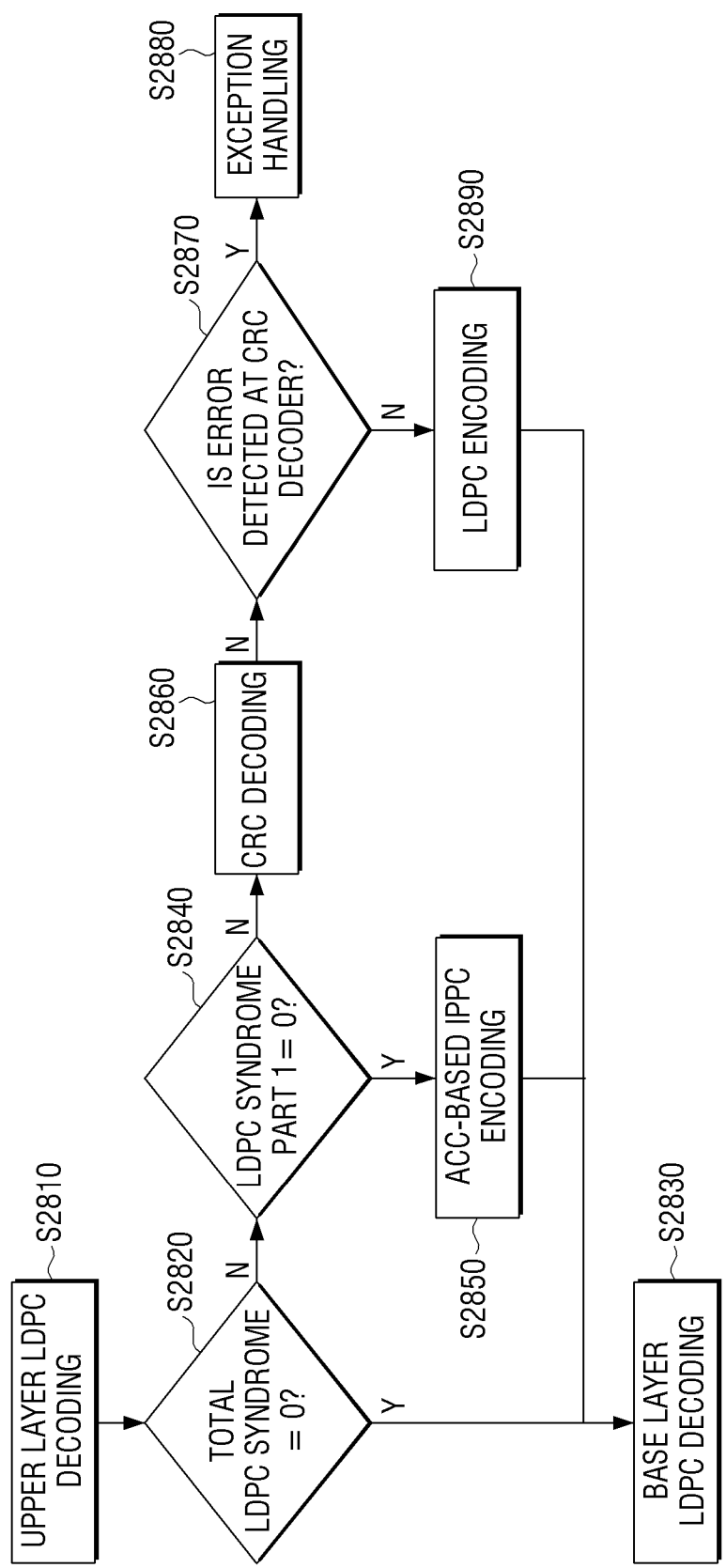

FIG. 28 is a flowchart provided to explain a method of generating an LDPC parity according to another exemplary embodiment.

Referring to FIG. 28, at S2810, when upper layer LDPC decoding is performed on an input signal such as a superposition coding signal to generate an upper layer signal. At S2820, it is determined whether an LDPC syndrome value is 0 based on a result of the upper layer LDPC decoding performed at S2810. In this example, determination as to whether the LDPC syndrome value is 0 may be performed on an entire parity check matrix (e.g., a parity check matrix 20 in FIG. 6), rather than a first parity check matrix (e.g., a first parity check matrix formed of matrices A and B in FIG. 6).

At S2820-Y, when it is determined that the LDPC syndrome value is 0, at S2830, base layer LDPC decoding is then performed based on an LDPC information word, a first LDPC parity and a second LDPC parity recovered by the LDPC decoding, to generate a base layer signal, as an error is not present in the LDPC information word, the first LDPC parity and the second LDPC parity recovered by the LDPC decoding.

Meanwhile, at S2820-N, when it is determined that the LDPC syndrome value of the entire parity check matrix is not 0, at S2840, it is determined whether an LDPC syndrome value of the first parity check matrix is 0.

At S2840-Y, when it is determined that the LDPC syndrome value of the first parity check matrix is 0, at S2850, ACC based IPPC encoding is performed to generate a first LDPC parity and a second LDPC parity.

In the above example, the second LDPC parity corresponding to the LDPC information word and the first LDPC parity recovered by the upper layer LDPC decoding may be generated by using the second IPPC expressions. Note that the first LDPC parity and the second LDPC parity corresponding to the LDPC information word recovered by the upper layer LDPC decoding may be generated by using the first IPPC expressions and the second IPPC expressions, respectively.

At S2830, base layer LDPC decoding is then performed based on the LDPC information word recovered by the upper layer LDPC decoding, and the first and second LDPC parities generated by using the first and second IPPC expressions, to generate a base layer signal.

Meanwhile, at S2840-N, when it is determined that the LDPC syndrome value of the first parity check matrix is not 0, at S2860, CRC decoding is performed on the LDPC information word recovered by the upper layer LDPC decoding.

At S2870, it is then determined whether an error is present in the CRC codeword by the CRC decoding. That is, it is determined whether the error is present in the LDPC information word.

At S2870-Y, when it is determined that the error is present, at S2880, the upper layer signal is discarded by exception handling.

Meanwhile, at S2870-N, when it is determined that the error is not present, at S2890, LDPC encoding is performed on the LDPC information word recovered by the upper layer LDPC decoding.

At S2830, base layer LDPC decoding is then performed based on the LDPC information word recovered by the upper layer LDPC decoding, and the first LDPC parity and the second LDPC parity generated through the LDPC encoding, to generate a base layer signal.

Figure 29:
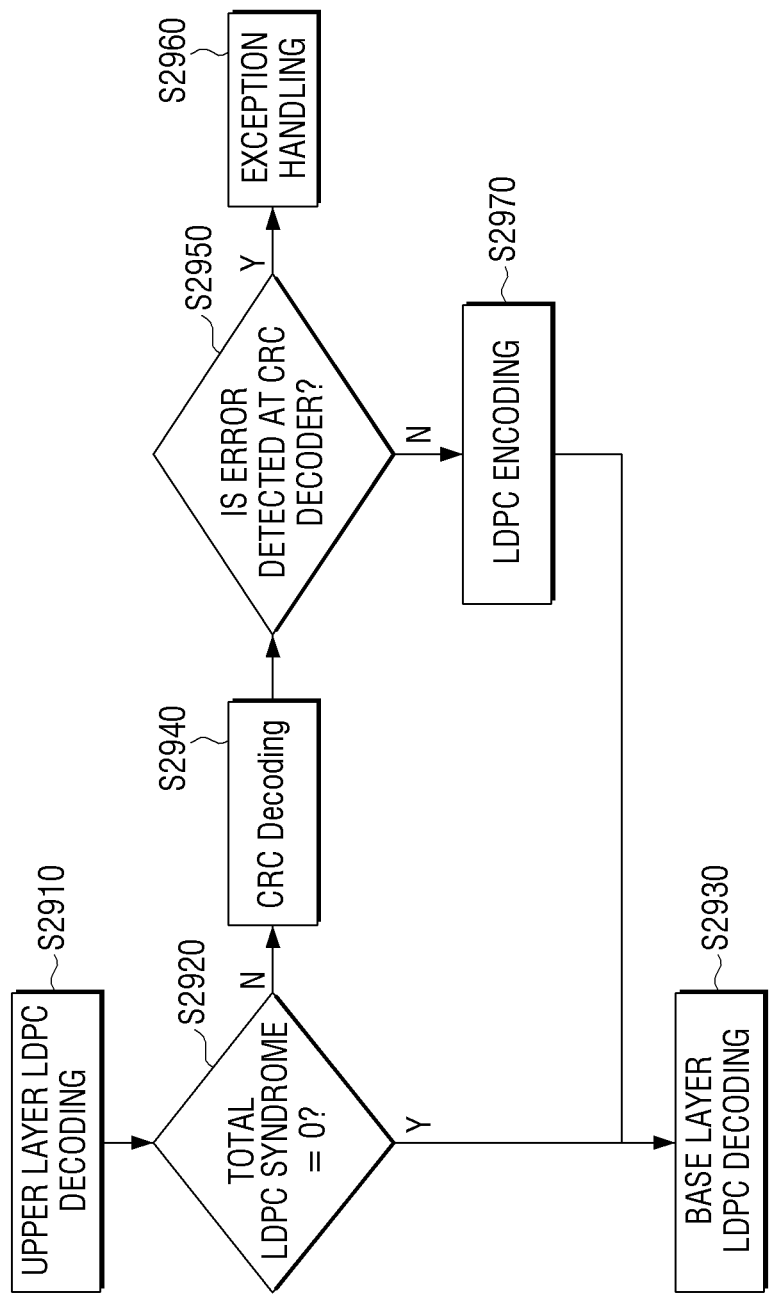

FIG. 29 is a flowchart provided to explain a method of generating LDPC parity according to an embodiment.

Referring to FIG. 29, at S2910, when upper layer LDPC decoding is performed on an input signal such as a superposition coding signal to generate an upper layer signal. At S2920, it is determined whether an LDPC syndrome value is 0 based on a result of the upper layer LDPC decoding performed at S2910. In this example, determination as to whether the LDPC syndrome value is 0 may be performed on an entire parity check matrix (e.g., a parity check matrix 20 in FIG. 6), rather than a first parity check matrix (e.g., a first parity check matrix formed of matrices A and B in FIG. 6).

At S2920-Y, when it is determined that the LDPC syndrome value is 0, at S2930, base layer LDPC decoding is then performed based on an LDPC information word, and a first LDPC parity and a second LDPC parity recovered by the upper layer LDPC decoding, to generate a base layer signal, as an error is not present in the LDPC information word, the first LDPC parity and the second LDPC parity recovered by the LDPC decoding.

Meanwhile, at S2920-N, when it is determined that the LDPC syndrome value is not 0, at S2940, CRC decoding is performed on the LDPC information word recovered by upper layer LDPC decoding.

At S2950, it is then determined whether an error is present in the CRC codeword by the CRC decoding. That is, it is determined whether the error is present in the LDPC information word.

At S2950-Y, when it is determined that the error is present, at S2960, the upper layer signal is discarded by exception handling.

Meanwhile, at S2950-N, when the error is not present, at 52970, LDPC encoding is performed based on the LDPC information word.

At S2930, base layer LDPC decoding is then performed based on the LDPC information word recovered by the upper layer LDPC decoding, and the first LDPC parity and the second LDPC parity generated through the LDPC encoding, to generate a base layer signal.

Meanwhile, as described above, it may be determined whether the LDPC syndrome value is 0, and then, the CRC decoding may be performed when the LDPC syndrome value is not 0, but this is only one of exemplary embodiments.

That is, it is possible to perform the CRC decoding on the LDPC information word recovered by LDPC decoding and generate the first LDPC parity and the second LDPC parity based on a result of the CRC decoding, without separately determining whether the LDPC syndrome value is 0. Further, even when the LDPC syndrome value is 0, it is possible to perform the CRC decoding on the LDPC information word recovered by LDPC decoding and generate the first LDPC parity and the second LDPC parity based on a result of CRC decoding.

Referring back to FIG. 7, the second BICM decoder 400 may also process the superposition coding signal, which is input to the first BICM decoder 200, and generate a second signal. Here, the second signal may be a signal corresponding to the base layer.

The second BICM decoder 400 will be described in detail below with reference to FIGS. 30A and 30B.

Figure 30A:
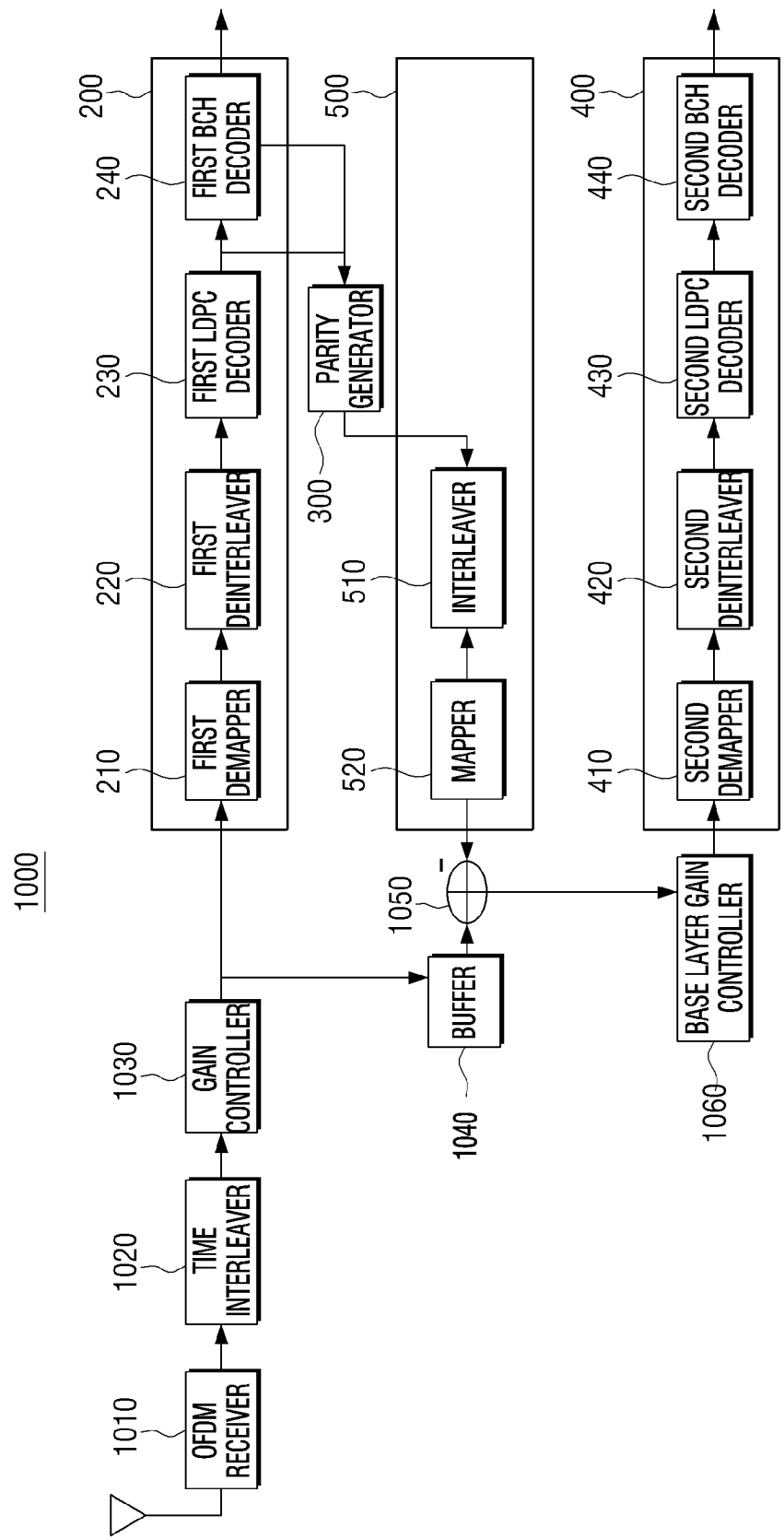
FIGS. 30A and 30B are block diagrams provided to explain a detailed constitution of a receiver according to exemplary embodiments.
Figure 30B:
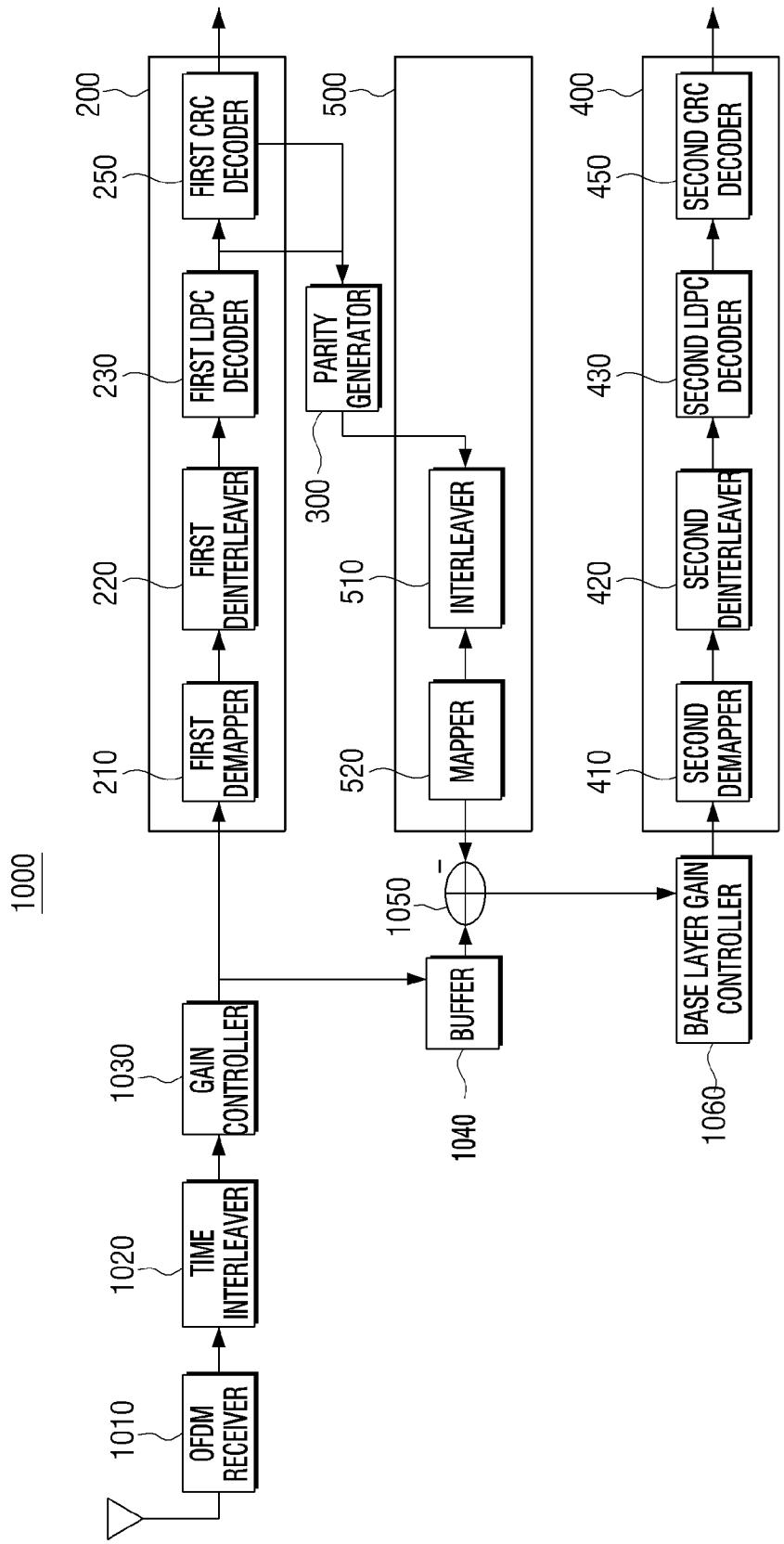

FIGS. 30A and 30B are block diagrams provided to explain a detailed constitution of a receiver according to an exemplary embodiment. The receiver illustrated in FIGS. 30A and 30B may be the receiver 1000 illustrated in FIG. 7.

Referring to FIG. 30A, a receiver 1000 may include an OFDM receiver 1010, a time deinterleaver 1020, a gain controller 1030, a buffer 1040, a signal remover 1050, a base layer gain controller 1060, a first BICM decoder 200, a parity generator 300, a second BICM decoder 400 and a BICM encoder 500.

Referring to the receiver 1000 illustrated in FIG. 30A, the receiver 1000 may receive a signal transmitted by the transmitter 100 of FIG. 1 which includes a first BCH encoder (not illustrated) and a second BCH encoder (not illustrated). The first and second BCH encoders may be included in the first and second encoders 111, 121, respectively.

Meanwhile, redundant description about the first BICM decoder 200 and the parity generator 300 will be omitted for the sake of brevity, as these have already been described above.

The OFDM receiver 1010 may OFDM demodulate a superposition coding signal transmitted from the transmitter 100, generate cells from an OFDM frame and output the cells to the time interleaver 1020.

The time interleaver 1020 deinterleaves an output from the OFDM receiver 1010.

Specifically, the time deinterleaver 1020, which is in a configuration corresponding to that of the time interleaver 150 of the transmitter 100, may deinterleave the cells and output the deinterleaved cells to the gain controller 1030.

The gain controller 1030 controls a gain of an output from the time deinterleaver 1020.

Specifically, the gain controller 1030, which is in a configuration corresponding to that of the gain controller 140 of the transmitter 100, controls a gain of a signal output from the time deinterleaver 1020 and output the gain-controlled signal to the first BICM decoder 200 and the buffer 1040.

The first BICM decoder 200 may process a signal output from the gain controller 1030 and generate a first signal. Herein, the first signal may be a signal corresponding to an upper layer.

Meanwhile, the parity generator 300 may generate a parity based on a result of decoding at the first BICM decoder 200.

Specifically, the parity generator 300 may output an LDPC codeword including an LDPC information word, which is recovered by the LDPC decoding performed by the first LDPC decoder 230 of the first BICM decoder 200, and an LDPC parity (or first and second LDPC parities), which is generated at the parity generator 300 as described above, to the BICM encoder 500. Here, the LDPC parity generated at the parity generator 300 is not the LDPC parity recovered by the LDPC decoding performed by the first LDPC decoder 230 of the first BICM decoder 200, as described above and further explained below.

First, an example may be considered, in which the first LDPC decoder 230 performs LDPC decoding based on the parity check matrix 10 as illustrated in FIG. 5.

In this example, when an error is not present in an LDPC codeword recovered by LDPC decoding at the first LDPC decoder 230 (i.e., when an LDPC syndrome value is 0), the parity generator 300 may receive the LDPC codeword recovered by LDPC decoding from the first LDPC decoder 230 and output the LDPC codeword to the BICM encoder 500.

Further, when an error is not present in an LDPC information word recovered by the LDPC decoding at the first LDPC decoder 230 (i.e., when the LDPC syndrome value is not 0, but a result of BCH decoding at the first BCH decoder 240 indicates absence of an error in the LDPC information word), the parity generator 300 may receive the LDPC information word recovered from the first LDPC decoder 230, generate an LDPC parity corresponding to the LDPC information word based on IPPC expressions, and output the LDPC information word, which is recovered from the first LDPC decoder 230, and the LDPC parity, which is generated based on the IPPC expressions, to the BICM encoder 500.

Further, when the error is present in the LDPC information word recovered by the LDPC decoding at the first LDPC decoder 230 (i.e., when the result of the BCH decoding indicates presence of the error in the LDPC information word), the parity generator 300 may receive the LDPC information word from the first BCH decoder 240, generate an LDPC parity corresponding to the LDPC information word based on the IPPC expressions, and output the LDPC information word, which is received from the first BCH decoder 240, and the LDPC parity, which is generated based on the IPPC expressions, to the BICM encoder 500.

Meanwhile, an example may be considered, in which the first LDPC decoder 230 performs LDPC decoding based on the parity check matrix 20 as illustrated in FIG. 6.

In this example, when an error is not present in either of an LDPC information word and a first LDPC parity recovered by LDPC decoding at the first LDPC decoder 230 (i.e., when an LDPC syndrome value for the first parity check matrix is 0), the parity generator 300 may receive the LDPC information word and the first LDPC parity from the first LDPC decoder 230, generate a second LDPC parity, corresponding to the LDPC information word and the first LDPC parity recovered by the first LDPC decoder 230, based on second IPPC expressions, and output the LDPC information word and the first LDPC parity, which are recovered by the first LDPC decoder 230, and the second LDPC parity, which is generated based on the second IPPC expressions, to the BICM encoder 500.

Further, when an error is not present in the LDPC information word recovered by the LDPC decoding at the first LDPC decoder 230 (i.e., when the LDPC syndrome value for the first parity check matrix is not 0, and a result of BCH decoding indicates absence of the error in the LDPC information word), the parity generator 300 may receive the LDPC information word from the first LDPC decoder 230, generate first and second LDPC parities corresponding to the LDPC information word based on first and second IPPC expressions, and output the LDPC information word, which is recovered by the first LDPC decoder 230, and the first and second LDPC parities, which are generated based on the first and second expressions, to the BICM encoder 500.

Further, when an error is present in the LDPC information word recovered by the LDPC decoding at the first LDPC decoder 230 (i.e., when the result of the BCH decoding indicates presence of the error in the LDPC information word), the parity generator 300 may receive the LDPC information word from the first BCH decoder 240, generate first and second LDPC parities corresponding to the LDPC information word, which is received from the first BCH decoder 240, based on first and second IPPC expressions, and output the LDPC information word, which is received from the first BCH decoder 240, and the first and second LDPC parities, which are generated based on the first and second expressions, to the BICM encoder 500.

The BICM encoder 500 may process a signal output from the parity generator 300. To that purpose, the BICM encoder 500 may include an interleaver 510 and a mapper 520. Here, when the parity check matrix 10 of FIG. 5 was used for LDPC encoding of a signal input to the first LDPC decoder 230 at the transmitter 100, the signal output from the parity generator 300 may include an LDPC information word, which is recovered by the first LDPC decoder 230 or received from the first BCH decoder 240, and an LDPC parity which is recovered by the first LDPC decoder 230 or generated based on IPPC expressions. However, when the parity check matrix 20 of FIG. 6 was used for LDPC encoding of a signal input to the first LDPC decoder 230 at the transmitter 100, the signal output from the parity generator 300 may include an LDPC information word, which is recovered by the first LDPC decoder 230 or received from the first BCH decoder 240, and first and second LDPC parities which are recovered by the first LDPC decoder 230 or generated respectively based on first and second IPPC expressions. This signal output from the parity generator 300 may be in a form of an LDPC codeword including the LDPC information word and the above LDPC parity or parities. However, according to an exemplary embodiment, this signal does not have to be in the form of an LDPC codeword, and instead, the LDPC information word and the above LDPC parity or parities may be separately output without forming an LDPC codeword. Herebelow, however, this signal output from the parity generator 300 is regarded as an LDPC codeword for brevity of explanation.

The interleaver 510 may interleave the above signal output from the parity generator 300, that is, an LDPC codeword formed of LDPC codeword bits.

Specifically, the interleaver 510, which is in a configuration corresponding to that of the first interleaver 112 of the transmitter 100, interleaves the LDPC codeword bits output from the parity generator 300 in the same manner as the first interleaver 112, and output the interleaved LDPC codeword bits to the mapper 520.

The mapper 520 modulates an output from the interleaver 510 which is the interleaved LDPC codeword bits.

Specifically, the mapper 520, which is in a configuration corresponding to that of the first mapper 113 of the transmitter 100, may map the interleaved LDPC codeword bits output from the interleaver 510 to constellation points in the same manner as the first mapper 113, and output a result of the mapping. For example, when the first mapper 113 performed the mapping using a QPSK modulation method, the mapper 520 may modulate the interleaved LDPC codeword bits output from the interleaver 510 based on the QPSK modulation method.

Accordingly, the BICM encoder 500 may interleave the LDPC codeword including the LDPC information word and the LDPC parity (or the first and second LDPC parities) output from the parity generator 200 and modulate the interleaved LDPC codeword.

Meanwhile, the buffer 1040 stores a signal, which is a superposition coding signal, output from the gain controller 1030.

The signal remover 1050 receives a signal stored at the buffer 1040 and a signal output from the BICM encoder 500, which is a modulated LDPC codeword, removes the signal output from the BICM encoder 500 from the signal provided from the buffer 1040, that is, the superposition coding signal, and output a resultant signal to the base layer gain controller 1060.

The base layer gain controller 1060, which is in a configuration corresponding to that of the base layer gain controller 130 of the transmitter 100, controls a gain of the signal output from the signal remover 1050 and output a resultant signal to the second BICM decoder 400.

The second BICM decoder 400 may process a signal output from the base layer gain controller 1060, that is, the superposition coding signal which is gain-controlled at the base-layer gain controller 1060 after removing therefrom the signal (i.e., the modulated LDPC codeword) output from the BICM encoder 500, and generate a second signal. The second signal may be the signal corresponding to the base layer.

To this purpose, the second BICM decoder 400 may include a second demapper 410, a second deinterleaver 420, a second LDPC decoder 430 and a second BCH decoder 440.

The second demapper 410 demodulates a signal output from the base layer gain controller 1060.

Specifically, the second demapper 410 demodulates the signal (i.e., the superposition coding signal which is gain-controlled at the base-layer gain controller 1060 after removing therefrom the signal output from the BICM encoder 500) to generate an LLR value, and output the LLR value to the second deinterleaver 420.

In this example, the second demapper 410 may demodulate the superposition coding signal, which is gain-controlled at the base-layer gain controller 1060 after removing therefrom the signal output from the BICM encoder 500, based on a modulation method applied on a signal corresponding to the base layer. For example, when the signal corresponding to the base layer is modulated at the transmitter 100 with a 64-QAM method, the second demapper 410 may demodulate the signal based on the 64-QAM method.

The LLR value may be expressed as a log value of a ratio of a probability that a bit transmitted from the transmitter 100 is 0 and a probability that the bit is 1. Alternatively, the LLR value may be a representative value which is determined according to a section where a probability that a bit transmitted from the transmitter 100 being 0 or 1 belongs.

The second deinterleaver 420 deinterleaves an output from the second demapper 410.

Specifically, the second deinterleaver 420, which is in a configuration corresponding to that of the second interleaver 122 of the transmitter 100, may reverse the interleaving operation performed at the second interleaver 122 to deinterleave the LLR value and output a result to the second LDPC decoder 430.

The second LDPC decoder 430 LDPC decodes an output from the second deinterleaver 420.

Specifically, the second LDPC decoder 430, which is in a configuration corresponding to that of an LDPC encoder (not illustrated) of the second BICM encoder 120 of the transmitter 100, may recover an LDPC information word and an LDPC parity by performing LDPC decoding on the deinterleaved LLR value.

In this example, the second LDPC decoder 430 may perform the LDPC decoding using various methods. For example, the second LDPC decoder 430 may perform the LDPC decoding through iterative decoding based on a sum-product algorithm, and determine bits by a hard decision and recover the LDPC codeword.

Meanwhile, the second LDPC decoder 430 may perform the LDPC decoding based on a parity check matrix used during LDPC encoding at the second encoder 121.

For example, when a parity check matrix of the structure as illustrated in FIG. 5 was used during LDPC encoding, the second LDPC decoder 430 may recover the LDPC information word and the LDPC parity by performing LDPC decoding based on the parity check matrix of the structure as illustrated in FIG. 5. That is, the second LDPC decoder 430 may recover an LDPC information word corresponding to the information word submatrix 11 and an LDPC parity corresponding to the parity submatrix 12 of the dual diagonal matrix structure.

Further, when a parity check matrix of the structure as illustrated in FIG. 6 was used during LDPC encoding, the second LDPC decoder 430 may recover the LDPC information word and the LDPC parity by performing LDPC decoding based on the parity check matrix of the structure as illustrated in FIG. 6. That is, the second LDPC decoder 430 may recover an LDPC information word corresponding to the information word submatrix (i.e., the first and second information word submatrices A and C), a first LDPC parity corresponding to the first parity submatrix B of the dual diagonal matrix structure, and a second LDPC parity corresponding to the second parity submatrix D of the unit matrix structure.

Meanwhile, information on the parity check matrix used during LDPC encoding may be previously stored at the receiver 1000 or provided from the transmitter 100.

The second LDPC decoder 430 may output the LDPC information word recovered by the LDPC decoding to the second BCH decoder 440.

The second BCH decoder 440 generates a second signal by BCH decoding an output from the second LDPC decoder 430, i.e., the LDPC information word. Herein, the second BCH decoder 440 is a configuration corresponding to the BCH encoder (not illustrated) of the second BICM encoder 120 of the transmitter 100.

Specifically, as the LDPC information word output from the second LDPC decoder includes a BCH information word and a BCH parity, the second BCH decoder 440 may recover the BCH information word by correcting an error in the BCH codeword, using the BCH parity output from the second LDPC decoder 430.

The BCH information word refers to constituent bits of a stream, i.e., those bits that are intended to be transmitted by the transmitter 100, and these may construct a signal corresponding to the base layer. For example, the second BCH decoder 440 may output the constituent bits of the stream B of FIG. 1.

Meanwhile, as illustrated in FIG. 30B, the receiver 1000 may include an OFDM receiver 1010, a time deinterleaver 1020, a gain controller 1030, a buffer 1040, a signal remover 1050, a base layer gain controller 1060, a first BICM decoder 200, a parity generator 300, a second BICM decoder 400 and a BICM encoder 500.

The receiver 1000 illustrated in FIG. 30B is different from the receiver 1000 illustrated in FIG. 30A, in view of the first CRC decoder 250 and the second CRC decoder 450 implemented instead of the first BCH decoder 240 and the second BCH decoder 440.

Meanwhile, the receiver 1000 illustrated in FIG. 30B may receive a signal transmitted from the transmitter 100 of FIG. 1 which includes a first CRC encoder (not illustrated) and a second CRC encoder (not illustrated) and process the received signal. The first and second CRC encoders may be included in the first and second encoders 111, 121, respectively.

Meanwhile, the first BICM decoder 200 and the parity generator 300 will not be redundantly described below, as these have been described above.

The OFDM receiver 1010 may OFDM demodulate a superposition coding signal transmitted from the transmitter 100, generate cells from an OFDM frame, and output the cells to the time deinterleaver 1020.

The time deinterleaver 1020 deinterleaves an output from the OFDM receiver 1010.

Specifically, the time deinterleaver, which is in a configuration corresponding to that of the time interleaver 150 of the transmitter 100, may deinterleave the cells and output the deinterleaved cells to the gain controller 1030.

The gain controller 1030 controls a gain of an output from the time deinterleaver 1020.

Specifically, the gain controller 1040, which is in a configuration corresponding to that of the gain controller of the transmitter 100, controls a gain of a signal output from the time deinterleaver 1020 and outputs the gain-controlled signal to the first BICM decoder 200 and the buffer 1040.

The first BICM decoder 200 may generate a first signal by processing the signal output from the gain controller 1030. Herein, the first signal may be a signal corresponding to the upper layer.

Meanwhile, the parity generator 300 may generate a parity based on a result of decoding at the first BICM decoder 200.

Specifically, the parity generator 300 may output an LDPC codeword including an LDPC information word, which is recovered at the first BICM decoder 200, and an LDPC parity (or first and second LDPC parities), which is generated at the parity generator 300 as described above, to the BICM encoder 500.

First, an example may be considered, in which the first LDPC decoder 230 performs LDPC decoding based on the parity check matrix 10 as illustrated in FIG. 5.

In this example, when an error is not present in at least one of an LDPC information word and an LDPC parity recovered by LDPC decoding at the first LDPC decoder 230, the parity generator 300 may receive the LDPC information word and the LDPC parity recovered by LDPC decoding from the first LDPC decoder 230 and output the LDPC codeword to the BICM encoder 500.

Further, when an error is present in at least one of the LDPC information word and the LDPC parity recovered by the LDPC decoding at the first LDPC decoder 230, the parity generator 300 may determine whether an error is present in the LDPC information word based on a result of CRC decoding at the first CRC decoder 250, and when it is determined that the error it not present in the LDPC information word, may receive an LDPC information word from the first CRC decoder 250 and generate an LDPC parity corresponding to the LDPC information word based on IPPC expressions, and may output the LDPC information word, which is received from the CRC decoder 250, and the LDPC parity, which is generated based on the IPPC expressions, to the BICM encoder 500.

Meanwhile, an example is now considered, in which the first LDPC decoder 230 performs LDPC decoding based on the parity check matrix 20 as illustrated in FIG. 6.

In this example, when an error is not present in an LDPC information word and a first LDPC parity recovered by LDPC decoding at the first LDPC decoder 230, the parity generator 300 may receive the LDPC information word and the first LDPC parity from the first LDPC decoder 230 and generate a second LDPC parity corresponding to the LDPC information word and the first LDPC parity, recovered by the first LDPC decoder 230, based on second IPPC expressions, and output the LDPC information word and the first LDPC parity, which are recovered by the first LDPC decoder 230, and the second LDPC parity, which is generated based on the second IPPC expressions, to the BICM encoder 500.

Further, when an error is present in at least one of the LDPC information word recovered and the first LDPC parity recovered by LDPC decoding at the first LDPC decoder 230, the parity generator 300 may determine whether the error is present in the LDPC information word based on a result of CRC decoding at the first CRC decoder 250, and when it is determined that the error is not present in the LDPC information, may receive the LDPC information word from the first CRC decoder 250 and generate a first LDPC parity and a second LDPC parity corresponding to the LDPC information word based on first IPPC expressions and second IPPC expressions, and output the LDPC information word, which is received from the first CRC decoder 250, and the first and second LDPC parities, which are generated based on the first and second IPPC expressions, to the BICM encoder 500.

The BICM encoder 500 may process a signal output from the parity generator 300. To this purpose, the BICM encoder 500 may include an interleaver 510 and a mapper 520. Here, when the parity check matrix 10 of FIG. 5 was used for LDPC encoding of a signal input to the first LDPC decoder 230 at the transmitter 100, the signal output from the parity generator 300 may include an LDPC information word, which is recovered by the first LDPC decoder 230 or received from the first CRC decoder 250, and an LDPC parity which is recovered by the first LDPC decoder 230 or generated based on IPPC expressions. However, when the parity check matrix 20 of FIG. 6 was used for LDPC encoding of a signal input to the first LDPC decoder 230 at the transmitter 100, the signal output from the parity generator 300 may include an LDPC information word, which is recovered by the first LDPC decoder 230 or received from the first CRC decoder 250, and first and second LDPC parities which are recovered by the first LDPC decoder 230 or generated respectively based on the first and second IPPC expressions. This signal output from the parity generator 300 may be in a form of an LDPC codeword including the LDPC information word and the above LDPC parity or parities. However, according to an exemplary embodiment, this signal does not have to be in the form of an LDPC codeword, and instead, the LDPC information word and the above LDPC parity or parities may be separately output without forming an LDPC codeword. Herebelow, however, this signal output from the parity generator 300 is regarded as an LDPC codeword for brevity of explanation.

The interleaver 510 may interleave the above signal output from the parity generator 300, that is, an LDPC codeword formed of LDPC codeword bits.

Specifically, the interleaver 510, which is in a configuration corresponding to that of the first interleaver 112 of the transmitter 100, interleaves the LDPC codeword bits, output from the parity generator 300 in the same manner as the first interleaver 112, and output the interleaved LDPC codeword bits to the mapper 520.

The mapper 520 modulates an output from the interleaver 510 which is the interleaved LDPC codeword.

Specifically, the mapper 520, which is in a configuration corresponding to that of the first mapper 113 of the transmitter 100, may map the interleaved LDPC codeword bits output from the interleaver 510 to constellation points in the same manner as the first mapper 113, and output a result of the mapping. For example, when the first mapper 113 performed mapping in an QPSK modulation method, the mapper 520 may modulate the interleaved LDPC codeword bits output from the interleaver 510 in the QPSK modulation method.

Accordingly, the BICM encoder 500 may interleave the LDPC codeword including the LDPC information and the LDPC parity (or the first and second LDPC parities), output from the parity generator 200 and modulate the interleaved LDPC codeword.

Meanwhile, the buffer 1040 stores a signal, which is a superposition coding signal, output from the gain controller 1030.

The signal remover 1050 receives a signal stored at the buffer 1040 and a signal output from the BICM encoder 500, which is a modulated LDPC codeword, removes the signal output from the BICM encoder 500 from the signal provided from the buffer 1040, that is, the superposition coding signal, and output a resultant signal to the base layer gain controller 1060.

The base layer gain controller 1060, which is in a configuration corresponding to that of the base layer gain controller 130 of the transmitter 100, controls a gain of the signal output from the signal remover 1050 and output a resultant signal to the second BICM decoder 400.

The second BICM decoder 400 may process a signal output from the base layer gain controller 1060, which is the superposition coding signal which is gain-controlled at the base-layer gain controller 1060 after removing therefrom the signal (i.e., the modulated LDPC codeword) output from the BICM encoder 500, and generate a second signal. The second signal may be the signal corresponding to the base layer.

To this purpose, the second BICM decoder 400 may include a second demapper 410, a second deinterleaver 420, a second LDPC decoder 430 and a second CRC decoder 450.

The second demapper 410 demodulates a signal output from the base layer gain controller 1060.

Specifically, the second demapper 410 demodulates the signal (i.e., the superposition coding signal which is gain-controlled at the base-layer gain controller 1060 after removing therefrom the signal output from the BICM encoder 500) to generate an LLR value, and output the LLR value to the second deinterleaver 420.

In this example, the second demapper 410 may demodulate the superposition coding signal, which is gain-controlled at the base-layer gain controller 1060 after removing therefrom the signal output from the BICM encoder 500, based on a modulation method applied on a signal corresponding to the base layer. For example, when the signal corresponding to the base layer is modulated at the transmitter 100 with a 64-QAM method, the second demapper 410 may demodulate the signal based on the 64-QAM method.

The LLR value may be expressed as a log value of a ratio of a probability that a bit transmitted from the transmitter 100 is 0 and a probability that the bit is 1. Alternatively, the LLR value may be a representative value which is determined according to a section where a probability that a bit transmitted from the transmitter 100 being 0 or 1 belongs.

The second deinterleaver 420 deinterleaves an output from the second demapper 410.

Specifically, the second deinterleaver 420, which is in a configuration corresponding to that of the second interleaver 122 of the transmitter 100, may reverse the interleaving operation performed at the second interleaver 122 to deinterleave the LLR value and output a result to the second LDPC decoder 430.

The second LDPC decoder 430 LDPC decodes an output from the second deinterleaver 420.

Specifically, the second LDPC decoder 430, which is in a configuration corresponding to that of the LDPC encoder (not illustrated) of the second BICM encoder 120 of the transmitter 100, may recover an LDPC information word and an LDPC parity by performing LDPC decoding on the deinterleaved LLR value.

In this example, the second LDPC decoder 430 may perform the LDPC decoding using various methods. For example, the second LDPC decoder 430 may perform the LDPC decoding through iterative decoding based on sum-product algorithm, and determine bits by a hard decision and recover the LDPC information bits.

Meanwhile, the second LDPC decoder 430 may perform the LDPC decoding based on a parity check matrix used during LDPC encoding at the second encoder 121.

For example, when a parity check matrix of the structure as illustrated in FIG. 5 was used during LDPC encoding, the second LDPC decoder 430 may recover the LDPC information word and the LDPC parity by performing LDPC decoding based on the parity check matrix of the structure as illustrated in FIG. 5. That is, the second LDPC decoder 430 may recover an LDPC information word corresponding to the information word submatrix 11 and an LDPC parity corresponding to the parity submatrix 12 of the dual diagonal matrix structure.

Further, when a parity check matrix of the structure as illustrated in FIG. 6 was used during LDPC encoding, the second LDPC decoder 430 may recover the LDPC information word and the LDPC parity by performing LDPC decoding based on the parity check matrix of the structure as illustrated in FIG. 6. That is, the second LDPC decoder 430 may recover an LDPC information word corresponding to the information word submatrix (i.e., the first and second information word submatrices A and C), a first LDPC parity corresponding to the first parity submatrix B of the dual diagonal matrix structure, and a second LDPC parity corresponding to the second parity submatrix D of the unit matrix structure.

Meanwhile, information on the parity check matrix used during LDPC encoding may be previously stored at the receiver 1000 or provided from the transmitter 100.

The second LDPC decoder 430 outputs the LDPC information word recovered by the LDPC decoding to the second CRC decoder 450.

The second CRC decoder 450 CRC decodes an output, i.e., the LDPC information word, from the second LDPC decoder 430 and generates a second signal. The second CRC decoder 450 is in a configuration corresponding to that of a CRC encoder (not illustrated) of the second BICM encoder 120 of the transmitter 100.

Specifically, since the LDPC information word output from the second LDPC decoder 430 includes a CRC information word and a CRC parity, the second CRC decoder 450 may CRC decode the CRC information word and the CRC parity output from the second LDPC decoder 430.

The CRC information word refers to constituent bits of a stream, i.e., those bits that are intended to be transmitted by the transmitter 100, and these may construct a signal corresponding to the base layer. For example, the second CRC decoder 450 may output the constituent bits of the stream B of FIG. 1.

Figure 31:
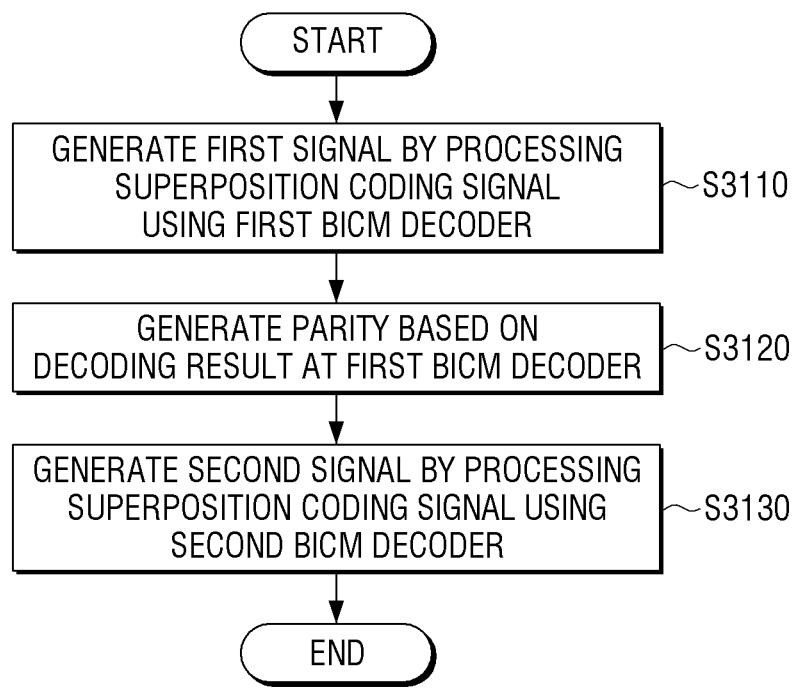
FIG. 31 is a flowchart provided to explain a signal processing method according to an exemplary embodiment.

FIG. 31 is a flowchart provided to explain a signal processing method in reference to FIGS. 1, 5-8B, 30A and 30B according to an exemplary embodiment.

First, at S3110, a superposition coding signal is processed at the first BICM decoder 200, and a first signal is generated.

At S3120, a parity is then generated, based on a result of decoding at the first BICM decoder.

At S3130, a signal, which is generated by removing a signal, corresponding to the first signal, output from the BICM decoder and the parity from the superposition coding signal, is processed at the second BICM decoder 400, and a second signal is generated.

In this example, the operation at S3110 involves demodulation of the superposition coding signal by using the first demapper 210, deinterleaving of an output from the first demapper 210 by using the first deinterleaver 220, LDPC decoding of an output from the first deinterleaver 220 by using the first LDPC decoder 230, and BCH decoding of an output from the first LDPC decoder 230 by using the first BCH decoder 240.

Specifically, the operation of the LDPC decoding may involve recovering an LDPC parity corresponding to a parity submatrix of a dual diagonal matrix structure forming a parity check matrix used in LDPC encoding at the transmitter 100.

In the above example, the operation at S3120 may involve, when an error is present in at least one of an LDPC information word and an LDPC parity recovered by the LDPC decoding, determining whether the error is present in an LDPC information word recovered by the LDPC decoding, based on a result of the BCH decoding.

Further, when the error is not present in the LDPC information word recovered by the LDPC decoding, an LDPC parity corresponding to the LDPC information word recovered by the LDPC decoding may be generated based on IPPC expressions.

Further, when the error is present in the LDPC information word recovered by the LDPC decoding, the operation at S3120 may determine a location of an error-generated bit in the LDPC information word recovered by the LDPC decoding based on the result of the BCH decoding, correct the error by flipping an IPPC expression value corresponding to the error-generated bit, and may generate an LDPC parity corresponding to the error-corrected LDPC information word based on the flipped IPPC expression value.

Meanwhile, the decoding operation may recover a first LDPC parity corresponding to the first parity submatrix B having a dual diagonal matrix structure, and a second LDPC parity corresponding to the second parity submatrix D having a unit matrix structure.

In this example, when an error is not present in the LDPC information word and the first LDPC parity recovered by the LDPC decoding, the operation at S3120 may generate a second LDPC parity corresponding to the LDPC information word and the first LDPC parity recovered by the LDPC decoding, based on IPPC expressions.

Further, when the error is present in at least one of the LDPC information word and the first LDPC parity recovered by the LDPC decoding, the operation at 3120 may determine whether the error is present in the LDPC information word recovered by the LDPC decoding, based on the result of the BCH decoding.

When the error is present in the LDPC information word recovered by the LDPC decoding, the operation at 3120 may determine a location of an error-generated bit in the LDPC information word recovered by the LDPC decoding based on the result of the BCH decoding, correct the error by flipping a resultant value of a first IPPC expression corresponding to the error-generated bit, and generate a first LDPC parity corresponding to the error-corrected LDPC information word based on the flipped first IPPC expression value.

The operation at 3120 may compare the first LDPC parity generated based on the flipped first IPPC expression value with the first LDPC parity recovered by the LDPC decoding, and determine a location of an error-generated bit in the first LDPC parity recovered by the LDPC decoding, may correct the error by flipping a second IPPC expression value corresponding to the error-generated bit, and may generate a second LDPC parity corresponding to the error-corrected LDPC information word and first LDPC parity, based on the flipped second IPPC expressions value.

Meanwhile, the operation at S3120 may generate an LDPC parity for the LDPC information word output from the first BICM decoder 200, and the signal processing method according to an exemplary embodiment may interleave the LDPC codeword including the LDPC information word and the LDPC parity using the BICM encoder 500, and modulate the interleaved LDPC codeword.

In the above example, the operation at S3130 may include, demodulating a signal which is the superposition coding signal from which a signal output from the BICM encoder 500 is removed, by using the second demapper 410, deinterleaving an output from the second demapper 410, by using the second deinterleaver 420, LDPC decoding an output from the second deinterleaver 420 by using the second LDPC decoder 430, and generating a second signal by BCH decoding an output from the second LDPC decoder, by using the second BCH decoder 440.

Alternatively, the operation at S3110 may include demodulating the superposition coding signal at the first demapper 210, deinterleaving an output from the first demapper 210 at the first deinterleaver 220, LDPC decoding an output from the first deinterleaver 220 at the first LDPC decoder 230, and generating the first signal by CRC decoding an output from the first LDPC decoder at the first CRC decoder 240.

In this example, the LDPC decoding operation may recover an LDPC parity corresponding to a parity submatrix having a dual diagonal matrix structure forming a parity check matrix used in LDPC encoding at the transmitter 100.

Further, when an error is present in at least one of an LDPC information word and an LDPC parity recovered by the LDPC decoding, but not present in an LDPC information word based on a result of the CRC decoding, the operation of generating the parity may generate an LDPC parity for the LDPC information word based on IPPC expressions.

Meanwhile, the operation of the LDPC decoding may include recovering a first LDPC parity corresponding to the first parity submatrix B having a dual diagonal matrix structure, and a second LDPC parity corresponding to the second parity submatrix D having a unit matrix structure.

In this example, when an error is present in at least one of the LDPC information word and the first LDPC parity recovered by the LDPC decoding, but not present in the LDPC information word based on a result of the CRC decoding, the operation of generating the parity may include generating an LDPC parity for the LDPC information word based on IPPC expressions.

Meanwhile, the operation at S3120 of generating the parity may include generating an LDPC parity for the LDPC information word output from the first BICM decoder 200. Further, this signal processing method according to an exemplary embodiment may include interleaving an LDPC codeword including the LDPC information word and the LDPC parity, and modulating the interleaved LDPC codeword at the BICM encoder 500.

In this example, the operation at S3130 may include demodulating, at the second demapper 410, a signal which is the superposition coding signal from which a signal output from the BICM encoder 500 is removed, deinterleaving an output from the second demapper at the second deinterleaver 420, LDPC decoding an output from the second deinterleaver at the second LDPC decoder 430, and generating the second signal by CRC decoding an output from the second LDPC decoder 430 at the CRC decoder 450.

The operations or steps of each of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

At least one of the components, elements, modules or units represented by a block as illustrated in FIGS. 1, 7, 8A, 8B, 30A and 30B may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed or implemented by one or more microprocessors or other control apparatuses. Also, at least one of these components, elements or units may further include a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

The foregoing exemplary embodiments and advantages are merely exemplary and are not to be construed as limiting the inventive concept. The present teaching can be readily applied to other types of apparatuses. For example, even though the foregoing exemplary embodiments are described as being applied to a particular decoder such as a BICM decoder which includes an LDPC decoder, a BCH decoder and a CRC decoder, the inventive concept may also be applied to different types of decoder as long as those decoders perform functions similar to the BICM decoder described above. Also, the inventive concept may also apply to generating a lower layer signal different from the base layer signal described above based on a result of decoding an upper layer signal. Also, the description of the exemplary embodiments of the present inventive concept is intended to be illustrative, and not to limit the scope of the claims.

What is claimed is:

1. A receiver comprising at least one processor configured to control or execute:
    a first bit interleaved coded modulation (BICM) decoder configured to decode a first input signal which is generated at transmitter by superimposing an upper layer signal of an upper layer and a lower layer signal of a lower layer to generate a first output signal corresponding to the upper layer;
    a parity generator configured to generate one or more parity bits based on a result of the decoding of the first input signal; and
    a second BICM decoder configured to decode a second input signal which is generated based on the first input signal and the one or more parity bits to generate a second output signal corresponding to the lower layer,
    wherein the first BICM decoder comprises a low density parity check (LDPC) decoder configured to decode the first input signal to generate information bits based on a LDPC code, and
    wherein, if an error is not in the information bits, the one or more parity bits are generated based on values of information part parity check (IPPC) expressions which are obtained based on a parity check matrix of the LDPC code and if the error is in the information bits, the one or more parity bits are generated based on values obtained by flipping values of one or more IPPC expressions related to the error among the IPPC expressions.

2. The receiver of claim 1,
    wherein the (LDPC) decoder is configured to decode the first input signal to generate the information bits and parity bits; and
    wherein the first BICM decoder further comprises:
    a base, chaudhri, hocquenghem (BCH) decoder configured to decode the information bits to generate the first output signal,
    wherein the parity generator is configured to generate the one or more parity bits based on a result of at least one of the LDPC decoding and the BCH decoding.

3. The receiver of claim 1, wherein the one or more parity bits correspond to a parity submatrix of structure with a dual diagonal matrix which is a part of the parity check matrix used for encoding to generate the first input signal at the transmitter.

4. The receiver of claim 2,
    wherein the parity generator is configured to determine whether the error is in at least one of the information bits and the parity bits, and
    wherein, in response to determining that the error is in at least one of the information bits and the parity bits the parity generator is configured to determine whether the error is in the information bits, based on a result of the BCH decoding.

5. The receiver of claim 1, wherein the LDPC decoder is configured to decode the first input signal to generate the information bits, first parity bits corresponding to a first parity submatrix of structure with a dual diagonal matrix, and second parity bits corresponding to a second parity submatrix of structure with an identify matrix; and
    a bose, chaudhri, hocquenghem (BCH) decoder configured to decode the information bits based on a BCH code to generate the first output signal,
    wherein the first and second parity submatrices are respectively parts of first and second parity check matrices forming the parity check matrix used for encoding to generate the first input signal at the transmitter.

6. The receiver of claim 5, wherein the parity generator is configured to determine whether an error is in at least one of the information bits and the first parity bits, and
    wherein in response to determining that the error is not in at least one of the information bits and the first parity bits, the parity generator is configured to generate second parity corresponding to the information bits and the first parity bits, based on information part parity check (IPPC) expressions which is a part of a parity check equation related to the second parity check matrix.

7. The receiver of claim 6, wherein, in response to determining that the error is not in at least one of the information bits and the first parity bits, the parity generator is further configured to generate a-new first LDPC parity bits corresponding to the information bits, based on IPPC expressions which are a part of a parity check equation related to the first parity check matrix.

8. The receiver of claim 6, wherein, in response to determining that the error is in at least one of the information bits and the first parity bits recovered, the parity generator is configured to determine whether the error is in the information bits, based on a result of the BCH decoding.

9. The receiver of claim 8, wherein, in response to determining that the error is in the information bits, the parity generator is configured to determine a location of a bit in which the error occurs among the information bits based on the result of the BCH decoding, correct the error by flipping a value of a first information part parity check (IPPC) expression corresponding to the bit in which the error occurs, and generate new first parity corresponding to the error-corrected information bits based on the flipped first IPPC expression value, and
    wherein the first IPPC expression is a part of a parity check equation related to the first parity check matrix.

10. The receiver of claim 9, wherein the parity generator is configured to compare the new first parity bits with the first parity bits, determine whether an error is in the first parity bits as a result of the comparison, determine a location of a bit in which the error occurs among the first parity bits, correct the error by flipping a value of a second IPPC expression corresponding to the bit in which the error occurs in the first parity bits, and generate new second parity bits corresponding to the error-corrected information bits and first parity bits, based on the flipped second IPPC expression value.

11. The receiver of claim 1, further comprising a BICM encoder configured to encode the information bits and the one or more parity bits, to generate a signal to be used for generating the second input signal.

12. The receiver of claim 11, further comprising a signal remover configured to remove the signal generated by the BICM encoder from the first input signal to output the second input signal.

13. The receiver of claim 1,
wherein the LDPC decoder is configured to decode the first input signal to generate the information bits and parity bits; and
wherein the first BICM decoder comprises:
a cyclic redundancy check (CRC) decoder configured to decode the information bits based on CRC code to generate the first output signal,
wherein the parity generator is configured to generate the one or more parity bits based on a result of at least one of the LDPC decoding and the CRC decoding.

14. The receiver of claim 1,
wherein the LDPC decoder is configured to decode the first input signal to generate the information bits and parity bits; and
a cyclic redundancy check (CRC) decoder configured to decode the information bits based on a CRC code to generate the first output signal,
wherein the parity generator is configured to determine whether an error is in at least one of the information bits and the LDPC parity recovered by the LDPC decoding, and
wherein, in response to determining that the error is in at least one of the information bits and the parity bits, based on a result of the CRC decoding, the parity generator is configured to generate the one or more parity bits, based on information part parity check (IPPC) expressions which are a part of a parity check equation related to a parity check matrix used for encoding at the transmitter to generate the first input signal.

15. The receiver of claim 1, wherein the LDPC decoder is configured to decode the first input signal to generate the information bits, first parity bits corresponding to a first parity submatrix of structure with a dual diagonal matrix, and second parity bits corresponding to a second parity submatrix of structure an identity matrixz;and wherein the first BICM decoder comprises:
a cyclic redundancy check (CRC) decoder configured to decode the information bits based on a CRC code to generate the first output signal,
wherein the first and second parity submatrices are respectively parts of first and second parity check matrices forming the parity check matrix used for encoding at the transmitter to generate the first input signal.

16. The receiver of claim 15, wherein the parity generator is configured to determine whether an error is in at least one of the information bits and the first parity bits, and
wherein, in response to determining that the error is in at least one of the information bits and the first parity bits, based on a result of the CRC decoding, the parity generator is configured to generate new first parity bits corresponding to the information bits based on first information part parity check (IPPC) expressions which are a part of a parity check equation related to the first parity check matrix.

17. The receiver of claim 16, wherein, after generating the new first parity bits, the parity generator is configured to generate new second parity bits corresponding to the information bits and the new first parity bits based on second IPPC equations which are a part of the parity check equation related to the second parity check matrix.

18. A method of signal processing performed by a receiver comprising at least one processor, the method comprising:
generating a first output signal corresponding to an upper layer by decoding a first input signal which is generated at transmitter by superimposing an upper layer signal of the upper layer and a lower layer signal of a lower layer;
generating one or more parity bits based on a result of the decoding of the first input signal;
generating a second input signal based on the first output signal and the one or more parity bits; and
decoding the second input signal to generate a second output signal corresponding to the lower layer,
wherein the generating the first output signal comprises decoding the first input signal to generate information bits based on a low density parity check (LDPC) code, and
wherein, if an error is not in the information bits, the one or more parity bits are generated based on values of information part parity check (IPPC) expressions which are obtained based on a parity check matrix of the LDPC code and if the error is in the information bits, the one or more parity bits are generated based on values obtained by flipping values of one or more IPPC expressions related to the error among the IPPC expressions.

* * * * *